US012721038B2

(12) United States Patent
Miyazaki et al.

(10) Patent No.: US 12,721,038 B2
(45) Date of Patent: Aug. 25, 2026

(54) LIGHT EMITTING ELEMENT AND POLYCYCLIC COMPOUND FOR THE SAME

(71) Applicants: Samsung Display Co., Ltd., Yongin-si (KR); KYUSHU UNIVERSITY, NATIONAL UNIVERSITY CORPORATION, Fukuoka (JP)

(72) Inventors: Yuuki Miyazaki, Yokohama (JP); Yuji Suzaki, Yokohama (JP); In Seob Park, Fukuoka (JP); Takuma Yasuda, Fukuoka (JP)

(73) Assignees: Samsung Display Co., Ltd., Yongin-si (KR); Kyushu University, National University Corporation, Fukuoka (JP)

( * ) Notice: Subject to any disclaimer, the term of this patent is extended or adjusted under 35 U.S.C. 154(b) by 1022 days.

(21) Appl. No.: 17/843,548

(22) Filed: Jun. 17, 2022

(65) Prior Publication Data

US 2023/0016620 A1 Jan. 19, 2023

(30) Foreign Application Priority Data

Jun. 21, 2021 (KR) ........................ 10-2021-0080289

(51) Int. Cl.
*H01L 51/54* (2006.01)
*H10K 85/60* (2023.01)
*H10K 50/11* (2023.01)

(52) U.S. Cl.
CPC ....... *H10K 85/6572* (2023.02); *H10K 85/654* (2023.02); *H10K 85/6574* (2023.02); *H10K 85/6576* (2023.02); *H10K 85/658* (2023.02); *H10K 50/11* (2023.02); *H10K 85/657* (2023.02)

(58) Field of Classification Search
None
See application file for complete search history.

(56) References Cited

U.S. PATENT DOCUMENTS

| | | | |
|---|---|---|---|
| 10,374,166 | B2 | 8/2019 | Hatakeyama et al. |
| 11,957,042 | B2 | 4/2024 | Sim et al. |
| 2020/0190115 | A1 | 6/2020 | Hatakeyama et al. |
| 2020/0207787 | A1 | 7/2020 | Hatakeyama et al. |
| 2020/0335705 | A1 | 10/2020 | Song et al. |
| 2021/0053998 | A1 | 2/2021 | Kim et al. |
| 2024/0301279 | A1 | 9/2024 | Shin et al. |

FOREIGN PATENT DOCUMENTS

| | | | | |
|---|---|---|---|---|
| CN | 112645968 | A | 4/2021 | |
| CN | 112645969 | A | 4/2021 | |
| KR | 10-2020-0006965 | A | 1/2020 | |
| KR | 10-2091507 | B1 | 3/2020 | |
| KR | 10-2020-0058988 | A | 5/2020 | |
| KR | 10-2020-0081269 | A | 7/2020 | |
| KR | 10-2021-0019025 | A | 2/2021 | |
| KR | 10-2021-0044175 | | 4/2021 | |
| KR | 10-2021-0062778 | A | 6/2021 | |
| WO | WO 2015/102118 | A1 | 7/2015 | |
| WO | WO-2019240080 | A1 * | 12/2019 | ............ C09K 11/06 |

OTHER PUBLICATIONS

Machine translation of WO 2019240080. (Year: 2019).*

* cited by examiner

*Primary Examiner* — Andrew K Bohaty
(74) *Attorney, Agent, or Firm* — Womble Bond Dickinson (US) LLP

(57) ABSTRACT

A light emitting element includes a first electrode, a second electrode, and at least one functional layer which is disposed between the first electrode and the second electrode and includes a compound represented by Formula 1 below, thereby exhibiting high efficiency characteristics. The compound of Formula 1 may be included in the emission layer of the light emitting element as a dopant.

Formula 1

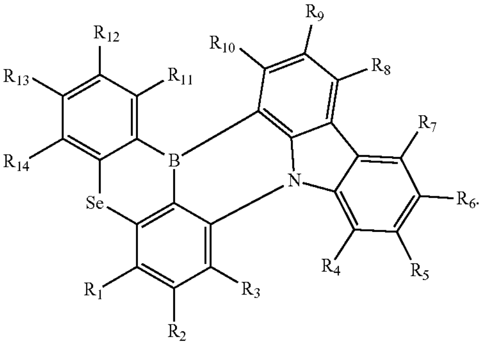

9 Claims, 6 Drawing Sheets

LIGHT EMITTING ELEMENT AND POLYCYCLIC COMPOUND FOR THE SAME

CROSS-REFERENCE TO RELATED APPLICATION

This application claims priority to and the benefit of Korean Patent Application No. 10-2021-0080289, filed on Jun. 21, 2021, the entire content of which is incorporated herein by reference.

BACKGROUND

One or more aspects of embodiments of the present disclosure herein relate to a light emitting element, and more particularly, to a light emitting element including a novel polycyclic compound in an emission layer.

Recently, the development of an organic electroluminescence display device as an image display device is being actively conducted. The organic electroluminescence display device includes a self-luminescent element in which holes and electrons injected from a first electrode and a second electrode recombine in an emission layer, and thus a luminescent material of the emission layer emits light to implement display of images.

In the application of a light emitting element to a display device, there is a demand (or desire) for a light emitting element having low driving voltage, high luminous efficiency, and a long service life, and development of materials for a light emitting element capable of stably (or suitably) attaining such characteristics is being continuously required (or desired).

In recent years, particularly in order to implement a highly efficient light emitting element, technologies pertaining to phosphorescence emission using triplet state energy, or delayed fluorescence using triplet-triplet annihilation (TTA) in which singlet excitons are generated by collision of triplet excitons, are being developed, and thermally activated delayed fluorescence (TADF) materials using delayed fluorescence phenomenon are being developed.

SUMMARY

One or more aspects of embodiments of the present disclosure provide a light emitting element exhibiting an excellent (or improved) luminous efficiency characteristic.

One or more aspects of embodiments of the present disclosure also provide a novel compound for improving efficiency of a light emitting element.

One or more embodiments of the present disclosure provide a polycyclic compound represented by Formula 1 below:

Formula 1

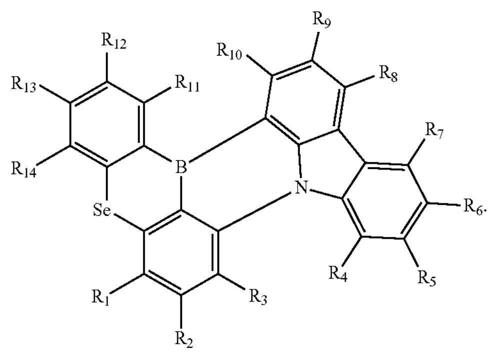

In Formula 1 above, $R_1$ to $R_{14}$ may be each independently a hydrogen atom, a deuterium atom, a halogen atom, a cyano group, a substituted or unsubstituted oxy group, a substituted or unsubstituted thio group, a substituted or unsubstituted amine group, a substituted or unsubstituted silyl group, a substituted or unsubstituted boryl group, a substituted or unsubstituted selenium group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In one or more embodiments, at least one selected from the group consisting of $R_1$ to $R_{14}$ above may be a deuterium atom, or a substituent including a deuterium atom.

In one or more embodiments, Formula 1 above may be represented by Formula 1-1 below: $R_4$ to $R_{12}$ may be the same as defined in Formula 1 above.

Formula 1-1

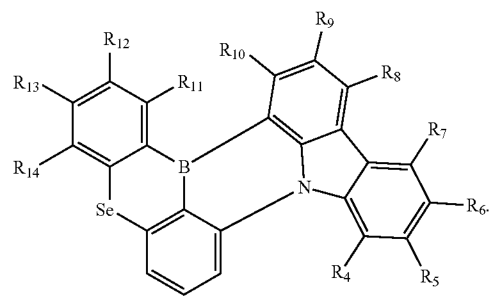

In one or more embodiments, Formula 1 above may be represented by Formula 1-2 or Formula 1-3 below:

Formula 1-2

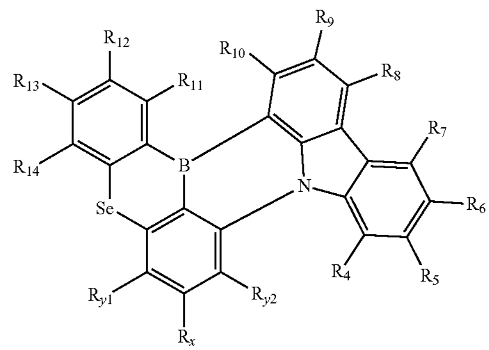

-continued

Formula 1-3

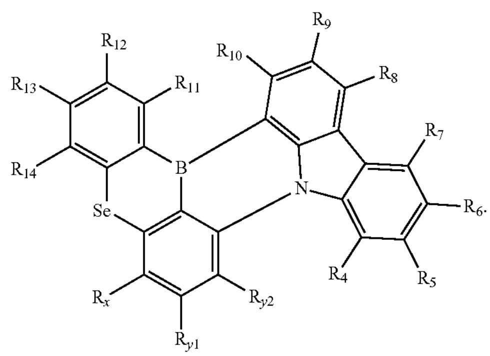

In Formula 1-2 and Formula 1-3 above, $R_x$ may be a deuterium atom, a halogen atom, a cyano group, a substituted or unsubstituted oxy group, a substituted or unsubstituted thio group, a substituted or unsubstituted amine group, a substituted or unsubstituted silyl group, a substituted or unsubstituted boryl group, a substituted or unsubstituted selenium group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. $R_{y1}$ and $R_{y2}$ may be each independently a hydrogen atom, a deuterium atom, a substituted or unsubstituted amine group, a substituted or unsubstituted boryl group, a substituted or unsubstituted selenium group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. $R_4$ to $R_{12}$ may be the same as defined in Formula 1 above.

In one or more embodiments, $R_x$ may be selected from the group consisting of an isopropyl group, a t-butyl group, a cyclopentyl group, a cyano group, a substituted or unsubstituted phenyl group, a substituted or unsubstituted naphthyl group, a substituted or unsubstituted pyrene group, a substituted or unsubstituted triazine group, and RX-1 to RX-10 below:

RX-1

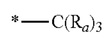

RX-2

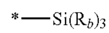

RX-3

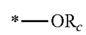

RX-4

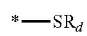

RX-5

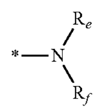

RX-6

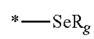

-continued

RX-7

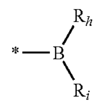

RX-8

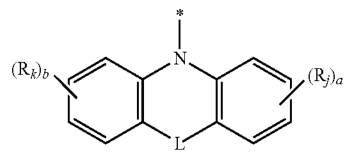

RX-9

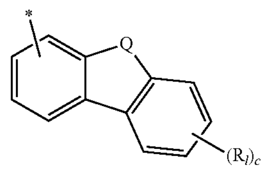

RX-10

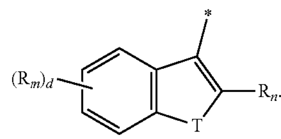

In RX-1 to RX-10 above, $R_a$ to $R_n$ may be each independently a hydrogen atom, a deuterium atom, a halogen atom, a cyano group, a substituted or unsubstituted alkyl group having 1 to 10 carbon atoms, a substituted or unsubstituted alkenyl group having 2 to 10 carbon atoms, a substituted or unsubstituted amine group, or a substituted or unsubstituted aryl group having 6 to 30 carbon atoms, and/or may be bonded to an adjacent group to form a ring. In RX-8 to RX-10 above, a to d may be each independently an integer of 0 to 4, and in RX-8 above, L may be a direct linkage, O, S, $SiR_{a1}R_{a2}$, or $CR_{b1}R_{b2}$. Rat Rae, Rbc, and Rb2 may be each independently a hydrogen atom, a deuterium atom, a substituted or unsubstituted alkyl group having 1 to 10 carbon atoms, or a substituted or unsubstituted aryl group having 6 to 30 carbon atoms, and in RX-9 and RX-10 above, Q and T may be each independently $NR_{c1}$, O, or S, and $R_{c1}$ may be a hydrogen atom, a deuterium atom, a substituted or unsubstituted alkyl group having 1 to 10 carbon atoms, or a substituted or unsubstituted aryl group having 6 to 30 carbon atoms.

In one or more embodiments, $R_4$ to $R_{14}$ may be each independently a hydrogen atom, a deuterium atom, a halogen atom, a cyano group, a triphenylsilyl group, a methyl group, an isopropyl group, a t-butyl group, a diphenyl amine group, a substituted or unsubstituted alkoxy group having 1 to 10 carbon atoms, a substituted or unsubstituted phenyl group, a substituted or unsubstituted naphthyl group, a substituted or unsubstituted carbazole group, a substituted or unsubstituted pyridine group, or a substituted or unsubstituted triazine group.

In one or more embodiments of the present disclosure, a light emitting element includes: a first electrode; a second electrode on the first electrode; and at least one functional layer between the first electrode and the second electrode and including the above-described polycyclic compound of one or more embodiments.

In one or more embodiments, the at least one functional layer may include an emission layer, a hole transport region between the first electrode and the emission layer, and an electron transport region between the emission layer and the second electrode, and the emission layer may include the polycyclic compound of one or more embodiments.

In one or more embodiments, the emission layer may include a host and a dopant, and the dopant may include the polycyclic compound of one or more embodiments.

In one or more embodiments, the host may include a compound represented by Formula E-2a or Formula E-2b below:

Formula E-2a

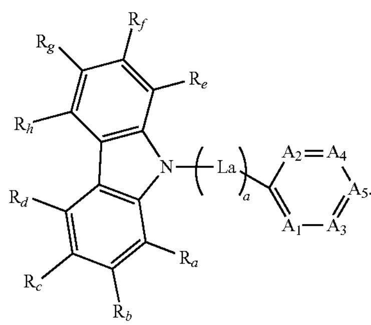

In Formula E-2a, a may be an integer of 0 to 10, and La may be a direct linkage, a substituted or unsubstituted arylene group having 6 to 30 ring-forming carbon atoms, or a substituted or unsubstituted heteroarylene group having 2 to 30 ring-forming carbon atoms. $A_1$ to $A_5$ may be each independently N or $CR_i$, and $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

Formula E-2b

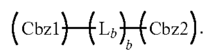

In Formula E-2b above, Cbz1 and Cbz2 may be each independently an unsubstituted carbazole group, or a carbazole group substituted with an aryl group having 6 to 30 ring-forming carbon atoms, b may be an integer of 0 to 10, and Lb may be a direct linkage, a substituted or unsubstituted arylene group having 6 to 30 ring-forming carbon atoms, or a substituted or unsubstituted heteroarylene group having 2 to 30 ring-forming carbon atoms.

In one or more embodiments, the emission layer may emit delayed fluorescence.

In one or more embodiments, the emission layer may emit light having a center wavelength of about 460 nm to about 650 nm.

In one or more embodiments, the first electrode and the second electrode each independently may include at least one selected from the group consisting of Ag, Mg, Cu, Al, Pt, Pd, Au, Ni, Nd, Ir, Cr, Li, Ca, LiF, Mo, Ti, W, In, Sn, Zn, compounds thereof, mixtures thereof, and oxides thereof.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
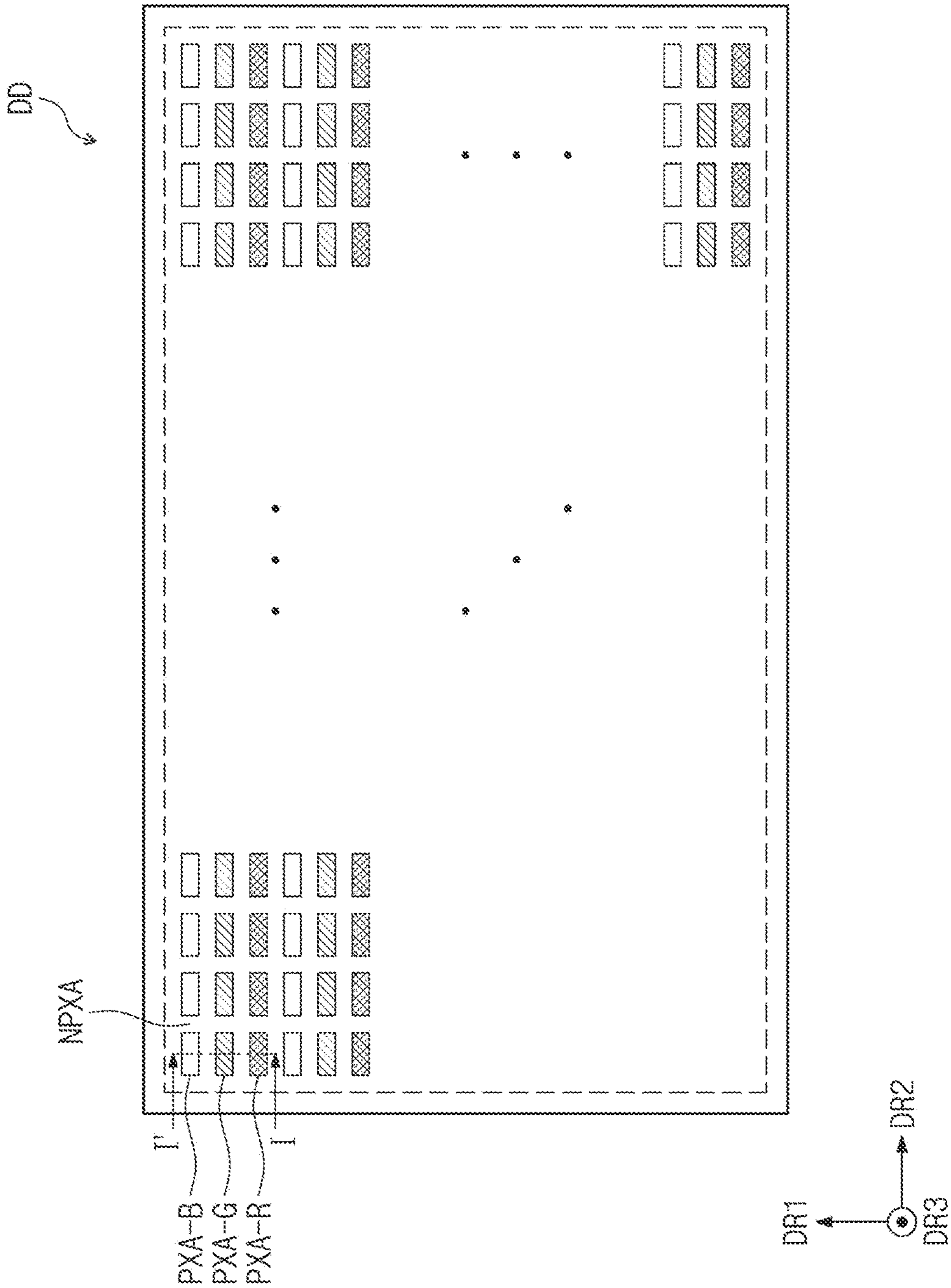
FIG. 1 is a plan view illustrating a display device according to one or more embodiments of the present disclosure.

The present disclosure may be modified in many alternate forms, and thus certain embodiments will be exemplified in the drawings and described in more detail herein. It should be understood, however, that the described embodiments are not intended to limit the present disclosure to the particular forms disclosed, but rather, are intended to cover all modifications, equivalents, and alternatives falling within the spirit and scope of the present disclosure, as defined by the appended claims and their equivalents.

When explaining each of the drawings, like reference numbers are used for referring to like elements. In the accompanying drawings, the dimensions of each structure are exaggeratingly illustrated for clarity of the present disclosure. It will be understood that, although the terms "first," "second," etc. may be used herein to describe various components, these components should not be limited by these terms. These terms are only used to distinguish one component from another. For example, a first component may be referred to as a second component, and, similarly, the second component may be referred to as the first component, without departing from the scope of the present disclosure. As used herein, the singular forms, "a", "an" and "the" are intended to include the plural forms as well, unless the context clearly indicates otherwise.

In the present application, it will be understood that the terms "include," "have" etc., specify the presence of a feature, a fixed number, a step, an operation, an element, a component, or a combination thereof disclosed in the specification, but do not exclude the possibility of presence or addition of one or more other features, fixed numbers, steps, operations, elements, components, or combination thereof.

In the present application, when a part such as a layer, a film, a region, or a plate is referred to as being "on" or "above" another part, it can be directly on the other part (e.g., without any intervening parts therebetween), or an intervening part may also be present. Similarly, when a part such as a layer, a film, a region, or a plate is referred to as being "under" or "below" another part, it can be directly under the other part (e.g., without any intervening parts therebetween), or an intervening part may also be present. In addition, it will be understood that when a part is referred to as being "on" another part, it can be disposed (e.g., positioned) on the other part, or disposed under the other part as well.

As used herein, the term "and/or" includes any and all combinations of one or more of the associated listed items. Throughout the disclosure, expressions such as "at least one of", "one of", and "selected from", when preceding a list of elements, modify the entire list of elements and do not modify the individual elements of the list. For example, "at least one of a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In the specification, the term "substituted or unsubstituted" may mean an unsubstituted group or a group substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boryl group, a phosphine oxide group, a phosphine sulfide group, an alkyl group, an alkenyl group, an alkynyl group, a hydrocarbon ring group, an aryl group, and a heterocyclic group. In addition, each of the substituents exemplified above may be substituted or unsubstituted. For example, a biphenyl group may be interpreted as an aryl group or a phenyl group substituted with a phenyl group.

In the specification, the phrase "bonded to an adjacent group to form a ring" may indicate that one (e.g., a functional group and/or a substituent) is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the rings formed by being bonded to each other may be connected to another ring to form a spiro structure.

In the specification, the term "adjacent group" may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, two methyl groups in 1,2-dimethylbenzene may be interpreted as "adjacent groups" to each other and two ethyl groups in 1,1-diethylcyclopentane may be interpreted as "adjacent groups" to each other. In addition, two methyl groups in 4,5-dimethylphenanthrene may be interpreted as "adjacent groups" to each other.

In the specification, examples of the halogen atom may include a fluorine atom, a chlorine atom, a bromine atom, and an iodine atom.

In the specification, the alkyl group may be a linear, branched or cyclic alkyl group. The number of carbons in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but the embodiment of the present disclosure is not limited thereto.

In the specification, an alkenyl group means a hydrocarbon group including at least one carbon double bond in the middle and/or terminal of an alkyl group having two or more carbon atoms. The alkenyl group may be a linear chain or a branched chain. The carbon number is not specifically limited, but may be 2 to 30, 2 to 20 or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

The hydrocarbon ring group herein means any functional group or substituent derived from an aliphatic hydrocarbon ring. The hydrocarbon ring group may be a saturated hydrocarbon ring group having 5 to 20 ring-forming carbon atoms.

In the specification, an aryl group means any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but the embodiment of the present disclosure is not limited thereto.

In the specification, the fluorenyl group may be substituted, and two substituents may be bonded to each other to form a spiro structure. Examples of compounds including a substituted fluorenyl group are as follows. However, the embodiment of the present disclosure is not limited thereto:

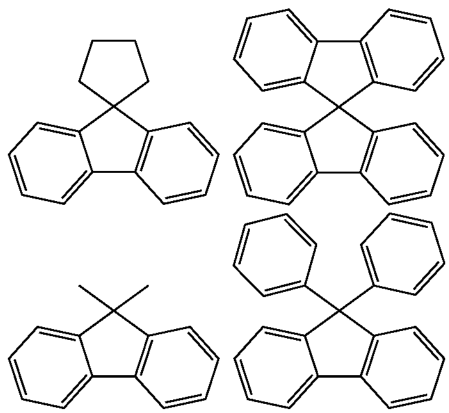

The heterocyclic group herein means any functional group or substituent derived from a ring including at least one of B, O, N, P, Si, or Se as a heteroatom. The heterocyclic group includes an aliphatic heterocyclic group and an aromatic heterocyclic group. The aromatic heterocyclic group may be a heteroaryl group. The aliphatic heterocycle and the aromatic heterocycle may be monocyclic or polycyclic.

In the specification, the heterocyclic group may include at least one of B, O, N, P, Si or S as a heteroatom. If the heterocyclic group includes two or more heteroatoms, the two or more heteroatoms may be the same as or different from each other. The heterocyclic group may be a monocyclic heterocyclic group or a polycyclic heterocyclic group and has the concept including a heteroaryl group. The number of ring-forming carbon atoms in the heterocyclic group may be 2 to 30, 2 to 20, or 2 to 10.

In the specification, the aliphatic heterocyclic group may include one or more selected from among B, O, N, P, Si, and S as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but the embodiment of the present disclosure is not limited thereto.

The heteroaryl group herein may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but the embodiment of the present disclosure is not limited thereto.

In the specification, the above description of the aryl group may be applied to an arylene group except that the arylene group is a divalent group. The above description of the heteroaryl group may be applied to a heteroarylene group except that the heteroarylene group is a divalent group.

In the specification, a silyl group includes an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, one or more embodiments of the present disclosure are not limited thereto.

In the specification, the number of carbon atoms in the amino group is not specifically limited, but may be 1 to 30. The amino group may include an alkyl amino group, an aryl amino group, and/or a heteroaryl amino group. Examples of the amino group may include a methylamino group, a dimethylamino group, a phenylamino group, a diphenylamino group, a naphthylamino group, a 9-methyl-anthracenylamino group, etc., but the embodiment of the present disclosure is not limited thereto.

In the specification, the number of ring-forming carbon atoms in the carbonyl group is not specifically limited, but may be 1 to 40, 1 to 30, or 1 to 20. For example, the carbonyl group may have the following structures, but the embodiment of the present disclosure is not limited thereto:

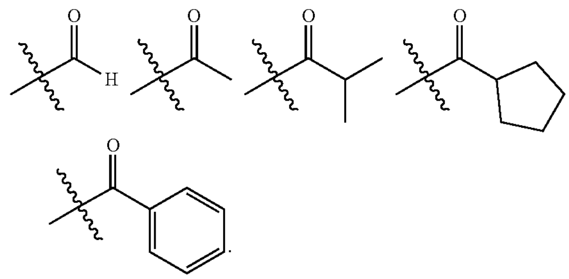

In the specification, the number of carbon atoms in the sulfinyl group and the sulfonyl group is not particularly limited, but may be 1 to 30. The sulfinyl group may include an alkyl sulfinyl group and an aryl sulfinyl group. The sulfonyl group may include an alkyl sulfonyl group and an aryl sulfonyl group.

In the specification, a thio group may include an alkylthio group and an arylthio group. The thio group may mean that a sulfur atom is bonded to the alkyl group or the aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., but the embodiment of the present disclosure is not limited thereto.

In the specification, an oxy group may mean that an oxygen atom is bonded to the alkyl group or the aryl group as defined above. The oxy group may include an alkoxy group and an aryloxy group. The alkoxy group may be a linear chain, a branched chain or a ring chain. The number of carbon atoms in the alkoxy group is not specifically limited, but may be, for example, 1 to 20 or 1 to 10. Examples of the oxy group include methoxy, ethoxy, n-propoxy, isopropoxy, butoxy, pentyloxy, hexyloxy, octyloxy, nonyloxy, decyloxy, benzyloxy, etc., but the embodiment of the present disclosure is not limited thereto.

In the specification, a boryl group may mean that a boron atom is bonded to the alkyl group or the aryl group as defined above. The boryl group includes an alkyl boryl group and an aryl boryl group. Examples of the boryl group may include a dimethylboryl group, a diethylboryl group, a t-butylimethylboryl group, a diphenylboryl group, a phenylboryl group, etc., but the embodiment of the present disclosure is not limited thereto.

In the specification, the number of carbon atoms in an amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, etc., but the embodiment of the present disclosure is not limited thereto.

In the specification, a selenium group may include an alkyl selenium group and an aryl selenium group. The selenium group may mean that a selenium atom is bonded to the alkyl group or the aryl group as defined above.

In the specification, the alkyl group among an alkylthio group, an alkylsulfoxy group, an alkylaryl group, an alkylamino group, an alkyl boryl group, an alkyl silyl group, an alkyl amine group, and an alkyl selenium group is the same as the examples of the alkyl group described above.

In the specification, the aryl group among an aryloxy group, an arylthio group, an arylsulfoxy group, an arylamino group, an aryl boryl group, an aryl silyl group, an aryl amine group and an aryl selenium group is the same as the examples of the aryl group described above.

A direct linkage herein may mean a chemical bond (e.g., a single bond).

As used herein,

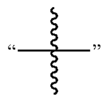

or "——$*$" herein means a position to be connected (e.g., a binding site to a neighboring atom).

As used herein, "disposed" may mean positioned and/or provided.

Hereinafter, embodiments of the present disclosure will be described with reference to the accompanying drawings.

Figure 2:
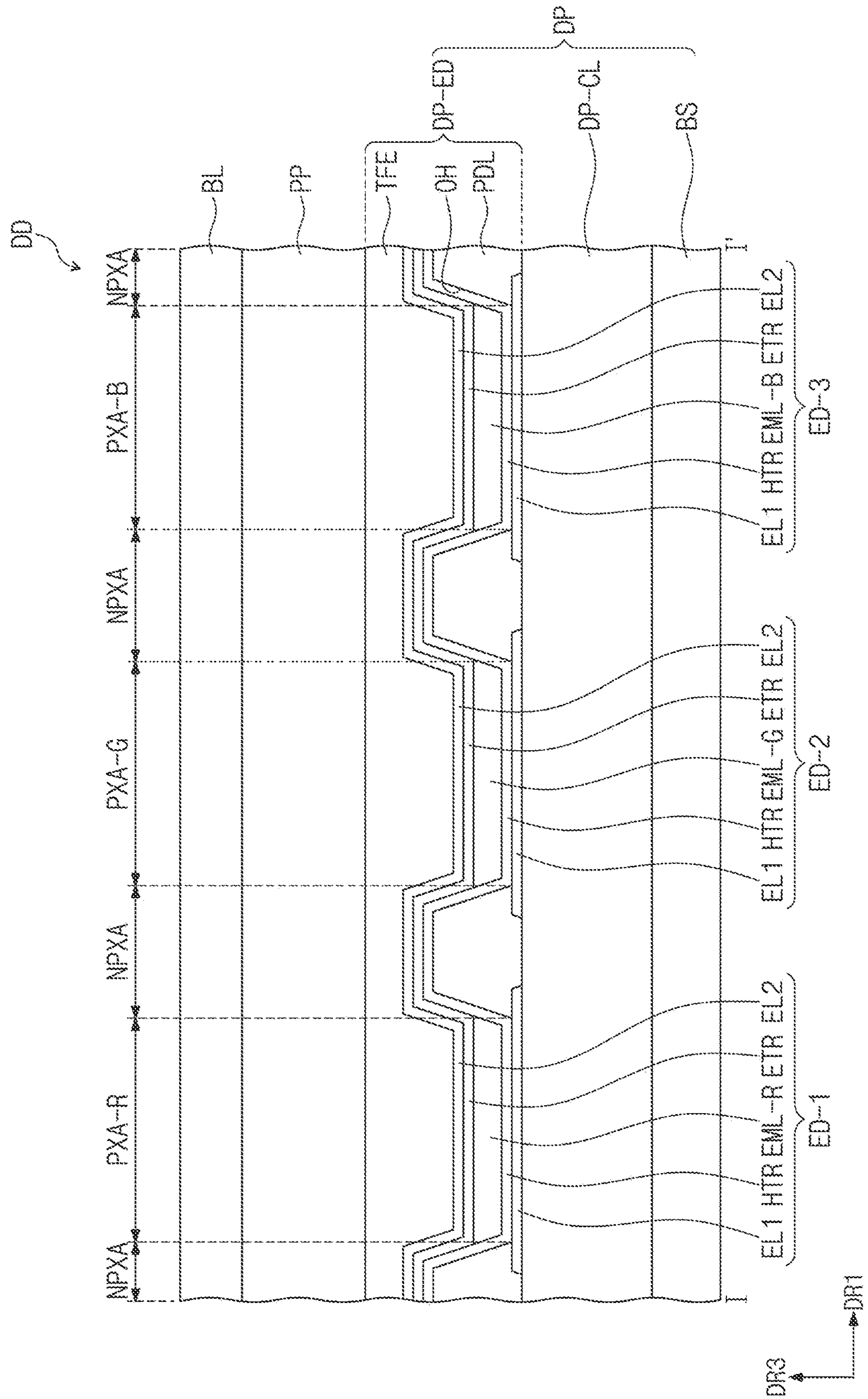
FIG. 2 is a cross-sectional view of a display device according to one or more embodiments of the present disclosure.

FIG. 1 is a plan view illustrating one or more embodiments of a display device DD. FIG. 2 is a cross-sectional view of the display device DD of the embodiment. FIG. 2 is a cross-sectional view illustrating a part taken along line I-I' of FIG. 1.

The display device DD may include a display panel DP and an optical layer PP disposed on the display panel DP. The display panel DP includes light emitting elements ED-1, ED-2, and ED-3. The display device DD may include a plurality of light emitting elements ED-1, ED-2, and ED-3. The optical layer PP may be disposed on the display panel DP and control reflected light in the display panel DP due to external light. The optical layer PP may include, for example, a polarization layer and/or a color filter layer. In one or more embodiments, the optical layer PP may be omitted from the display device DD of one or more embodiments.

A base substrate BL may be disposed on the optical layer PP. The base substrate BL may be a member which provides a base surface on which the optical layer PP is disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer (e.g., including an organic material and an inorganic material). In one or more embodiments, the base substrate BL may be omitted.

The display device DD according to one or more embodiments may further include a filling layer. The filling layer may be disposed between a display element layer DP-ED and the base substrate BL. The filling layer may be an organic material layer. The filling layer may include at least one of an acrylic-based resin, a silicone-based resin, and/or an epoxy-based resin.

The display panel DP may include a base layer BS, a circuit layer DP-CL provided on the base layer BS, and a display element layer DP-ED. The display element layer DP-ED may include a pixel defining film PDL, the light emitting elements ED-1, ED-2, and ED-3 disposed between portions of the pixel defining film PDL, and an encapsulation layer TFE disposed on the light emitting elements ED-1, ED-2, and ED-3.

The base layer BS may be a member which provides a base surface on which the display element layer DP-ED is disposed. The base layer BS may be a glass substrate, a metal substrate, a plastic substrate, etc. However, the embodiment of the present disclosure is not limited thereto, and the base layer BS may be an inorganic layer, an organic layer, or a composite material layer (e.g., including an organic material and an inorganic material).

In one or more embodiments, the circuit layer DP-CL is disposed on the base layer BS, and the circuit layer DP-CL may include a plurality of transistors. Each of the transistors may include a control electrode, an input electrode, and an output electrode. For example, the circuit layer DP-CL may include a switching transistor and a driving transistor in order to drive the light emitting elements ED-1, ED-2, and ED-3 of the display element layer DP-ED.

Each of the light emitting elements ED-1, ED-2, and ED-3 may have a structure of a light emitting element ED of one or more embodiments according to FIGS. 3 to 6, which will be described in more detail herein below. Each of the light emitting elements ED-1, ED-2 and ED-3 may include a first electrode EIJI, a hole transport region HTR, emission layers EML-R, EML-G and EML-B, respectively, an electron transport region ETR, and a second electrode EL2.

FIG. 2 illustrates one or more embodiments in which the emission layers EML-R, EML-G, and EML-B of the light emitting elements ED-1, ED-2, and ED-3 are disposed in the openings OH defined in the pixel defining film PDL, and the hole transport region HTR, the electron transport region ETR, and the second electrode EL2 are provided as a common layer in (e.g., across) the entire light emitting elements ED-1, ED-2, and ED-3. However, the embodiment of the present disclosure is not limited thereto, and unlike the feature illustrated in FIG. 2, the hole transport region HTR and the electron transport region ETR in one or more embodiments may be provided by being patterned inside the opening OH defined in the pixel defining film PDL. For example, the hole transport region HTR, the emission layers EML-R, EML-G, and EML-B, and the electron transport region ETR of the light emitting elements ED-1, ED-2, and ED-3 in one or more embodiments may be provided by being patterned in an inkjet printing method.

The encapsulation layer TFE may cover the light emitting elements ED-1, ED-2 and ED-3. The encapsulation layer TFE may seal the display element layer DP-ED. The encapsulation layer TFE may be a thin film encapsulation layer. The encapsulation layer TFE may be formed by laminating one layer or a plurality of layers. The encapsulation layer TFE includes at least one insulation layer. The encapsulation layer TFE according to one or more embodiments may include at least one inorganic film (hereinafter, an encapsulation-inorganic film). In one or more embodiments, the encapsulation layer TFE according to one or more embodiments may include at least one organic film (hereinafter, an encapsulation-organic film) and at least one encapsulation-inorganic film.

The encapsulation-inorganic film protects the display element layer DP-ED from moisture/oxygen, and the encapsulation-organic film protects the display element layer DP-ED from foreign substances such as dust particles. The encapsulation-inorganic film may include silicon nitride, silicon oxynitride, silicon oxide, titanium oxide, aluminum oxide, and/or the like, but the embodiment of the present disclosure is not particularly limited thereto. The encapsulation-organic film may include an acrylic-based compound, an epoxy-based compound, and/or the like. The encapsulation-organic film may include a photopolymerizable organic material, but the embodiment of the present disclosure is not particularly limited thereto.

The encapsulation layer TFE may be disposed on the second electrode EL2 and may be disposed filling (e.g., to fill) the opening OH.

Referring to FIGS. 1 and 2, the display device DD may include a non-light emitting region NPXA and light emitting regions PXA-R, PXA-G and PXA-B. The light emitting regions PXA-R, PXA-G and PXA-B each may be a region which emits (or is configured to emit) light generated from the light emitting elements ED-1, ED-2 and ED-3, respectively. The light emitting regions PXA-R, PXA-G, and PXA-B may be spaced apart from each other in a plane (e.g., in a plan view).

Each of the light emitting regions PXA-R, PXA-G, and PXA-B may be a region divided by the pixel defining film PDL. The non-light emitting regions NPXA may be regions between the adjacent light emitting regions PXA-R, PXA-G, and PXA-B, which correspond to portions of the pixel defining film PDL. In one or more embodiments, each of the light emitting regions PXA-R, PXA-G, and PXA-B may correspond to a pixel. The pixel defining film PDL may separate the light emitting elements ED-1, ED-2, and ED-3. The emission layers EML-R, EML-G and EML-B of the light emitting elements ED-1, ED-2 and ED-3 may be disposed in openings OH defined by the pixel defining film PDL and separated from each other.

The light emitting regions PXA-R, PXA-G and PXA-B may be divided into a plurality of groups according to the color of light generated from the light emitting elements ED-1, ED-2 and ED-3. In the display device DD of one or more embodiments shown in FIGS. 1 and 2, three light emitting regions PXA-R, PXA-G, and PXA-B, which emit (or are configured to emit) red light, green light, and blue light, respectively are exemplarily illustrated. For example, the display device DD of one or more embodiments may include the red light emitting region PXA-R, the green light emitting region PXA-G, and the blue light emitting region PXA-B which are separated from one another.

In the display device DD according to one or more embodiments, the plurality of light emitting elements ED-1, ED-2 and ED-3 may emit light beams having wavelengths different from one another. For example, in one or more embodiments, the display device DD may include a first light emitting element ED-1 that emits (or is configured to emit) red light, a second light emitting element ED-2 that emits (or is configured to emit) green light, and a third light emitting element ED-3 that emits (or is configured to emit) blue light. For example, the red light emitting region PXA-R, the green light emitting region PXA-G, and the blue light emitting region PXA-B of the display device DD may correspond to the first light emitting element ED-1, the second light emitting element ED-2, and the third light emitting element ED-3, respectively.

However, the embodiment of the present disclosure is not limited thereto, and the first to third light emitting elements ED-1, ED-2, and ED-3 may emit light beams in the same wavelength range or at least one light emitting element may emit a light beam in a wavelength range different from the others. For example, the first to third light emitting elements ED-1, ED-2, and ED-3 may all emit blue light.

The light emitting regions PXA-R, PXA-G, and PXA-B in the display device DD according to one or more embodiments may be arranged in a stripe form (e.g., a stripe pattern). Referring to FIG. 1, the plurality of red light emitting regions PXA-R may be arranged with each other along a second directional axis DR2, the plurality of green light emitting regions PXA-G may be arranged with each other along the second directional axis DR2, and the plurality of blue light emitting regions PXA-B may be arranged with each other along the second directional axis DR2. In addition, the red light emitting region PXA-R, the green light emitting region PXA-G, and the blue light emitting region PXA-B may be alternately arranged with each other and in this order along a first directional axis DR1 (crossing the second directional axis DR1).

FIGS. 1 and 2 illustrate that all the light emitting regions PXA-R, PXA-G, and PXA-B have similar area, but the embodiment of the present disclosure is not limited thereto, and the light emitting regions PXA-R, PXA-G, and PXA-B may have different areas from each other according to a wavelength range of the emitted light (or of the light to be emitted). In this case, the areas of the light emitting regions PXA-R, PXA-G, and PXA-B may mean areas when viewed in a plane defined by the first directional axis DR1 and the second directional axis DR2 (e.g., in a plan view).

The arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously suitably combined (e.g., modified) and provided according to characteristics of a display quality required (or desired) in the display device DD. For example, the arrangement form of the light emitting regions PXA-R, PXA-G, and PXA-B may be a PenTile®/PENTILE® arrangement form (PENTILE® is a registered trademark owned by Samsung Display Co., Ltd.) or a diamond arrangement form.

In one or more embodiments, the areas of the light emitting regions PXA-R, PXA-G, and PXA-B may be different from each other. For example, in one or more embodiments, the area of the green light emitting region PXA-G may be smaller than that of the blue light emitting region PXA-B, but the embodiment of the present disclosure is not limited thereto.

Hereinafter, FIGS. 3 to 6 are cross-sectional views schematically illustrating light emitting elements according to embodiments. The light emitting elements ED according to embodiments each may include a first electrode EL1, a second electrode EL2 facing the first electrode EL1, and at least one functional layer disposed between the first electrode EU and the second electrode EL2. The light emitting element ED of one or more embodiments may include a polycyclic compound of one or more embodiments, which will be described in more detail herein below, in at least one functional layer.

Each of the light emitting elements ED may include, as the at least one functional layer, a hole transport region HTR, an emission layer EML, and an electron transport region ETR that are sequentially stacked. For example, each of the light emitting elements ED of embodiments may include the first electrode EL1, the hole transport region HTR, the emission layer EML, the electron transport region ETR, and the second electrode EL2 that are sequentially stacked.

Figure 3:
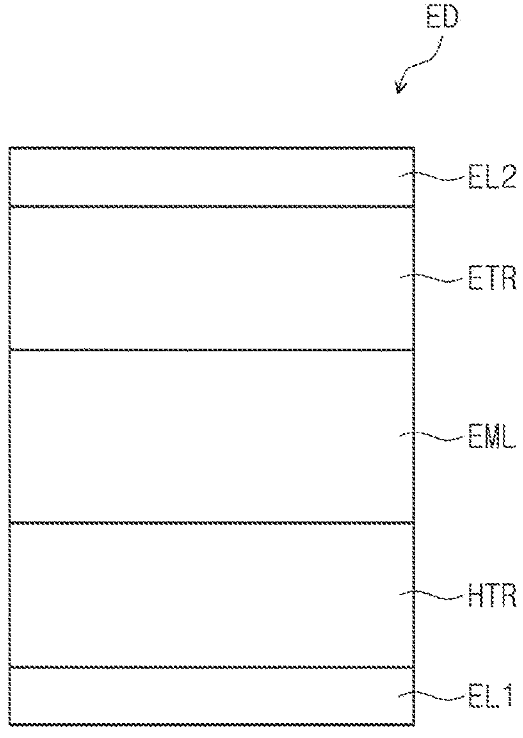
FIG. 3 is a cross-sectional view schematically illustrating a light emitting element according to one or more embodiments of the present disclosure.
Figure 4:
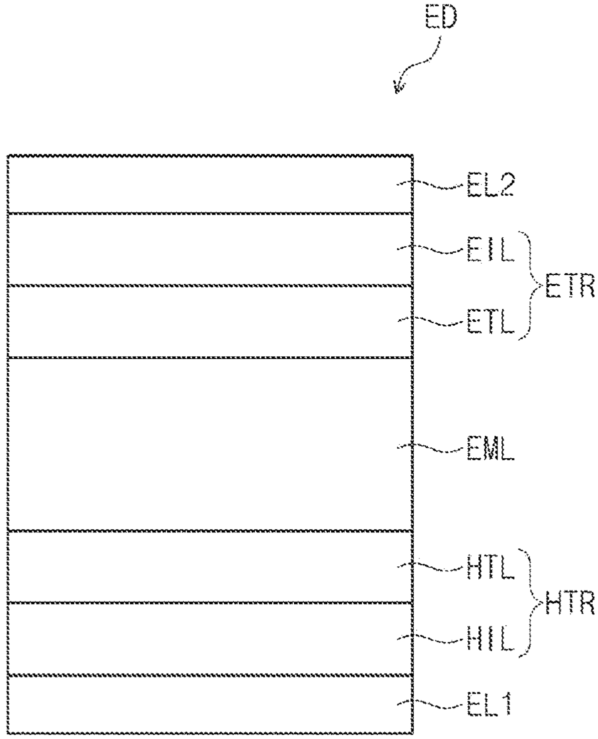
FIG. 4 is a cross-sectional view schematically illustrating a light emitting element according to one or more embodiments of the present disclosure.
Figure 5:
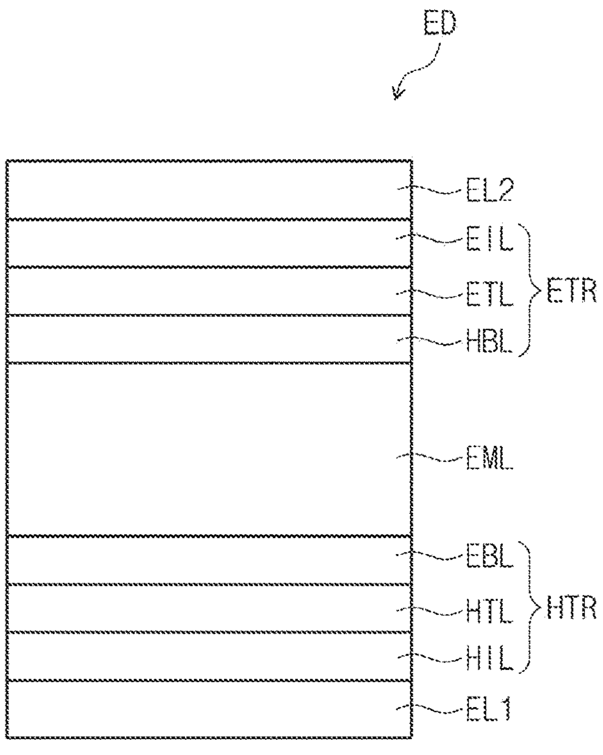
FIG. 5 is a cross-sectional view schematically illustrating a light emitting element according to one or more embodiments of the present disclosure.
Figure 6:
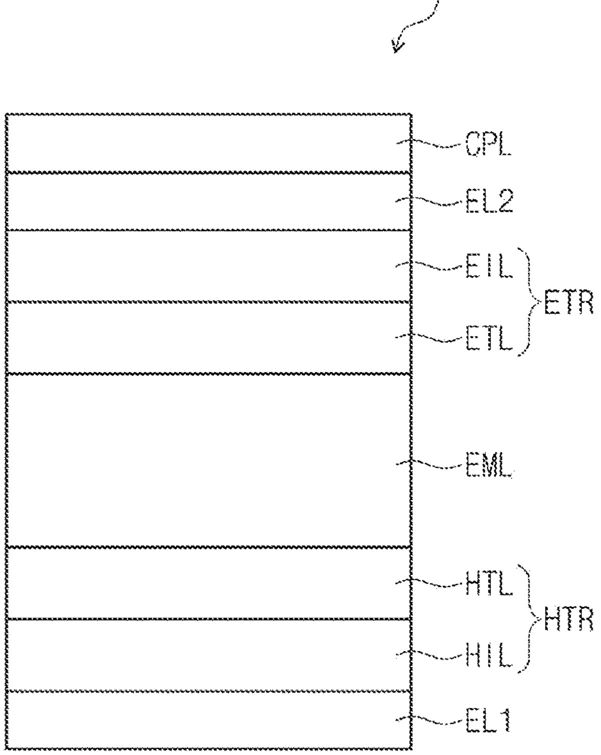
FIG. 6 is a cross-sectional view schematically illustrating a light emitting element according to one or more embodiments of the present disclosure.

Compared to FIG. 3, FIG. 4 illustrates a cross-sectional view of a light emitting element ED of one or more embodiments, in which a hole transport region HTR includes a hole injection layer HIL and a hole transport layer HTL, and an electron transport region ETR includes an electron injection layer EIL and an electron transport layer ETL. In addition, compared to FIG. 3, FIG. 5 illustrates a cross-sectional view of a light emitting element ED of one or more embodiments, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 4, FIG. 6 illustrates a cross-sectional view of a light emitting element ED of one or more embodiments including a capping layer CPL disposed on a second electrode EL2.

The light emitting element ED of one or more embodiments may include the polycyclic compound of one or more embodiments in the emission layer EML. A display device DD (FIG. 2) of one or more embodiments including a plurality of light emitting regions may include the polycyclic compound of one or more embodiments in the emission layer EML constituting at least one emission region.

In the light emitting element ED according to one or more embodiments, the first electrode EL1 has conductivity. The first electrode EL1 may be formed of a metal material, a metal alloy, or a conductive compound. The first electrode EL1 may be an anode or a cathode. However, the embodiment of the present disclosure is not limited thereto. In addition, the first electrode EL1 may be a pixel electrode. The first electrode EU may be a transmissive electrode, a transflective electrode, or a reflective electrode. The first electrode EL1 may include at least one selected from among Ag, Mg, Cu, Al, Pt, Pd, Au, Ni, Nd, Ir, Cr, Li, Ca, LiF, Mo, Ti, W, In, Sn, Zn, a compound of two or more selected from among these (e.g., a compound thereof), a mixture of two or more selected from among these (e.g., a mixture thereof), and/or an oxide thereof.

When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca (a stacked structure of LiF and Ca), LiF/Al (a stacked structure of LiF and Al), Mo, Ti, W, a compound or a mixture thereof (e.g., a mixture of Ag and Mg). In one or more embodiments, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but the embodiment of the present disclosure is not limited thereto. In addition, the embodiments of the present disclosure are not limited thereto, and the first electrode EL1 may include the above-described metal material(s), combination(s) of at least two metal materials of the above-described metal materials, oxide(s) of the above-described metal materials, and/or the like. The thickness of the first electrode EL1 may be from about 700 Å to about 10,000 Å. For example, the thickness of the first electrode EU may be from about 1,000 Å to about 3,000 Å.

The hole transport region HTR is provided on the first electrode EL1. The hole transport region HTR may include at least one of a hole injection layer HIL, a hole transport layer HTL, a buffer layer, an emission-auxiliary layer, and/or an electron blocking layer EBL. The thickness of the hole transport region HTR may be, for example, from about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, or may have a single layer structure formed of a hole injection material and a hole transport material. In one or more embodiments, the hole transport region HTR may have a single layer structure formed of a plurality of different materials, or a structure in which hole injection layer HIL/hole transport layer HTL, hole injection layer HIL/hole transport layer HTL/buffer layer, hole injection layer HIL/buffer layer, hole transport layer HTL/buffer layer, or hole injection layer HIL/hole transport layer HTL/electron blocking layer EBL are stacked in order from the first electrode EU, but the embodiment of the present disclosure is not limited thereto.

The hole transport region HTR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below:

Formula H-1

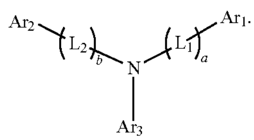

In Formula H-1 above, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. a and b may be each independently an integer of 0 to 10. When a and/or b is an integer of 2 or greater, a plurality of $L_1$'s and/or $L_2$'s may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In one or more embodiments, in Formula H-1, $Ar_3$ may be a substituted or unsubstituted aryl group having 6 to 30 ring-forming carbon atoms.

The compound represented by Formula H-1 above may be a monoamine compound. In one or more embodiments, the compound represented by Formula H-1 above may be a diamine compound in which at least one selected from among $Ar_1$ to $Ar_3$ includes the amine group as a substituent. In some embodiments, the compound represented by Formula H-1 above may be a carbazole-based compound including a substituted or unsubstituted carbazole group in at least one of $Ar_1$ and/or $Ar_2$, or a fluorene-based compound including a substituted or unsubstituted fluorene group in at least one of $Ar_1$ and/or $Ar_2$.

The compound represented by Formula H-1 may be represented by any one selected from among the compounds of Compound Group H below. However, the compounds listed in Compound Group H below are examples, and the compounds represented by Formula H-1 are not limited to those represented by Compound Group H below:

Compound Group H

H-1-1

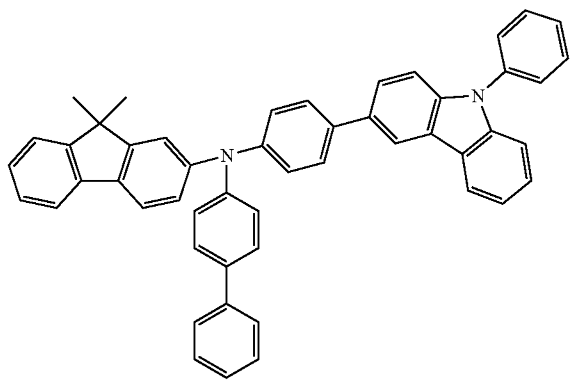

H-1-2

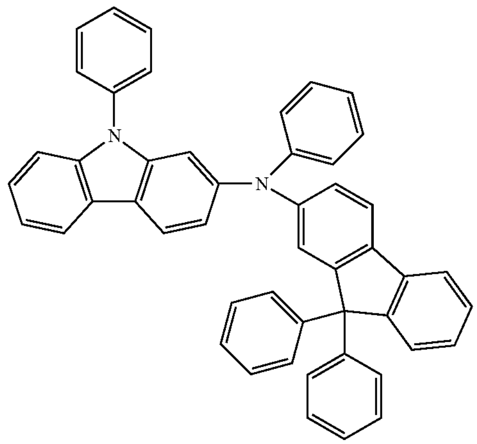

-continued
H-1-3
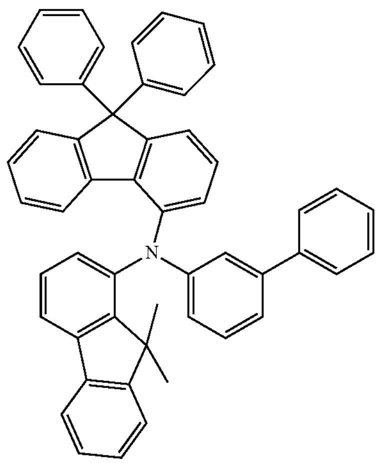
H-1-4
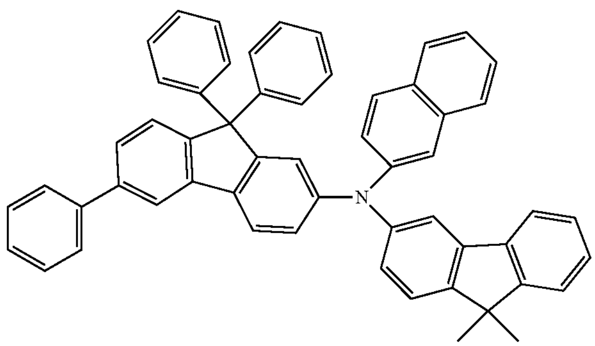
H-1-5
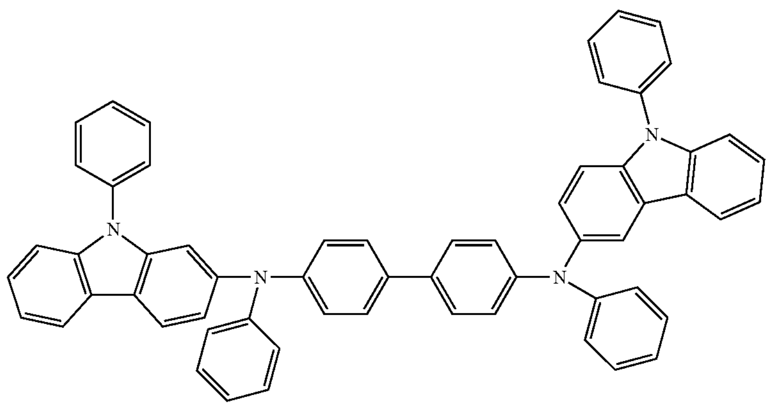

-continued
H-1-6
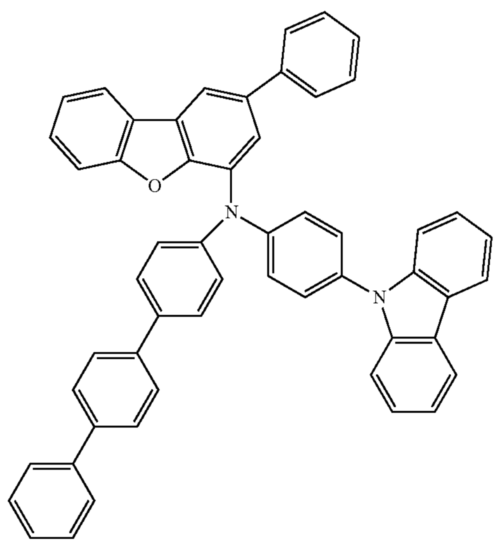
H-1-7
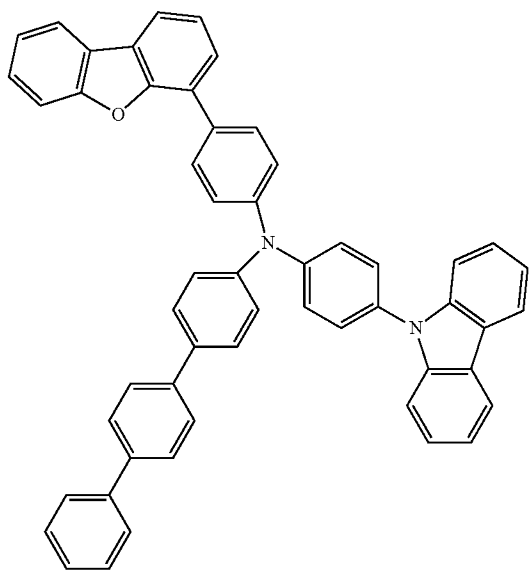

-continued
H-1-7
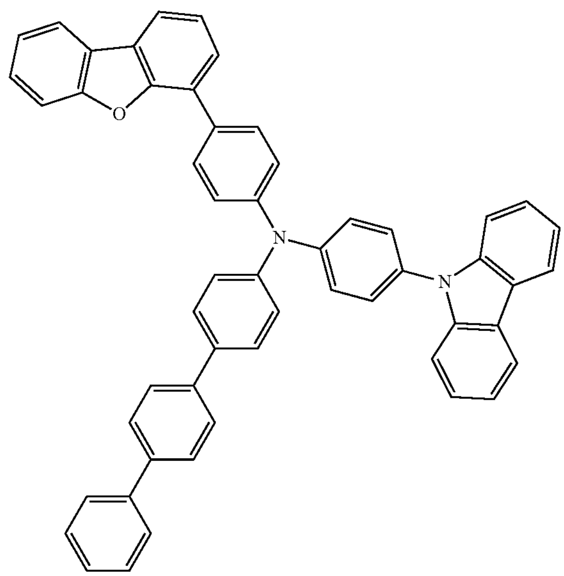
H-1-8
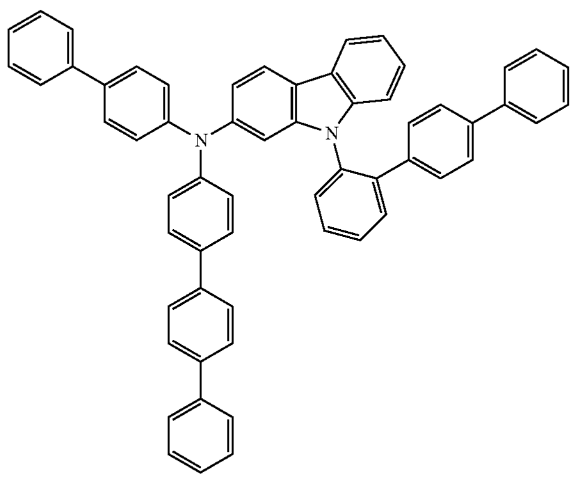
H-1-9
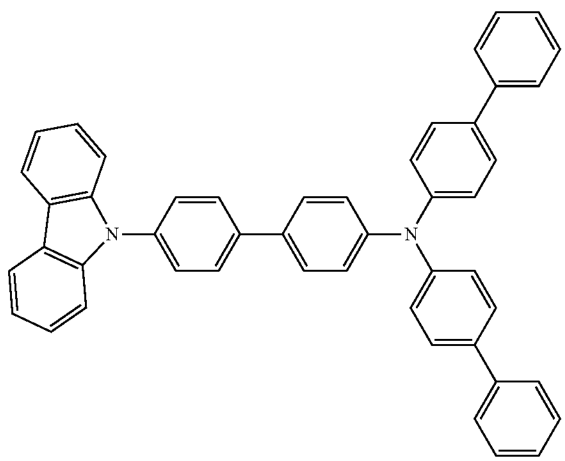

-continued
H-1-10
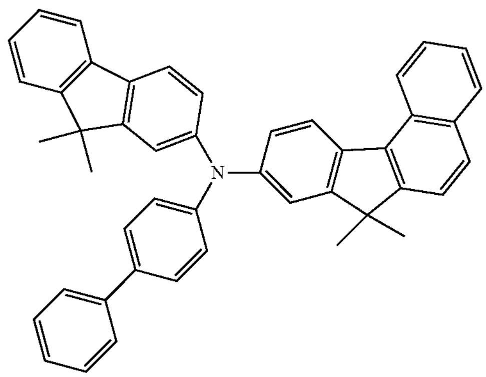
H-1-11
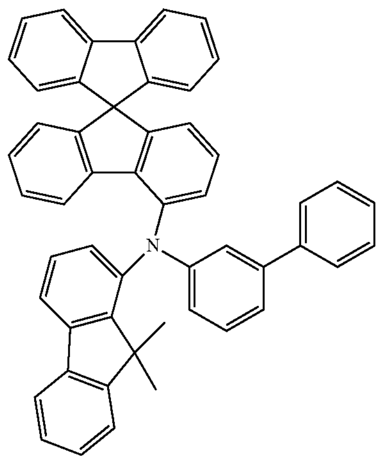
H-1-12
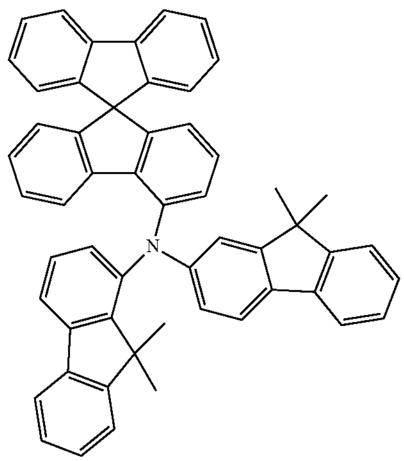

-continued
H-1-13
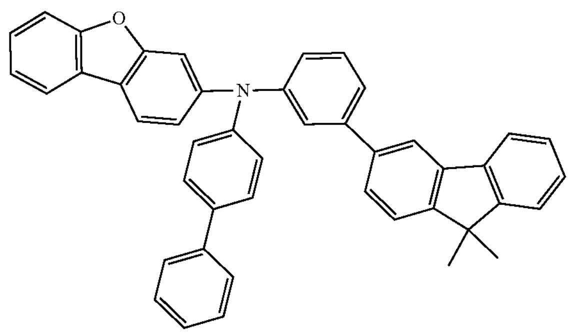
H-1-14
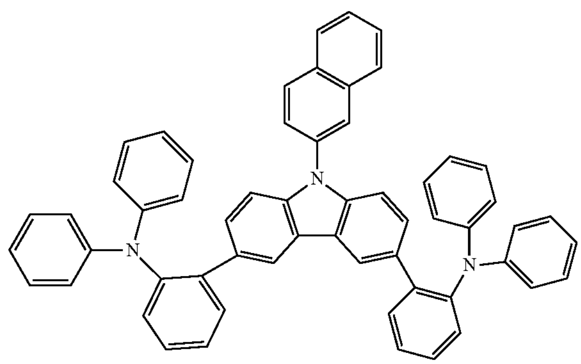
H-1-15
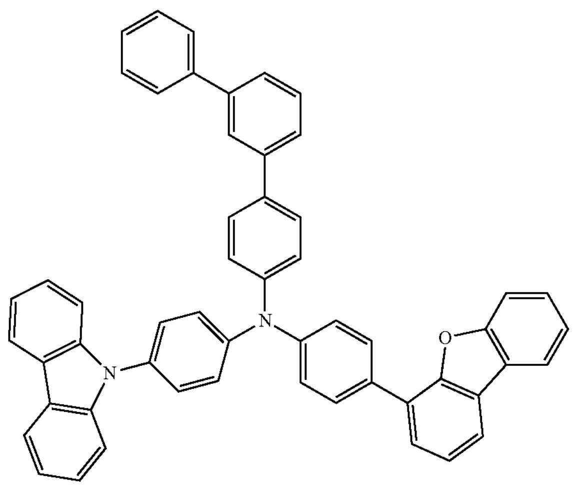

-continued
H-1-16
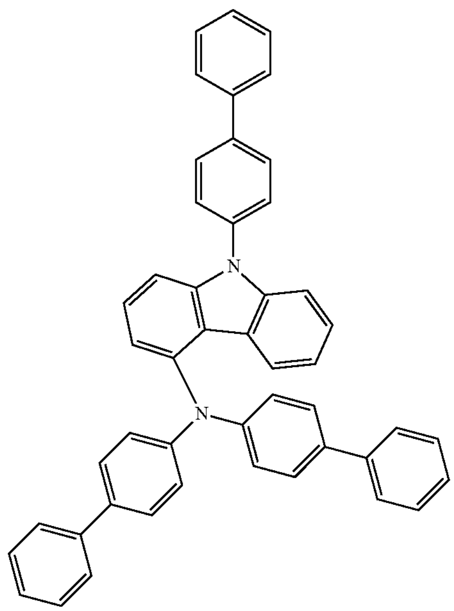
H-1-17
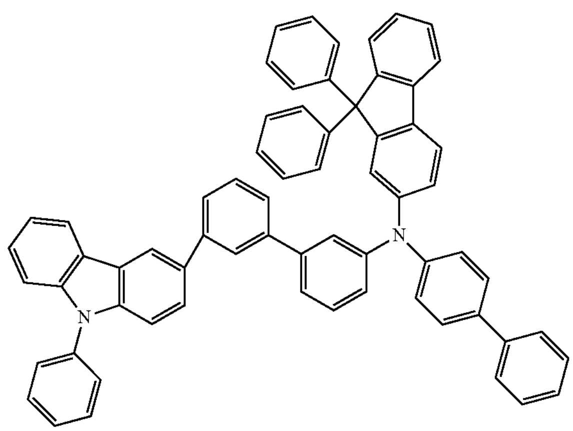
H-1-18
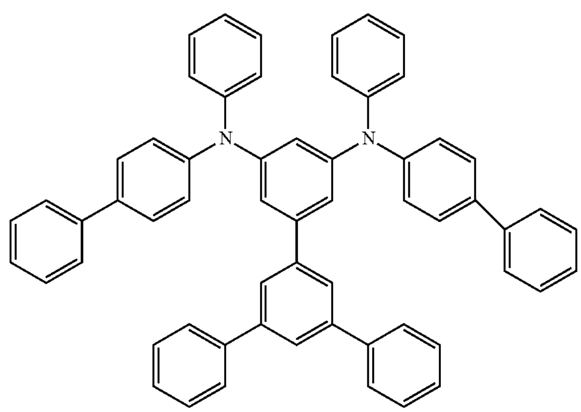

-continued

H-1-19

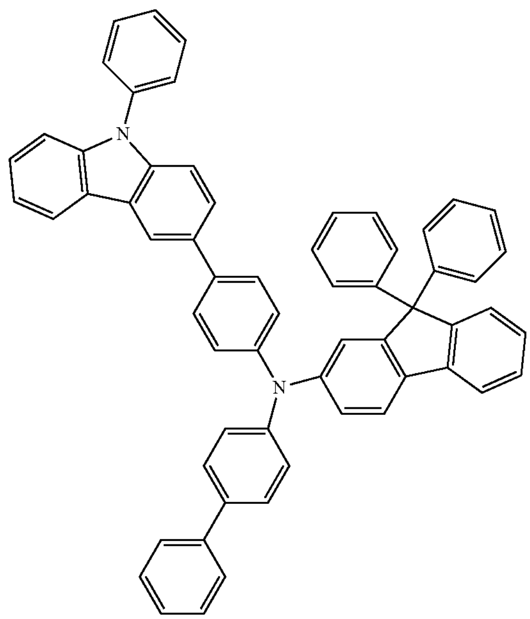

The hole transport region HTR may further include a phthalocyanine compound (such as copper phthalocyanine), $N^1,N^{1'}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB (or NPD)), triphenylamine-containing polyetherketone (TPAPEK), 4-isopropyl-4'-methyldiphenyliodonium [tetrakis(pentafluorophenyl)borate], dipyrazino [2,3-f: 2',3'-h]quinoxaline-2,3,6,7,10,11-hexacarbonitrile (HATCN), etc.

The hole transport region HTR may include a carbazole-based derivative (such as N-phenyl carbazole and/or polyvinyl carbazole), a fluorene-based derivative, N,N'-bis(3-methylphenyl)-N,N'-diphenyl-[1,1-biphenyl]-4,4'-diamine (TPD), a triphenylamine-based derivative (such as 4,4',4"-tris(N-carbazolyl)triphenylamine (TCTA)), N,N'-di(naphthalene-1-yl)-N,N'-diphenyl-benzidine (NPB), 4,4'-cyclohexylidene bis[N,N-bis(4-methylphenyl)benzenamine] (TAPC), 4,4'-bis[N,N-(3-tolyl)amino]-3,3'-dimethylbiphenyl (HMTPD), 1,3-bis(N-carbazolyl)benzene (mCP), etc.

In one or more embodiments, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compound of the hole transport region HTR in at least one of a hole injection layer HIL, a hole transport layer HTL, and/or an electron blocking layer EBL.

The thickness of the hole transport region HTR may be from about 100 Å to about 10,000 Å, for example, from about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 30 Å to about 1,000 Å. For example, when the hole transport region HTR includes the electron blocking layer EBL, the electron blocking layer EBL may have a thickness of about 10 Å to about 1,000 Å. If the thicknesses of the hole transport region HTR, the hole injection layer HIL, the hole transport layer HTL and/or the electron blocking layer EBL satisfy the above-described respective ranges, satisfactory (or suitable) hole transport properties may be achieved without a substantial increase in a driving voltage.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may include at least one of a halogenated metal compound, a quinone derivative, a metal oxide, and/or a cyano group-containing compound, but the embodiment of the present disclosure is not limited thereto. For example, the p-dopant may include a metal halide compound (such as CuI and/or RbI), a quinone derivative (such as tetracyanoquinodimethane (TCNQ) and/or 2,3,5,6-tetrafluoro-7,7, 8,8-tetracyanoquinodimethane (F4-TCNQ)), a metal oxide (such as tungsten oxide and/or molybdenum oxide), and/or a cyano group-containing compound (such as dipyrazino[2,3-f: 2',3'-h] quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc.), but the embodiment of the present disclosure is not limited thereto.

As described above, the hole transport region HTR may further include at least one of the buffer layer and/or the electron blocking layer EBL, in addition to the hole injection layer HIL and the hole transport layer HTL. The buffer layer may compensate for a resonance distance according to the wavelength of light emitted from the emission layer EML and may thus increase light emission efficiency. A material that may be included in the hole transport region HTR may be used as a material to be included in the buffer layer. The electron blocking layer EBL is a layer that serves to prevent or reduce the electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

The light emitting element ED of one or more embodiments may include a polycyclic compound represented by Formula 1 below in at least one functional layer disposed between the first electrode EL1 and the second electrode EL2. In one or more embodiments, the light emitting element ED may include the polycyclic compound represented by Formula 1 below in the emission layer EML:

Formula 1

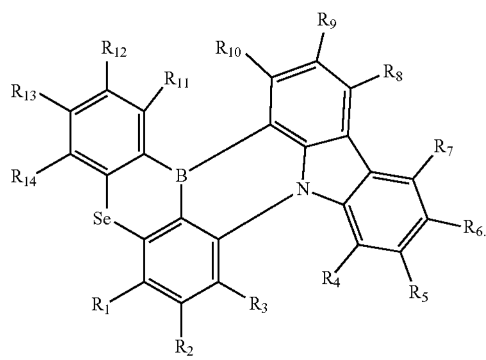

In Formula 1, $R_1$ to $R_{14}$ may be each independently a hydrogen atom, a deuterium atom, a halogen atom, a cyano group, a substituted or unsubstituted oxy group, a substituted or unsubstituted thio group, a substituted or unsubstituted amine group, a substituted or unsubstituted silyl group, a substituted or unsubstituted boryl group, a substituted or unsubstituted selenium group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In one or more embodiments, the polycyclic compound represented by Formula 1 may include B, N, and Se as heteroatoms forming a condensed ring. In one 6-membered ring of the heterocycles formed to include B, N, and Se, the B atom and the N atom may be at the para-position, and in the other 6-membered ring, the B atom and the Se atom may be at the para-position.

In the polycyclic compound represented by Formula 1, a core part, which may comprise the condensed polycyclic moiety except for the $R_1$ to $R_{14}$ substituents, may include B, N, and Se as ring-forming heteroatoms, and may be a condensed ring in which seven rings are condensed. The polycyclic compound of one or more embodiments may include Se as a ring-forming atom, thereby exhibiting characteristics of a highly efficient luminescent material.

The polycyclic compound of one or more embodiments may exhibit a high reverse intersystem crossing (RISC) rate constant by including, as a ring-forming atom, Se with a relatively large atomic weight and having the core part structure of the condensed ring in which seven rings are condensed. The polycyclic compound of one or more embodiments may be used as a delayed fluorescence material by having a short delay time (Tau delay). The light emitting element of one or more embodiments including the polycyclic compound of one or more embodiments having delayed fluorescence characteristics may emit delayed fluorescence and exhibit high luminous efficiency characteristics.

In Formula 1, at least one selected from among $R_1$ to $R_{14}$ may be a deuterium atom, or a substituent containing a deuterium atom. In Formula 1, $R_1$ to $R_{14}$ may all be deuterium atoms, or at least one selected from among $R_1$ to $R_{14}$ may be a substituent containing a deuterium atom, and the rest may all be deuterium atoms. In one or more embodiments, in the polycyclic compound represented by Formula 1, $R_4$ to $R_{14}$ may all be deuterium atoms, and at least one selected from among $R_1$ to $R_3$ may be an alkyl group containing a deuterium atom as a substituent, an amine group containing a deuterium atom as a substituent, an aryl group containing a deuterium atom as a substituent, or a heteroaryl group containing a deuterium atom as a substituent.

In the polycyclic compound represented by Formula 1 of one or more embodiments, $R_1$ to $R_3$ may be each independently a hydrogen atom, a deuterium atom, a halogen atom, a cyano group, a substituted or unsubstituted oxy group, a substituted or unsubstituted thio group, a substituted or unsubstituted amine group, a substituted or unsubstituted silyl group, a substituted or unsubstituted boryl group, a substituted or unsubstituted selenium group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In the polycyclic compound represented by Formula 1 of one or more embodiments, one selected from among $R_1$ to $R_3$ may be each independently a deuterium atom, a halogen atom, a cyano group, a substituted or unsubstituted oxy group, a substituted or unsubstituted thio group, a substituted or unsubstituted amine group, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and the rest may be hydrogen atoms. Further, in the polycyclic compound represented by Formula 1 of one or more embodiments, one selected from among $R_1$ to $R_3$ may be a halogen atom, a cyano group, a substituted or unsubstituted oxy group, a substituted or unsubstituted thio group, a substituted or unsubstituted amine group, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and the rest may be deuterium atoms. However, the embodiment of the present disclosure is not limited thereto.

When $R_1$ to $R_3$ are each independently substituted or unsubstituted aryl groups having 6 to 30 ring-forming carbon atoms or substituted or unsubstituted heteroaryl groups having 2 to 30 ring-forming carbon atoms, substituents substituted on the aryl group or the heteroaryl group may be each independently a substituted or unsubstituted oxy group, a substituted or unsubstituted thio group, a substituted or unsubstituted amine group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms.

In one or more embodiments, when $R_1$ to $R_3$ are each independently substituted or unsubstituted aryl groups having 6 to 30 ring-forming carbon atoms or substituted or unsubstituted heteroaryl groups having 2 to 30 ring-forming carbon atoms, substituents substituted on the aryl group or the heteroaryl group may be bonded to an adjacent substituent on the ring of the aryl group or the heteroaryl group, to which substituents are substituted, to form a ring. The substituents substituted on the aryl group or the heteroaryl group may be bonded to an adjacent group to form a 5-membered or 6-membered hydrocarbon ring, or a 5-membered or 6-membered heterocycle.

In addition, in one or more embodiments, at least one selected from among $R_1$ to $R_3$ may be a substituted or unsubstituted boryl group, a substituted or unsubstituted selenium group, a substituted or unsubstituted aryl group having 6 to 30 ring-forming carbon atoms, or a substituted or unsubstituted heteroaryl group having 2 to 30 ring-forming carbon atoms. When at least one selected from among $R_1$ to $R_3$ is a substituted or unsubstituted boryl group or a substituted or unsubstituted selenium group, at least one selected from among $R_1$ to $R_3$ may be bonded to an adjacent group to form a heterocycle.

In the polycyclic compound represented by Formula 1 of one or more embodiments, $R_4$ to $R_{14}$ may be each independently a hydrogen atom, a deuterium atom, a halogen atom, a cyano group, a triphenylsilyl group, a methyl group, an isopropyl group, a t-butyl group, a diphenyl amine group, a substituted or unsubstituted alkoxy group having 1 to 10 carbon atoms, a substituted or unsubstituted phenyl group, a substituted or unsubstituted naphthyl group, a substituted or unsubstituted carbazole group, a substituted or unsubstituted pyridine group, or a substituted or unsubstituted triazine group. However, the embodiment of the present disclosure is not limited thereto.

Formula 1 may be represented by Formula 1-1 below. Formula 1-1 corresponds to the case where $R_1$ to $R_3$ are all hydrogen atoms in the polycyclic compound represented by Formula 1.

Formula 1-1

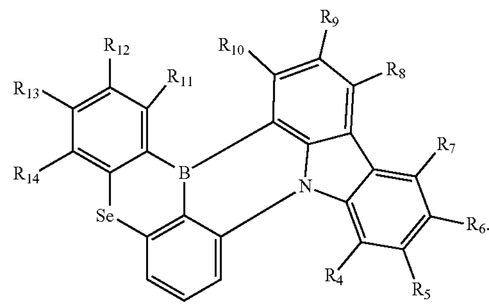

In Formula 1-1, the same descriptions in Formula 1 as provided above may be applied with respect to $R_4$ to $R_{12}$.

In one or more embodiments, Formula 1 may be represented by Formula 1-2 or Formula 1-3 below:

Formula 1-2

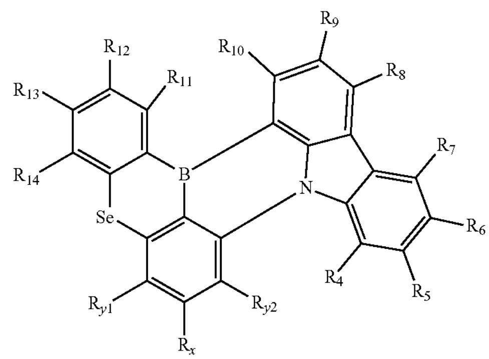

Formula 1-3

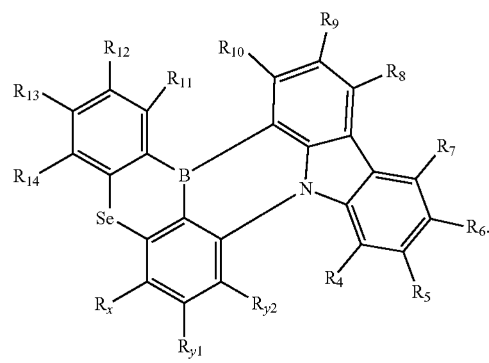

In Formula 1-2 and Formula 1-3, $R_x$ may be a deuterium atom, a halogen atom, a cyano group, a substituted or unsubstituted oxy group, a substituted or unsubstituted thio group, a substituted or unsubstituted amine group, a substituted or unsubstituted silyl group, a substituted or unsubstituted boryl group, a substituted or unsubstituted selenium group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

For example, in Formula 1-2 and Formula 1-3, $R_x$ may be represented by any one selected from among an isopropyl group, a t-butyl group, a cyclopentyl group, a cyano group, a substituted or unsubstituted phenyl group, a substituted or unsubstituted naphthyl group, a substituted or unsubstituted pyrene group, a substituted or unsubstituted triazine group, and RX-1 to RX-10 below:

RX-1

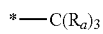

RX-2

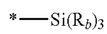

RX-3

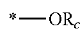

RX-4

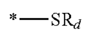

RX-5

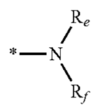

RX-6

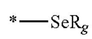

RX-7

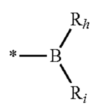

RX-8

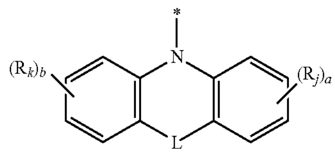

RX-9

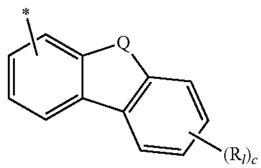

RX-10

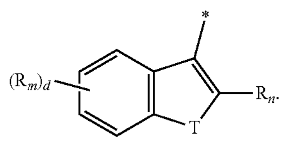

In RX-1 to RX-10, $R_a$ to $R_n$ may be each independently a hydrogen atom, a deuterium atom, a halogen atom, a cyano group, a substituted or unsubstituted alkyl group having 1 to 10 carbon atoms, a substituted or unsubstituted alkenyl group having 2 to 10 carbon atoms, a substituted or unsubstituted amine group, a substituted or unsubstituted aryl group having 6 to 30 carbon atoms, or a substituted or unsubstituted heteroaryl group having 2 to 30 carbon atoms, and/or may be bonded to an adjacent group to form a ring.

For example, $R_j$ to $R_m$, which are substituents substituted in RX-8 to RX-10, may be bonded to an adjacent substituent on the ring of the aryl group substituted with $R_j$ to $R_m$, to form a ring. $R_j$ to $R_m$ may be bonded to an adjacent group to form a 5-membered or 6-membered hydrocarbon ring, or a 5-membered or 6-membered heterocycle.

In RX-8 to RX-10, a to d may be each independently an integer of 0 to 4. If a to d are each independently an integer of 2 or more, a plurality of $R_j$'s to $R_m$'s may all be the same or at least one may be different from the rest.

In RX-1, a plurality of $R_a$'s may all be the same or at least one may be different from the rest. In addition, in RX-2, a plurality Rb's may all be the same or at least one may be different from the rest. In RX-5, $R_e$ and $R_f$ may be the same or different from each other. In RX-7, $R_h$ and $R_i$ may be the same or different from each other.

In RX-8, L may be a direct linkage, 0, S, $SiR_{a1}R_{a2}$, or $CR_{b1}R_{b2}$. $R_{a1}$, $R_{a2}$, $R_{b1}$, and $R_{b2}$ may be each independently a hydrogen atom, a deuterium atom, a substituted or unsubstituted alkyl group having 1 to 10 carbon atoms, or a substituted or unsubstituted aryl group having 6 to 30 carbon atoms.

In RX-9 and RX-10, Q and T may be each independently $NR_{c1}$, O, or S. In $NR_{c1}$, $R_{c1}$ may be a hydrogen atom, a deuterium atom, a substituted or unsubstituted alkyl group having 1 to 10 carbon atoms, or a substituted or unsubstituted aryl group having 6 to 30 carbon atoms.

In Formula 1-2 and Formula 1-3, $R_{y1}$ and $R_{y2}$ may be each independently a hydrogen atom, a deuterium atom, a substituted or unsubstituted amine group, a substituted or unsubstituted boryl group, a substituted or unsubstituted selenium group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. The same descriptions as those provided in Formula 1 as described above may be applied with respect to $R_4$ to $R_{12}$.

The polycyclic compound represented by Formula 1 of one or more embodiments may be represented by any one selected from among the polycyclic compounds of Compound Group 1 below. The light emitting element ED of one or more embodiments may include at least one selected from among the polycyclic compounds of Compound Group 1 below in a functional layer. For example, the light emitting element ED of one or more embodiments may include at least one selected from among the polycyclic compounds of Compound Group 1 below in the emission layer EML.

Compound Group 1

1

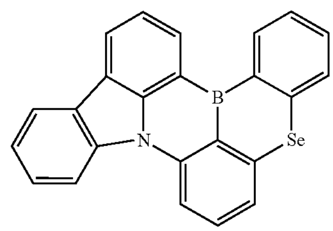

2

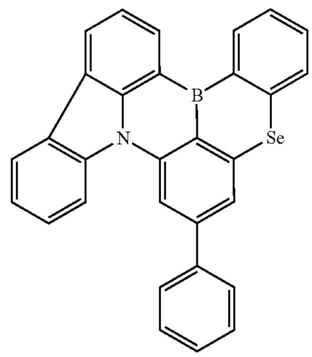

-continued
3
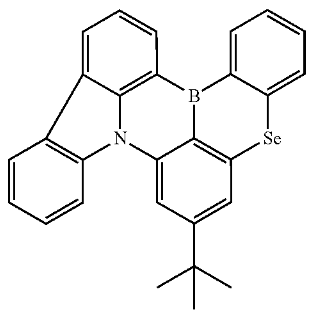
4
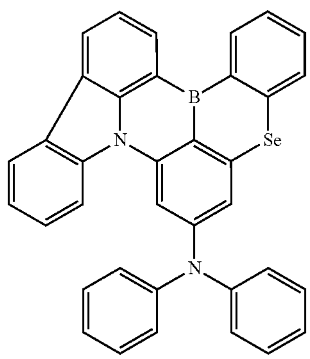
1-D
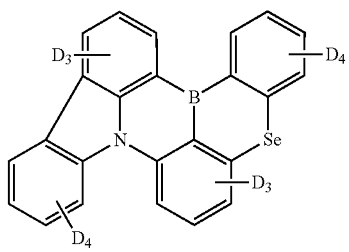
2-D
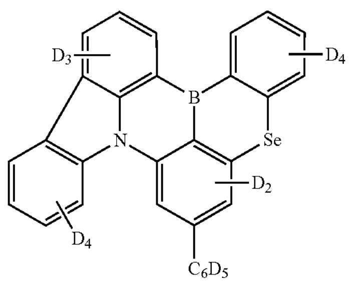
3-D
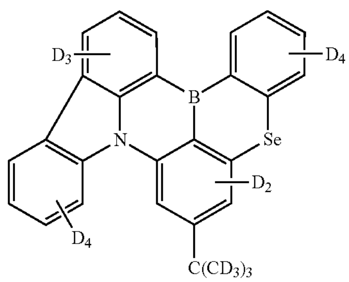
-continued
4-D
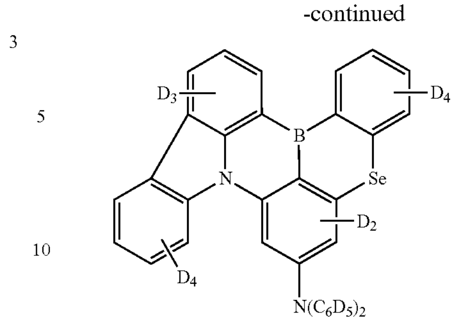
5
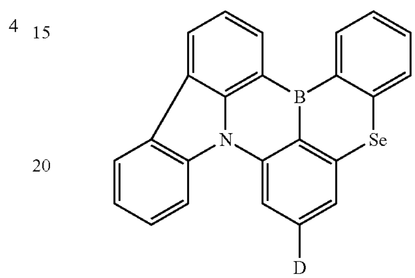
6
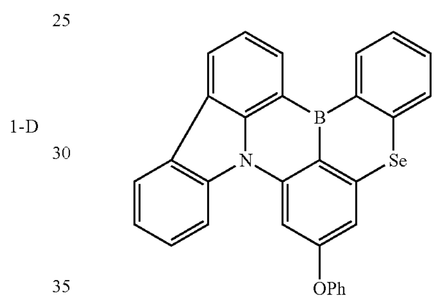
7
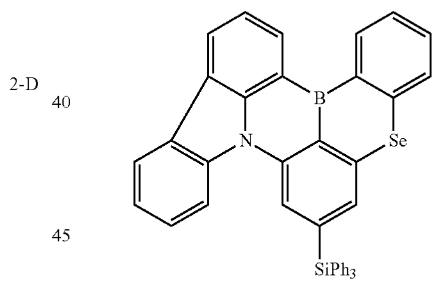
8
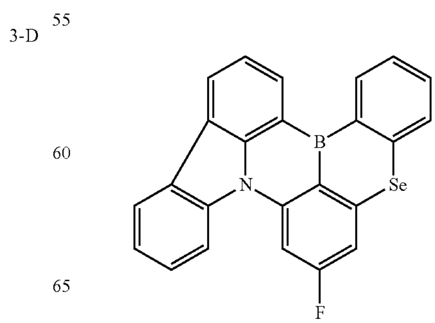

-continued
9
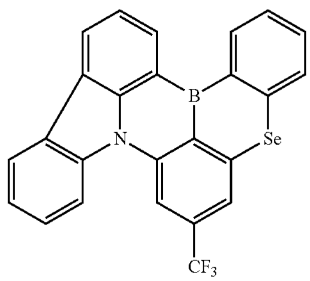
10
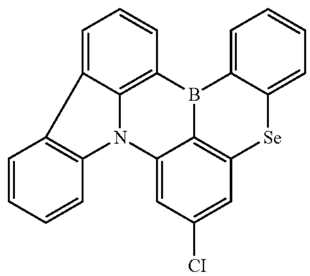
11
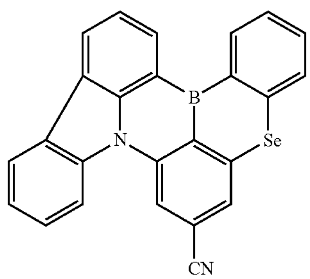
12
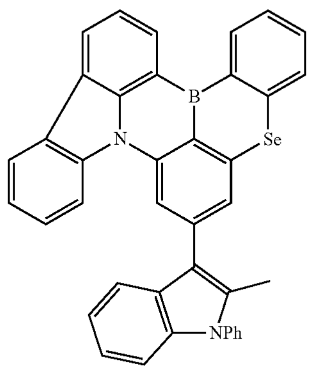
13
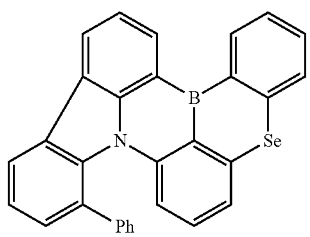
-continued
14
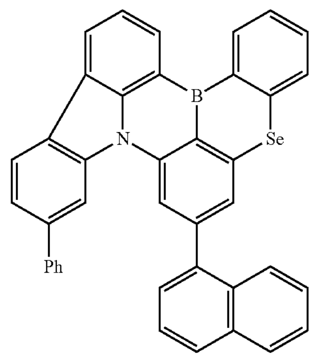
15
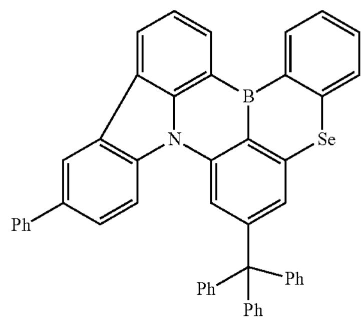
16
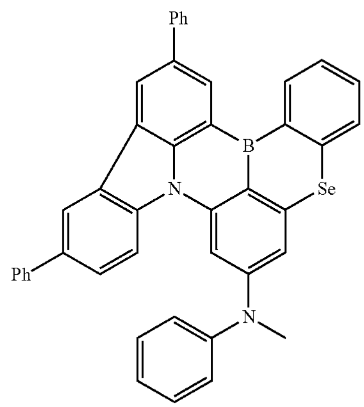
17
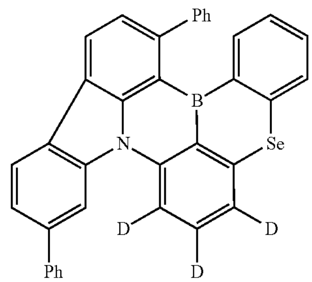
18
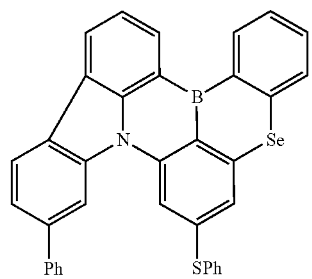

-continued
19
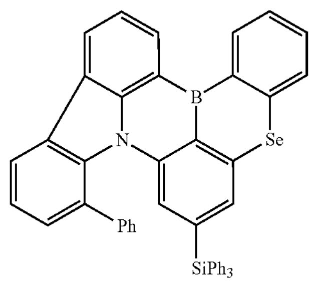
20
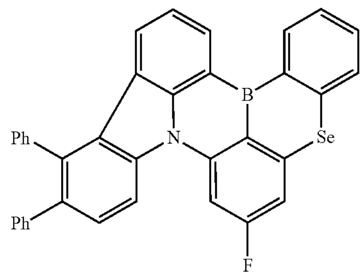
21
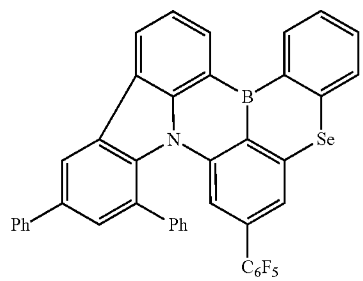
22
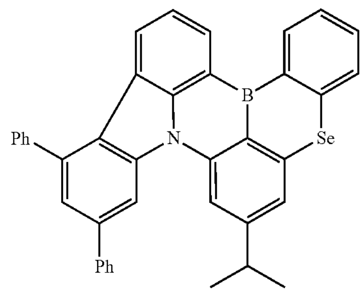
23
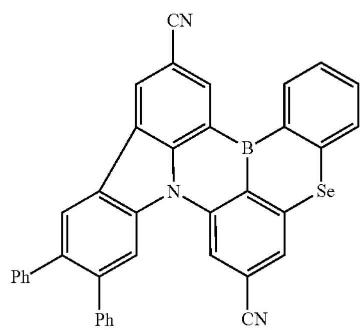
-continued
24
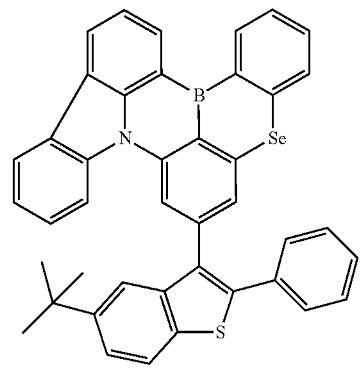
25
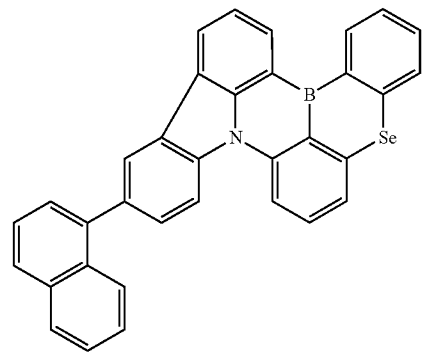
26
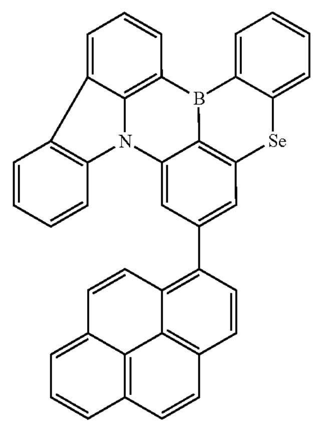
27
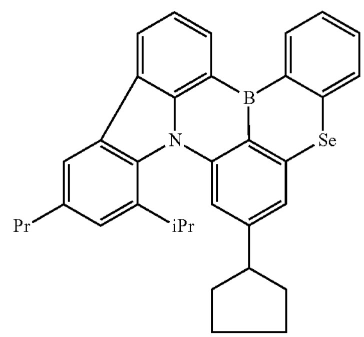

-continued
28
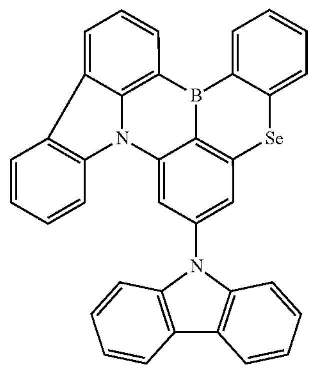
29
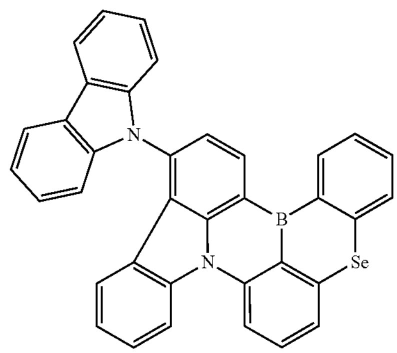
30
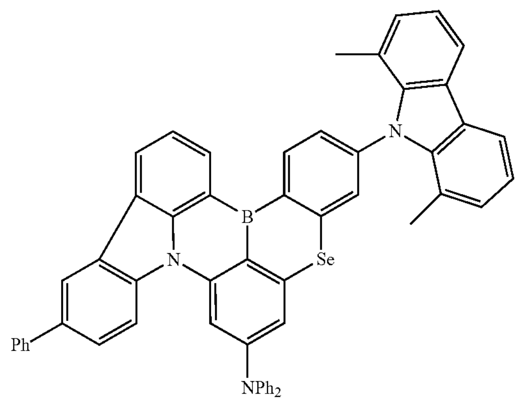
31
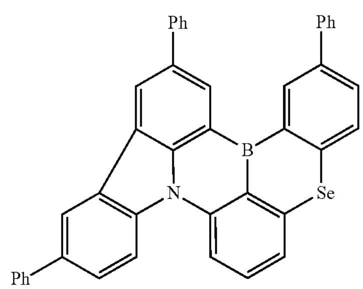
-continued
32
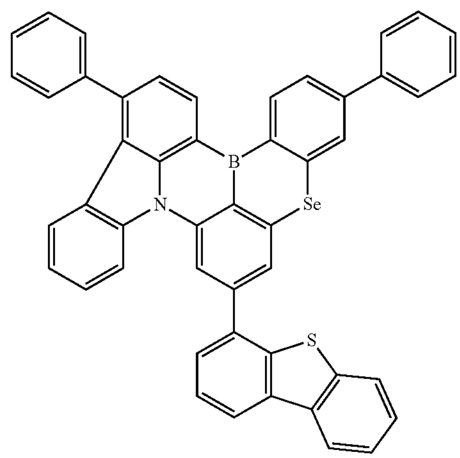
33
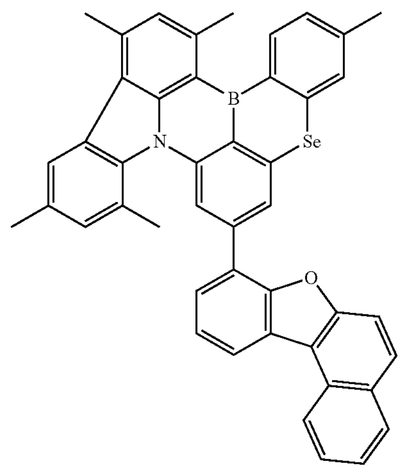
34
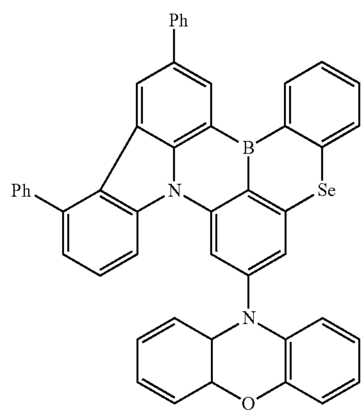

35
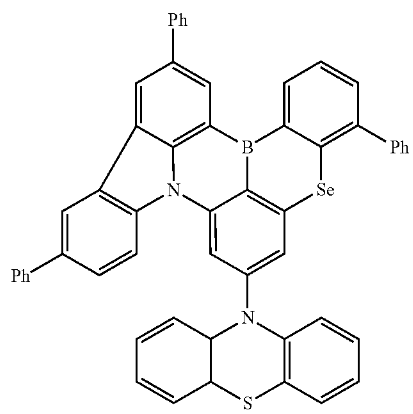
36
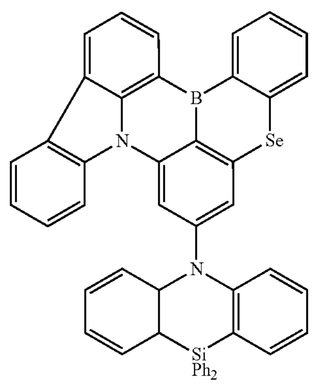
37
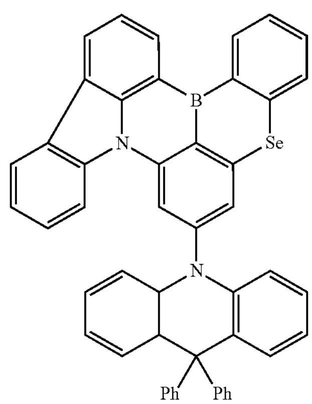
38
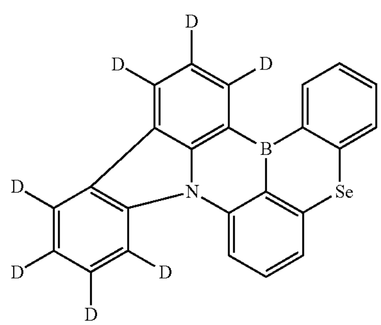
39
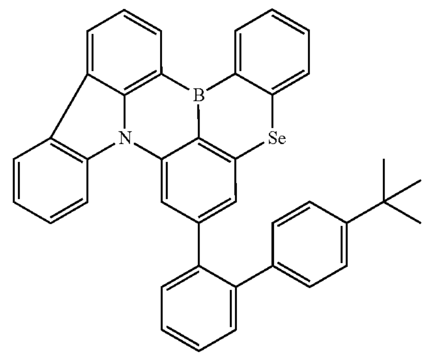
40
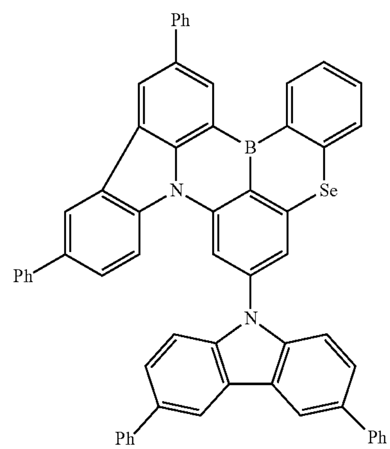
41
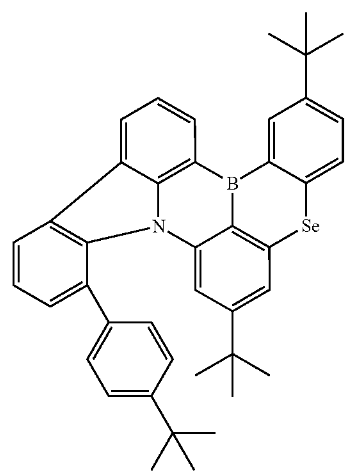
42
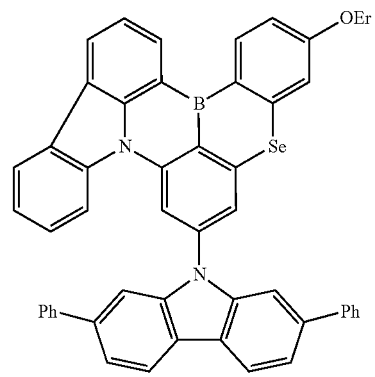

-continued
43
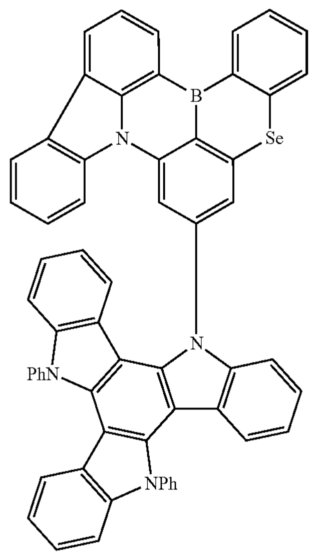
44
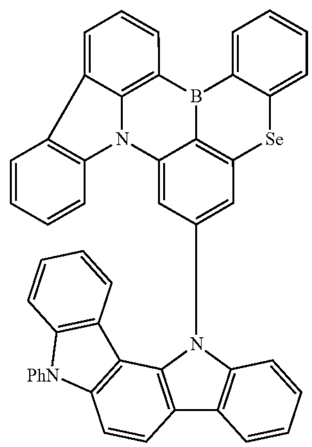
45
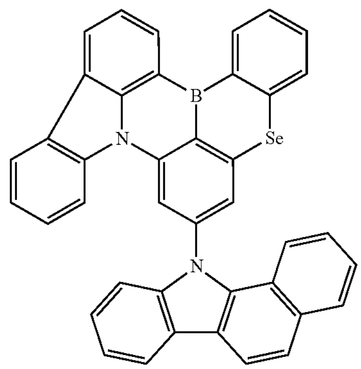
-continued
46
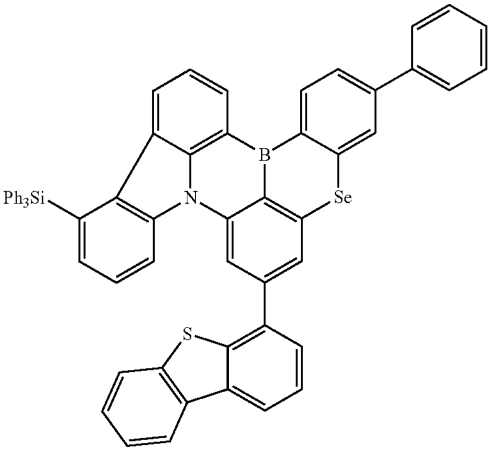
47
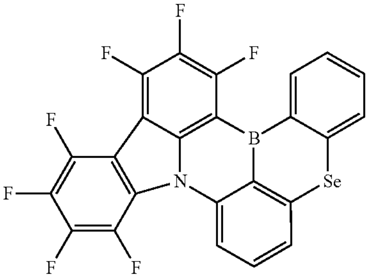
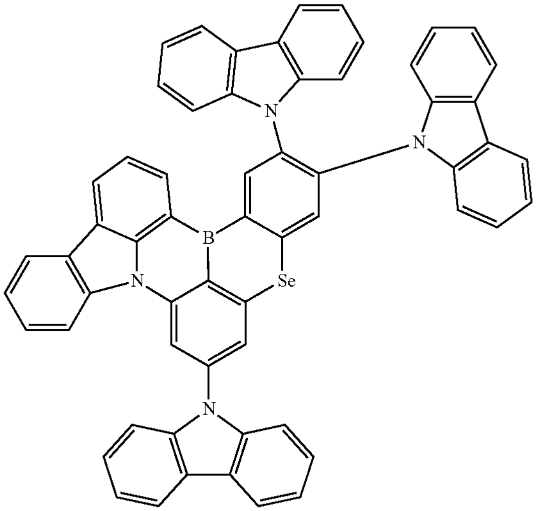

-continued
49
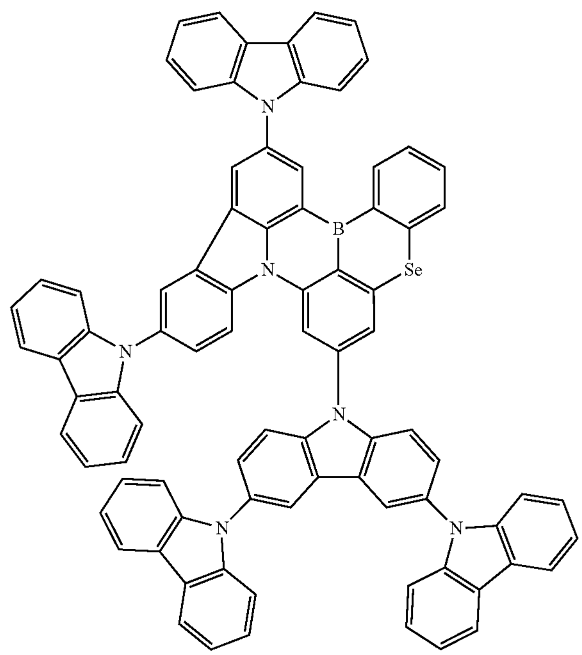
50
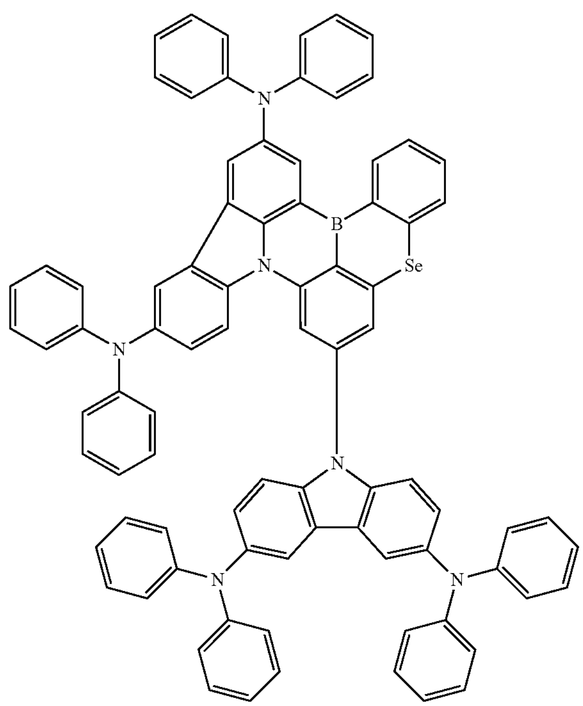
-continued
51
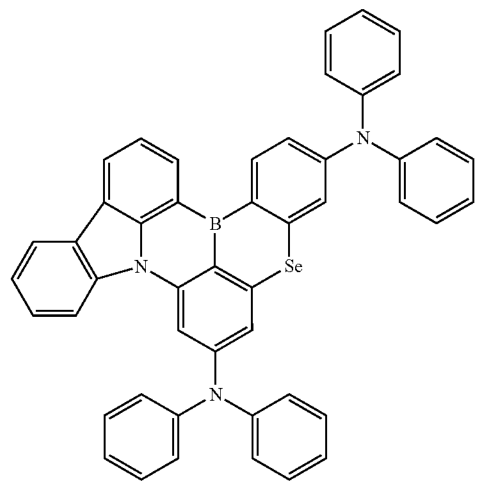
52
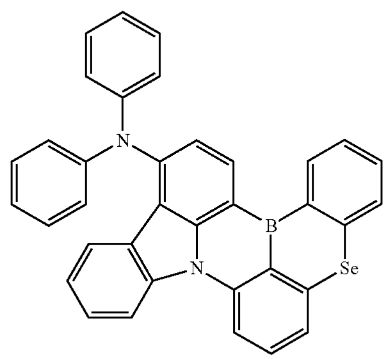
53
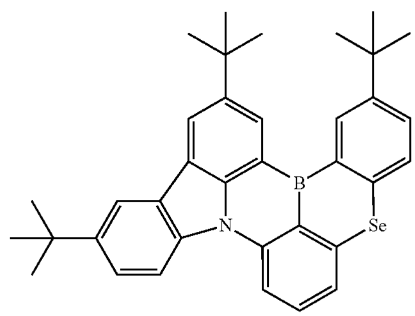
54
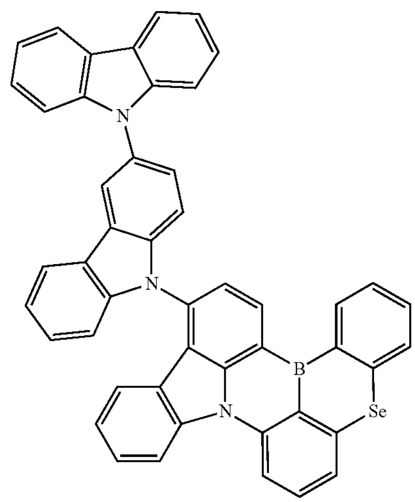

-continued
55
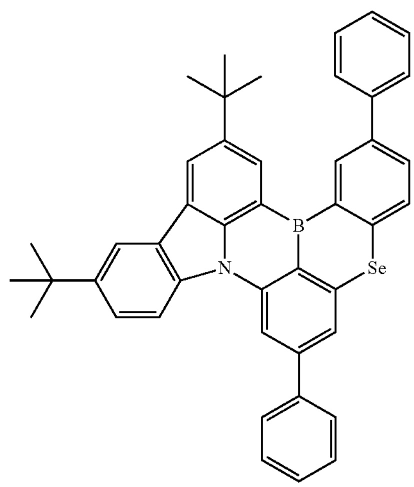
56
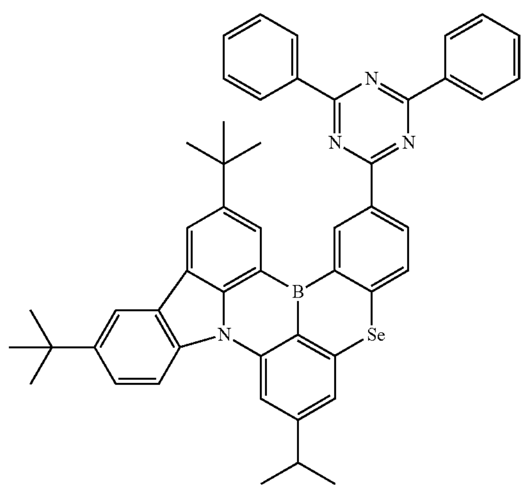
57
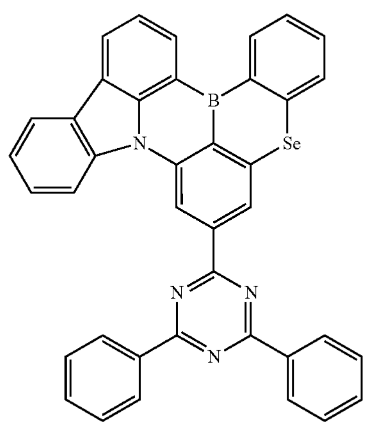
-continued
58
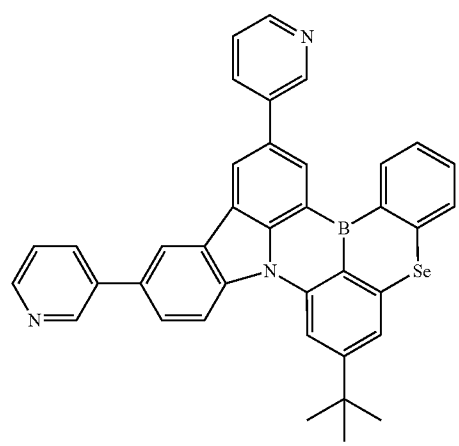
59
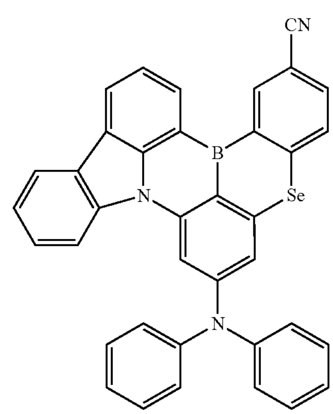
60
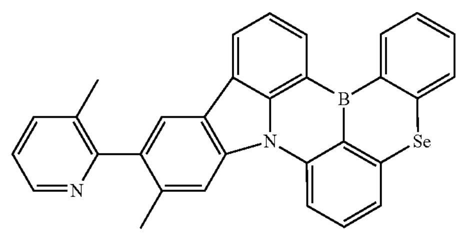
61
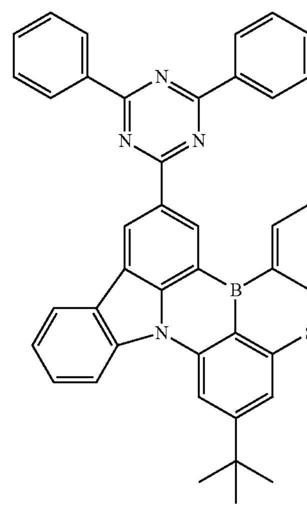

62
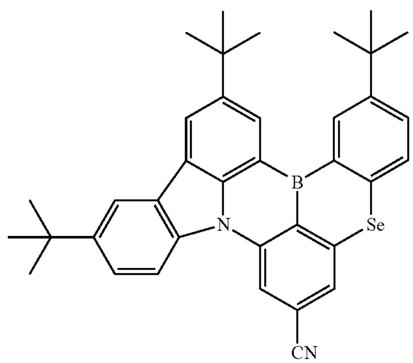
63
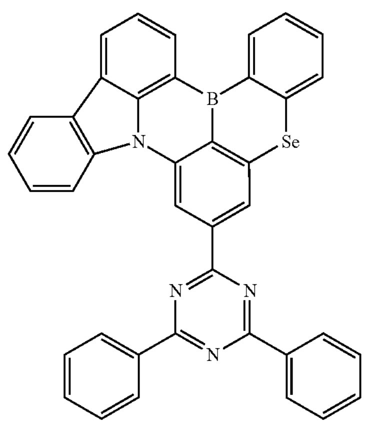
64
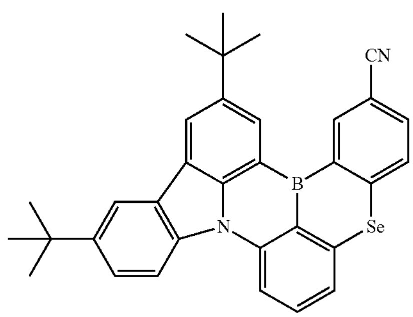
65
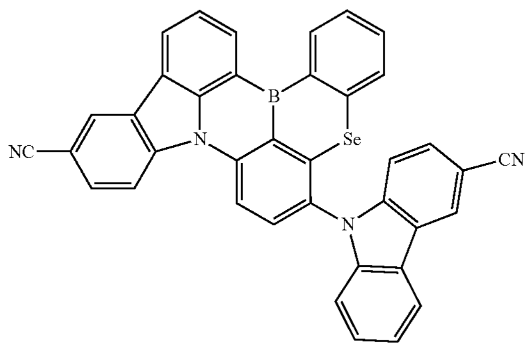
66
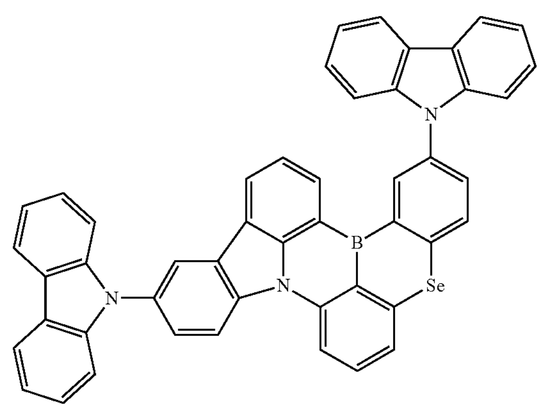
67
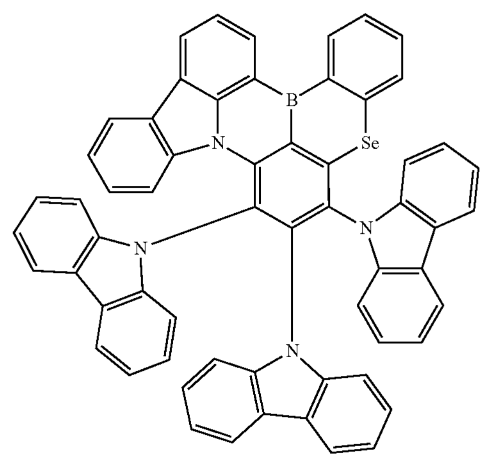
68
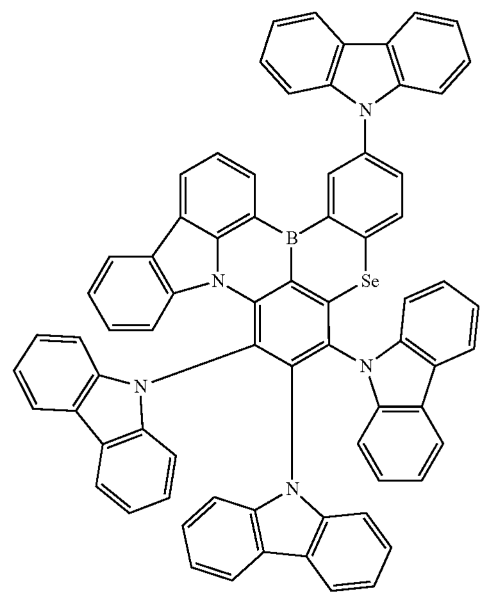

-continued
69
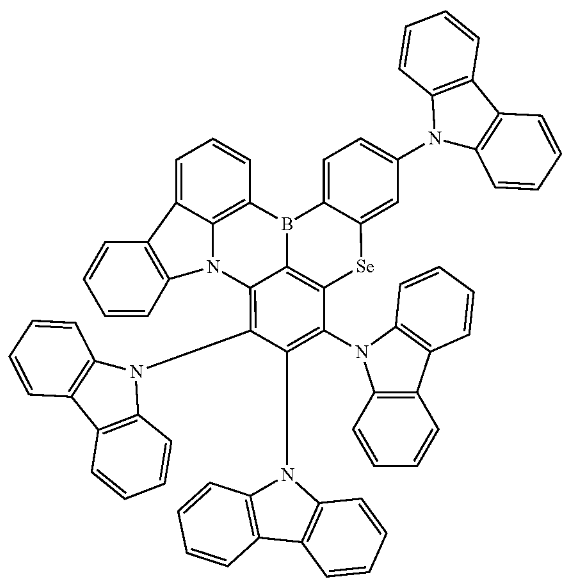
70
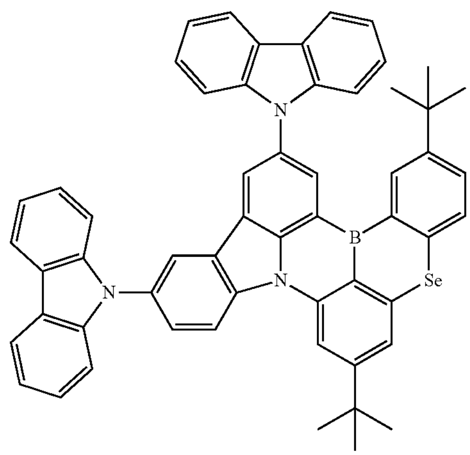
71
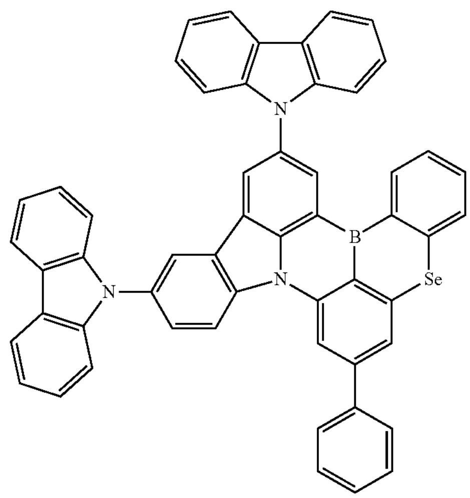
-continued
72
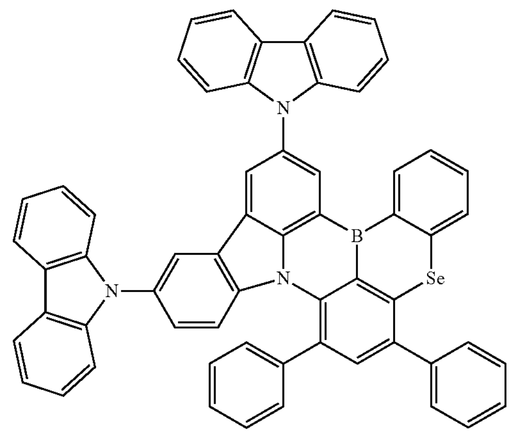
73
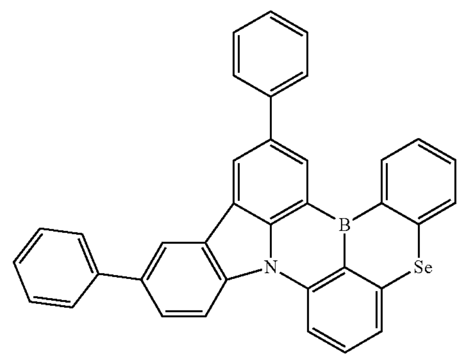
74
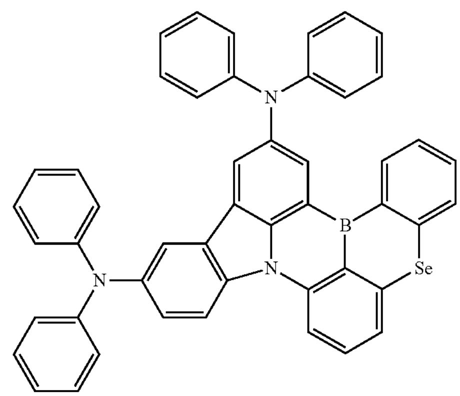
75
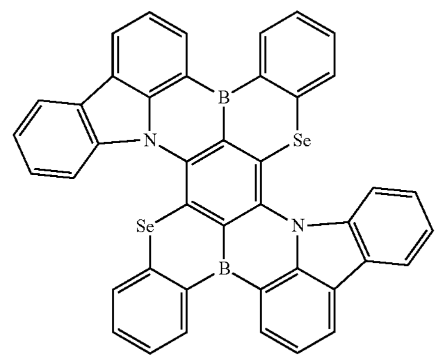

-continued
76
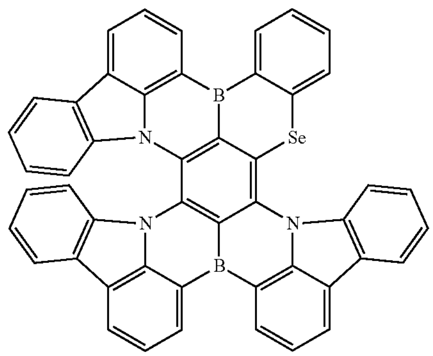
77
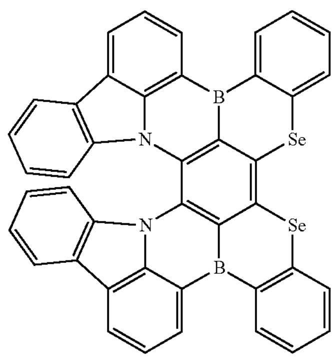
78
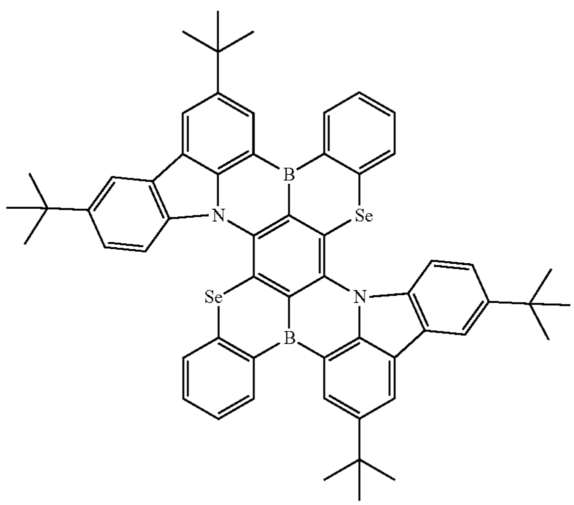
-continued
79
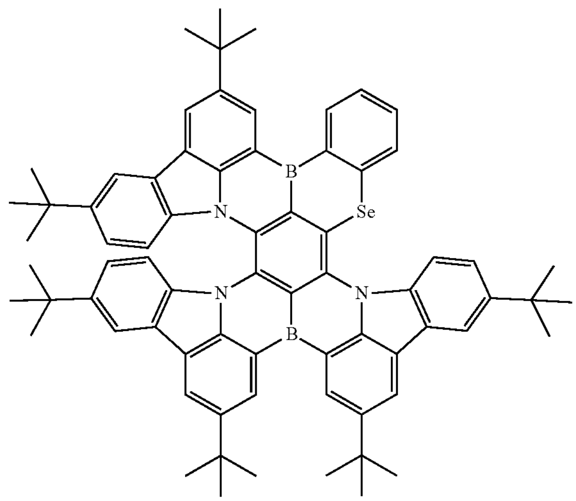
80
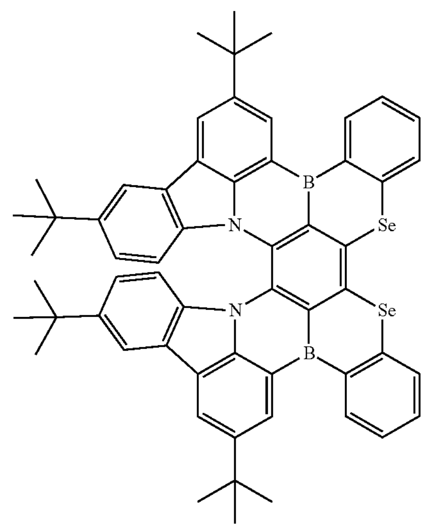
81
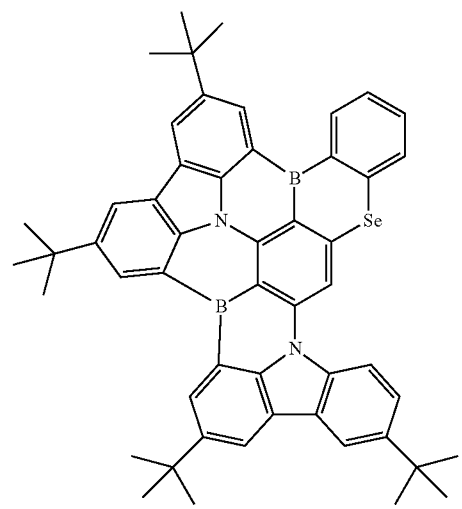

-continued

82

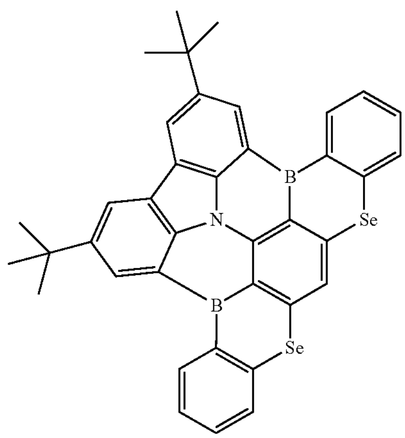

83

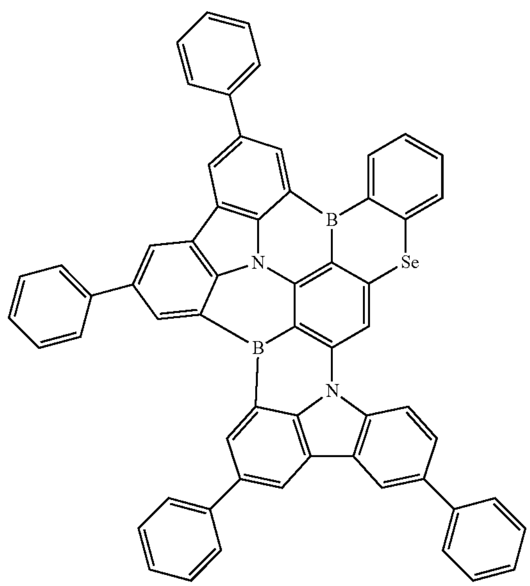

84

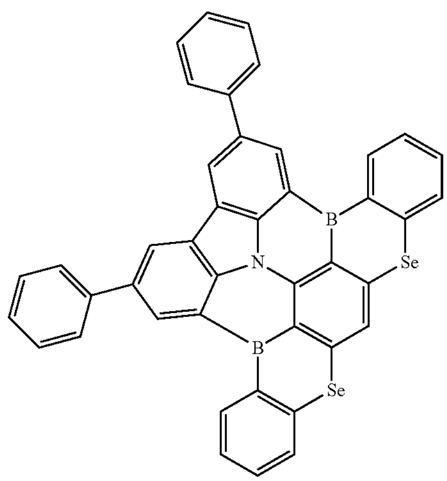

-continued

85

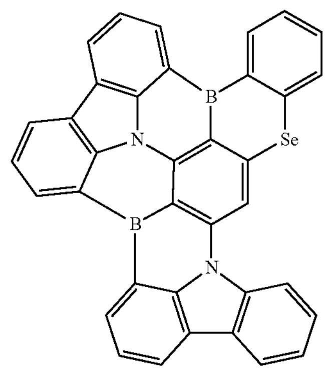

86

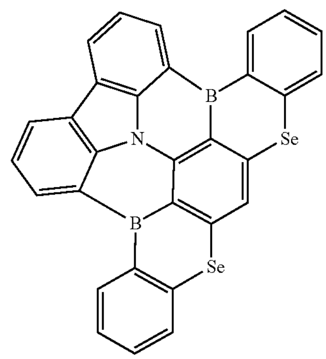

In Compound Group 1, D is a deuterium atom, Ph is a phenyl group, and OEt is an ethoxy group.

The polycyclic compound represented by Formula 1 of one or more embodiments may be used as a fluorescence emitting material or a thermally activated delayed fluorescence (TADF) material. For example, the polycyclic compound of one or more embodiments may be used as a luminescent dopant. In one or more embodiments, the polycyclic compound of one or more embodiments may be used as a TADF dopant material.

The polycyclic compound of one or more embodiments may be a luminescent material having a luminescence center wavelength (Amax) in a wavelength region of about 650 nm or less. For example, the polycyclic compound represented by Formula 1 of one or more embodiments may be a luminescent material having a luminescence center wavelength in a wavelength region of about 460 nm to about 650 nm. The polycyclic compound of one or more embodiments may be a luminescent material that emits (or is configured to emit) light in a wavelength range of green light to blue light.

In one or more embodiments, the polycyclic compound may be a blue thermally activated delayed fluorescent dopant. For example, the polycyclic compound of one or more embodiments may be a blue thermally activated delayed fluorescent dopant. However, the embodiment of the present disclosure is not limited thereto.

In each light emitting element ED of embodiments illustrated in FIGS. 3 to 6, the emission layer EML may include a host and a dopant, and the emission layer EML may include, as a dopant, the polycyclic compound of one or more embodiments as described above.

In one or more embodiments, the emission layer EML may include, as a host, a compound represented by Formula E-2a or Formula E-2b below:

Formula E-2a

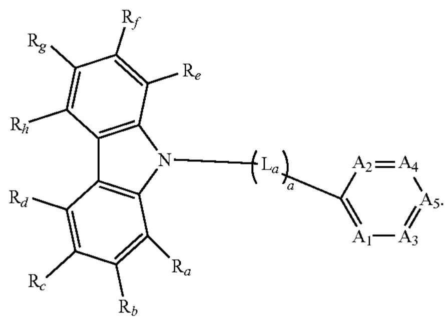

In Formula E-2a, and a may be an integer of 0 to 10, La may be a direct linkage, a substituted or unsubstituted arylene group having 6 to 30 ring-forming carbon atoms, or a substituted or unsubstituted heteroarylene group having 2 to 30 ring-forming carbon atoms. When a is an integer of 2 or more, a plurality of $L_a$'s may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be each independently N or $CR_i$. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. $R_a$ to $R_i$ may be bonded to an adjacent group to form a hydrocarbon ring or a heterocycle containing N, O, S, etc. as a ring-forming atom.

In Formula E-2a, two or three selected from among $A_1$ to $A_5$ may be N, and the rest may be $CR_i$.

Formula E-2b

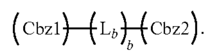

In Formula E-2b, Cbz1 and Cbz2 may be each independently an unsubstituted carbazole group, or a carbazole group substituted with an aryl group having 6 to 30 ring-forming carbon atoms. Lb is a direct linkage, a substituted or unsubstituted arylene group having 6 to 30 ring-forming carbon atoms, or a substituted or unsubstituted heteroarylene group having 2 to 30 ring-forming carbon atoms. b is an integer of 0 to 10, and when b is an integer of 2 or more, a plurality of Lb's may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one selected from among the compounds of Compound Group E-2 below. However, the compounds listed in Compound Group E-2 below are examples, the compound represented by Formula E-2a or Formula E-2b is not limited to those represented by Compound Group E-2 below.

Compound Group E-2

E-2-1

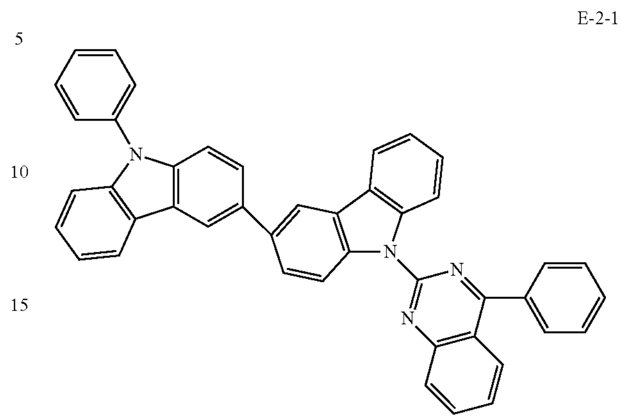

E-2-2

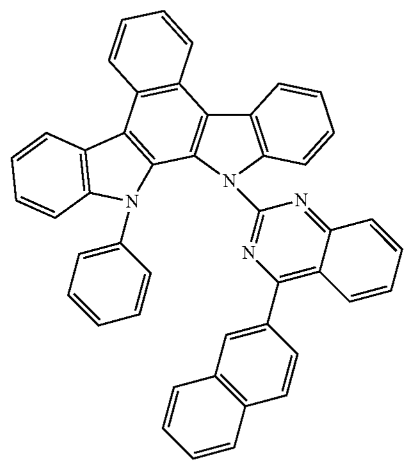

E-2-3

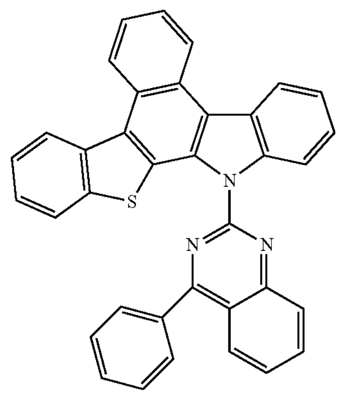

-continued
E-2-4
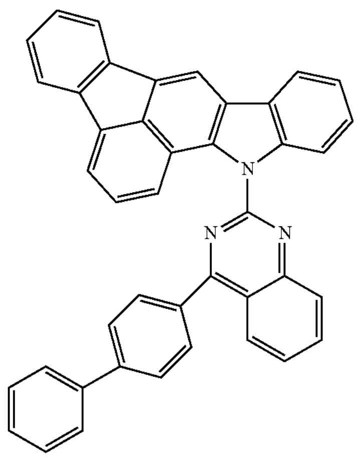
E-2-5
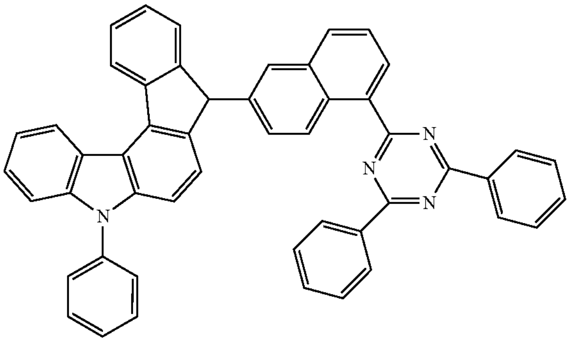
E-2-6
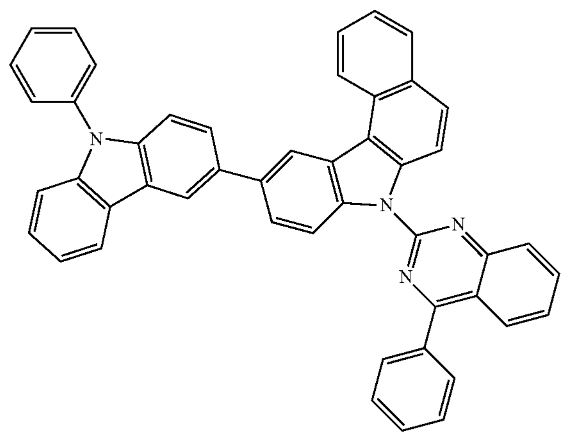
-continued
E-2-7
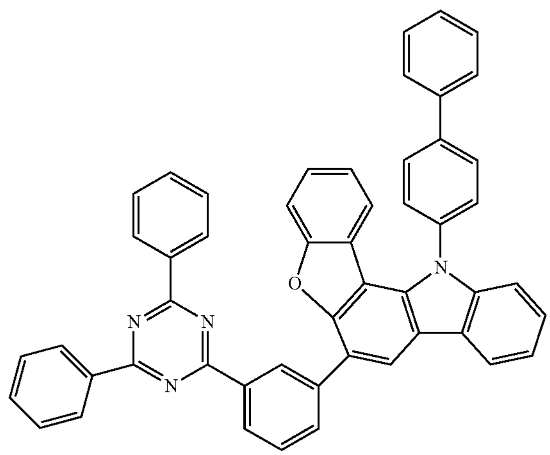
E-2-8
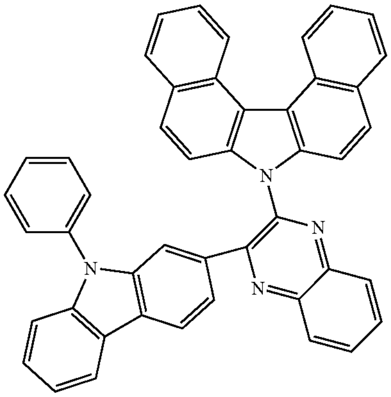
E-2-9
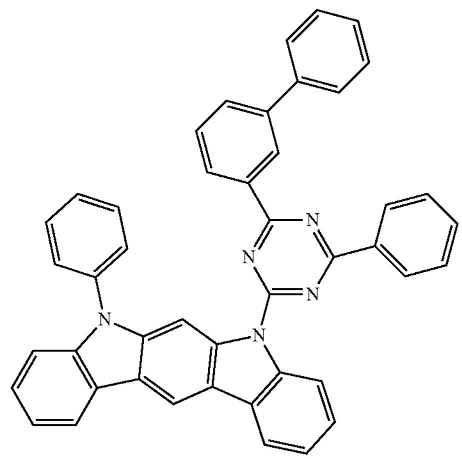

-continued
E-2-10
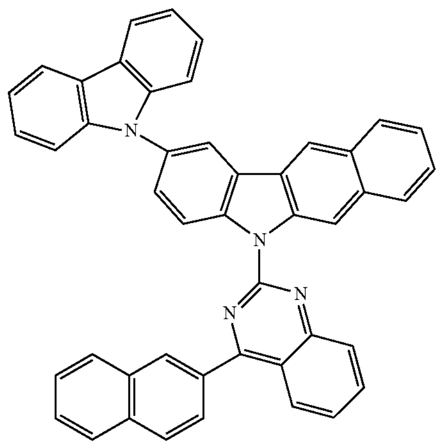
E-2-11
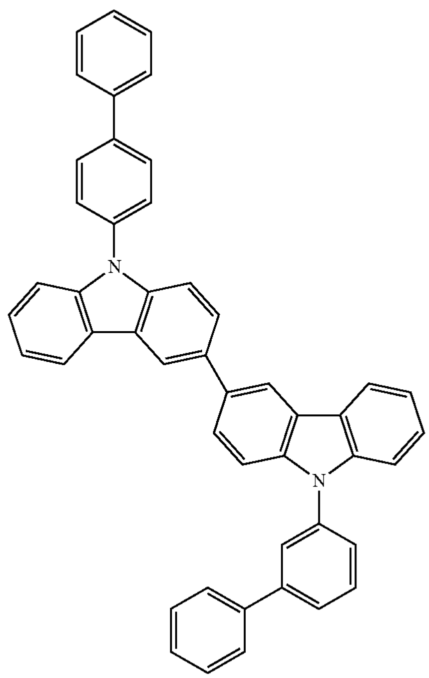
E-2-12
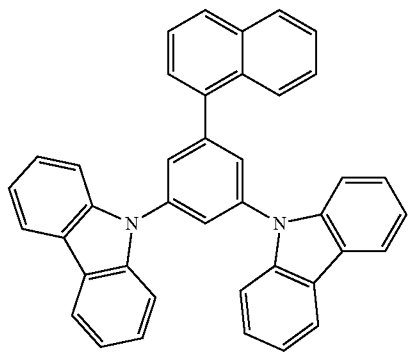
-continued
E-2-13
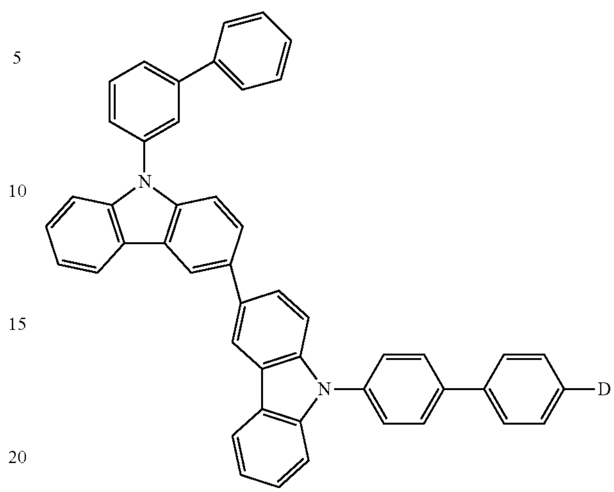
E-2-14
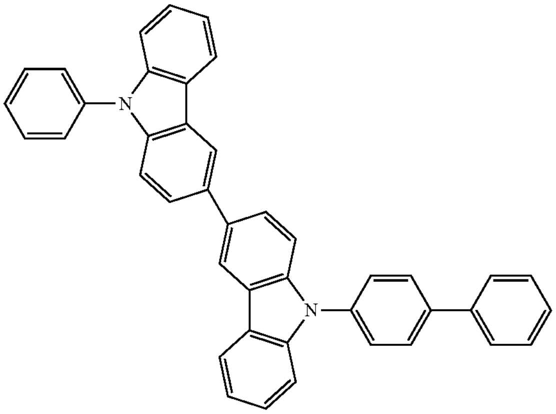
E-2-15
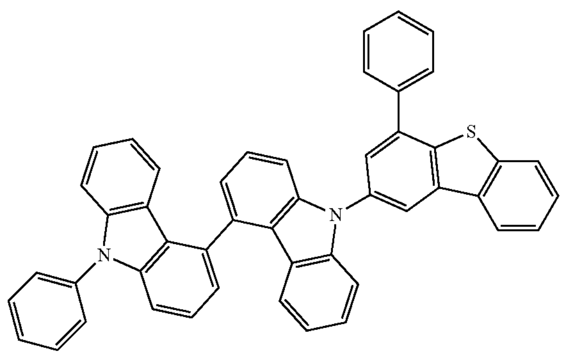

-continued
E-2-16
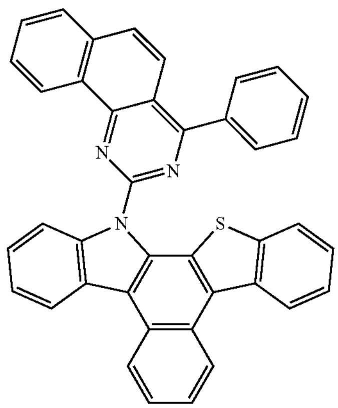
E-2-17
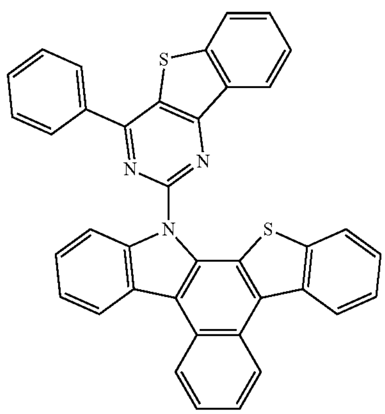
E-2-18
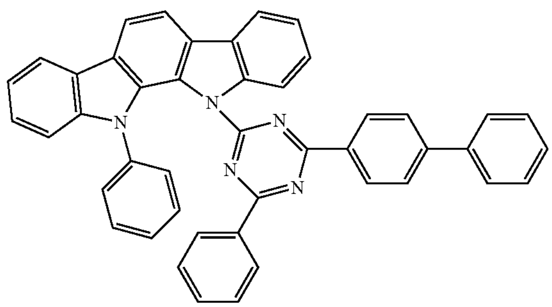
E-2-19
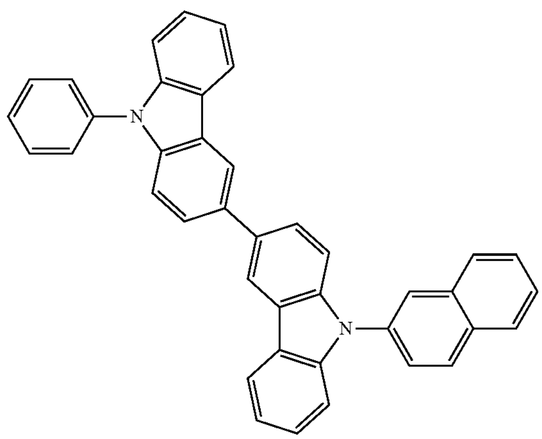
-continued
E-2-20
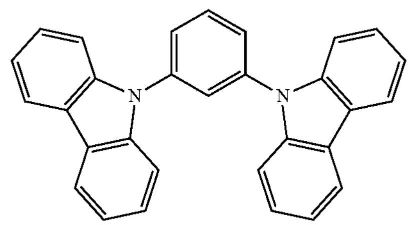
E-2-21
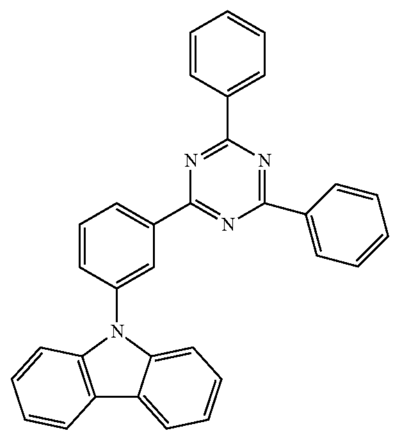
E-2-22
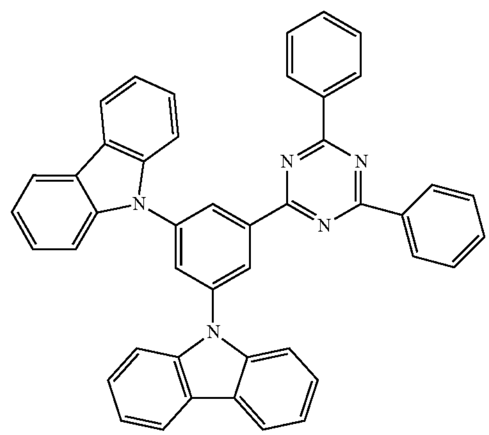
E-2-23
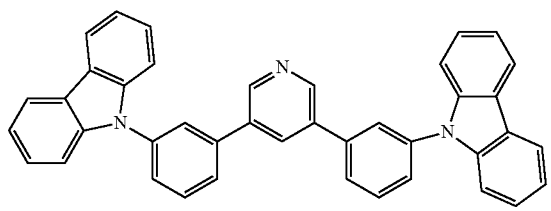

-continued

E-2-24

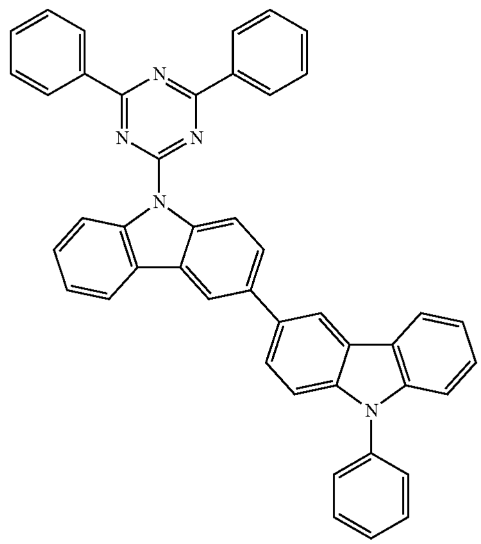

E-2-25

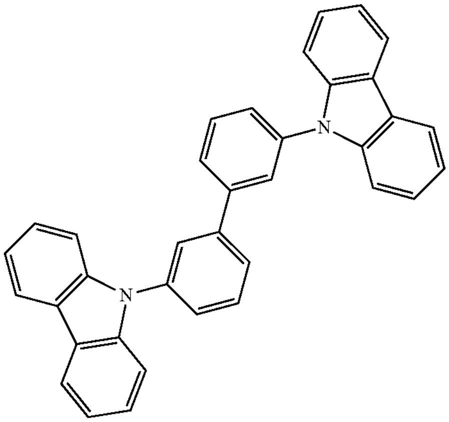

In the light emitting element ED of one or more embodiments, the compound represented by Formula E-2a or Formula E-2b as described above may be used as a phosphorescence host material.

For example, in the light emitting element ED of one or more embodiments, the emission layer EML may include, as a host, Compound E-2-25 of Compound Group E-2 as described above.

E-2-25

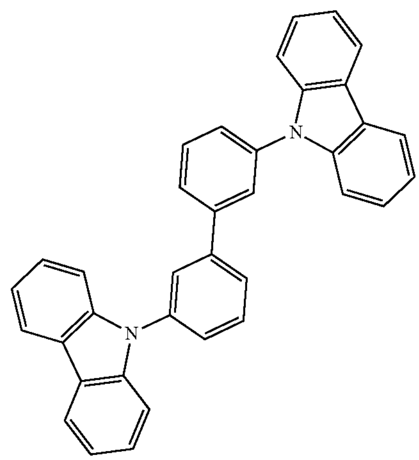

In some embodiments, in the light emitting element ED of one or more embodiments, the emission layer EML may include a host and a dopant, and the emission layer EML may further include a compound represented by Formula E-1 below. The compound represented by Formula E-1 below may be included as a fluorescence host material.

Formula E-1

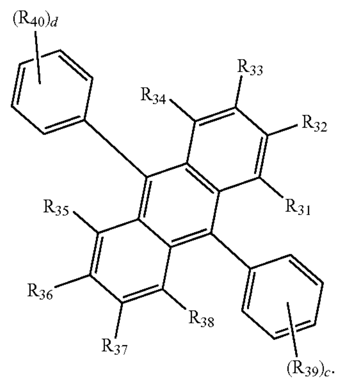

In Formula E-1, $R_{31}$ to $R_{40}$ may be each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In one or more embodiments, $R_{31}$ to $R_{40}$ may be bonded to an adjacent group to form a saturated hydrocarbon ring or an unsaturated hydrocarbon ring, a saturated heterocycle, or an unsaturated heterocycle.

In Formula E-1, c and d may be each independently an integer of 0 to 5.

Formula E-1 may be represented by any one selected from among Compound E1 to Compound E19 below.

-continued
E1
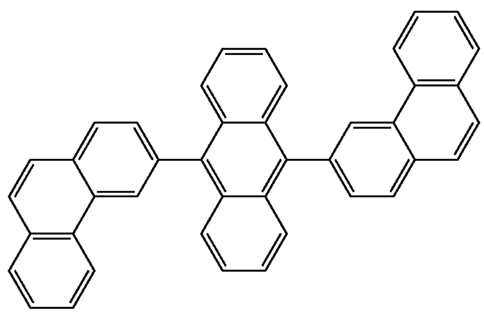
E2
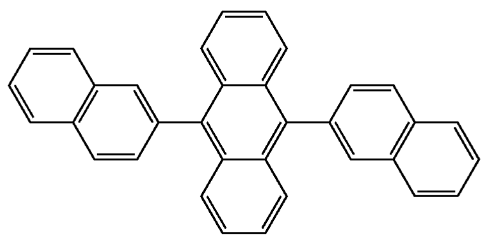
E3
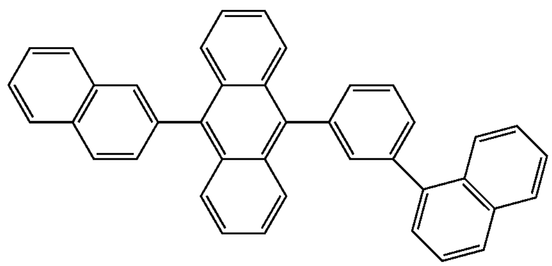
E4
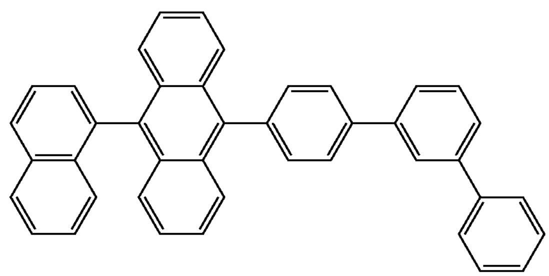
E5
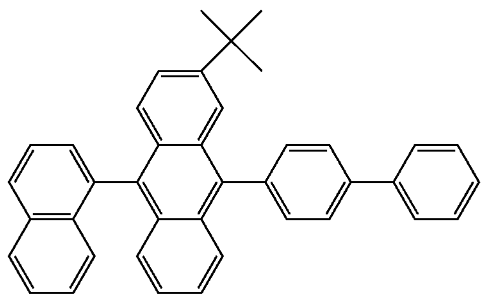
E-6
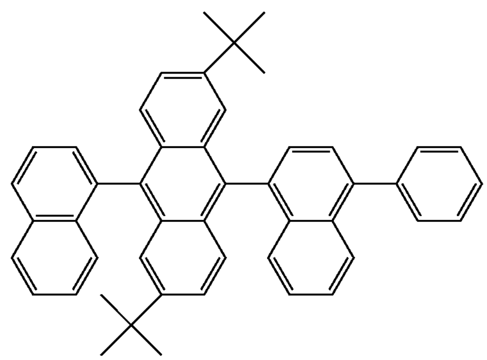
E-7
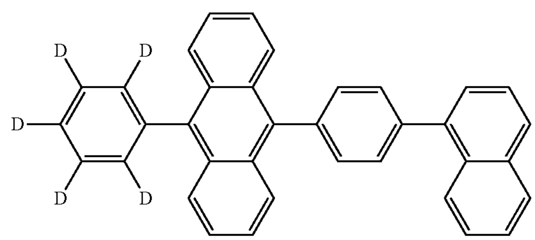
E-8
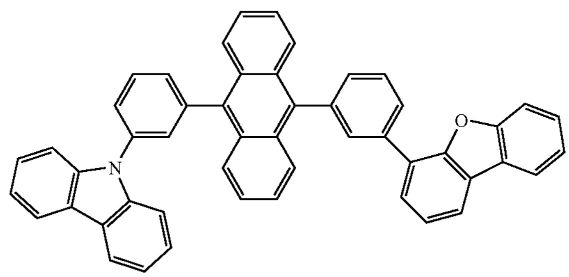
E-9
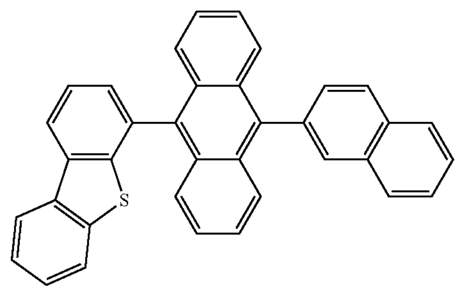
E-10
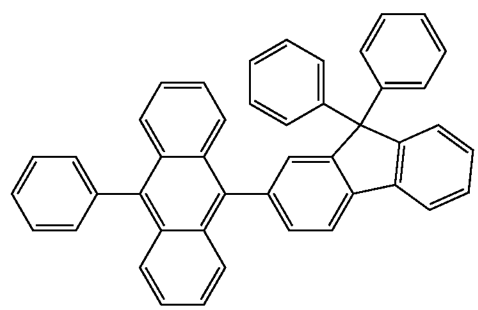

-continued
E-11
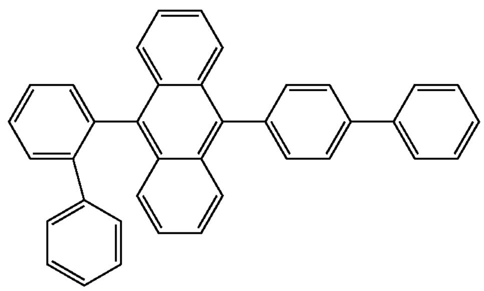
E-12
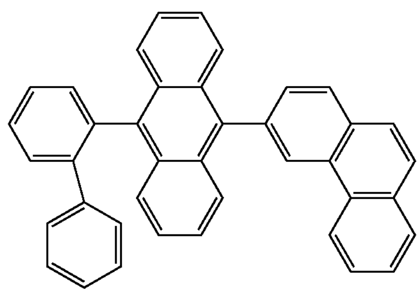
E-13
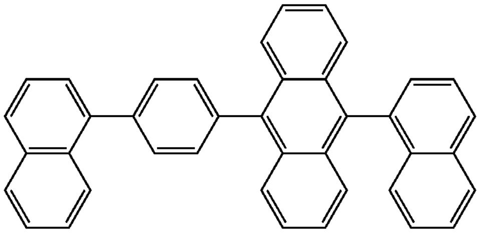
E-14
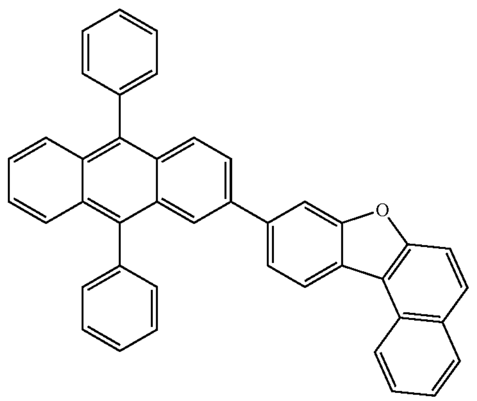
-continued
E-15
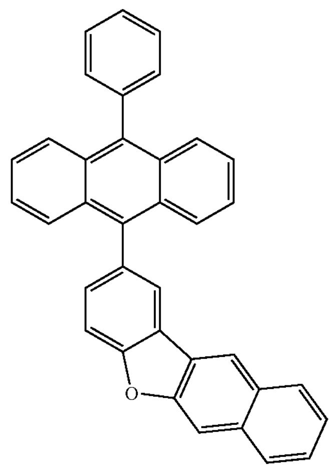
E16
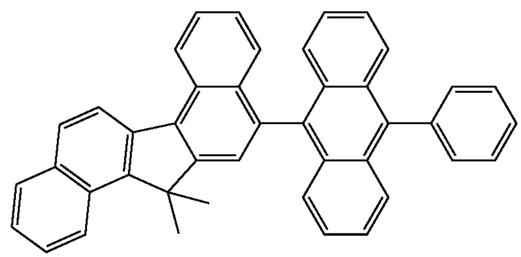
E17
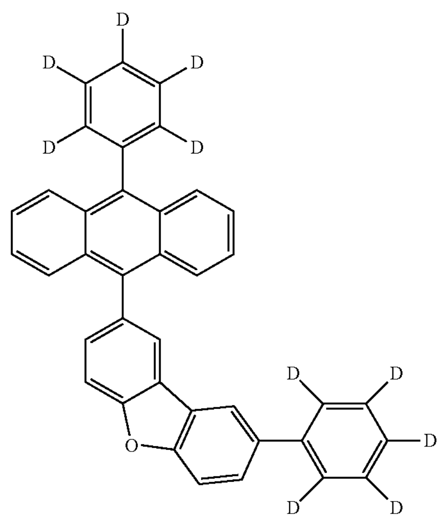
E18
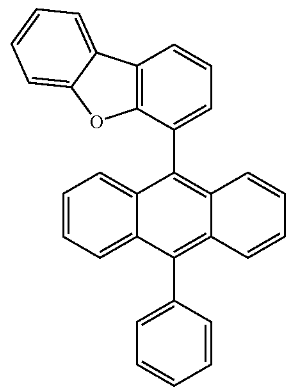

-continued

E19

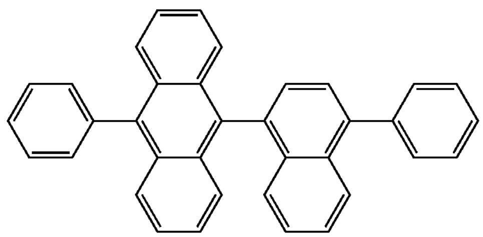

The emission layer EML may further include a suitable material as a host material. For example, the emission layer EML may include, as a host material, at least one of bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and/or 1,3,5-tris(1-phenyl-1H-benzo[d]imidazole-2-yl)benzene (TPBi). However, the embodiment of the present disclosure is not limited thereto, for example, tris(8-hydroxyquinolino)aluminum (Alq3), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as a host material.

The emission layer EML may include a compound represented by Formula M-a or Formula M-b below. The compound represented by Formula M-a or Formula M-b below may be used as a phosphorescence dopant material. In some embodiments, the compound represented by Formula M-a or Formula M-b in one or more embodiments may be used as an auxiliary dopant material.

Formula M-a

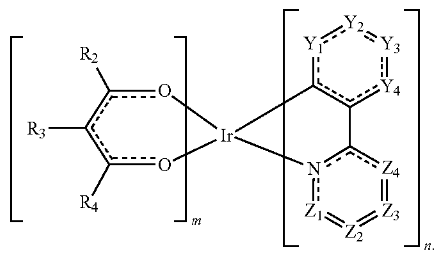

In Formula M-a above, $Y_1$ to $Y_4$ and $Z_1$ to $Z_4$ may be each independently $CR_1$ or N, $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In Formula M-a, m is 0 or 1, and n is 2 or 3. In Formula M-a, when m is 0, n is 3, and when m is 1, n is 2.

The compound represented by Formula M-a may be used as a phosphorescence dopant.

The compound represented by Formula M-a may be represented by any one selected from among Compound M-a1 to Compound M-a25 below. However, Compounds M-a1 to M-a25 below are examples, and the compound represented by Formula M-a is not limited to those represented by Compounds M-a1 to M-a25 below.

M-a1

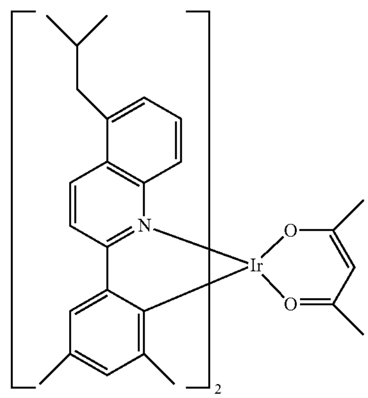

M-a2

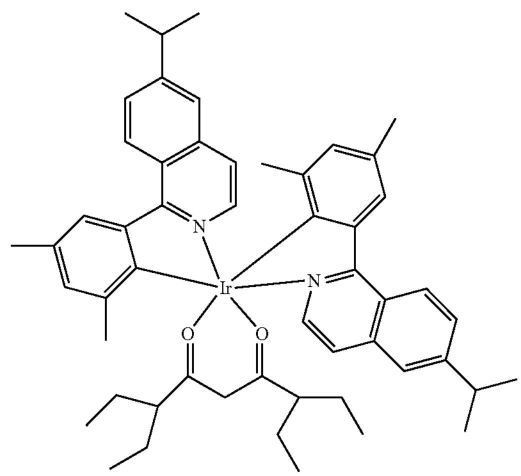

M-a3

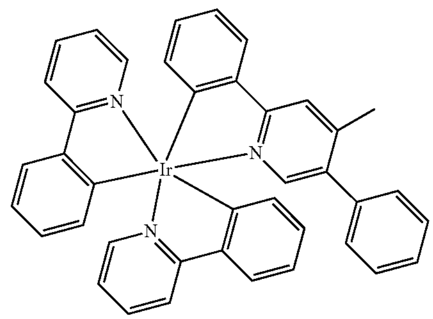

-continued
M-a4
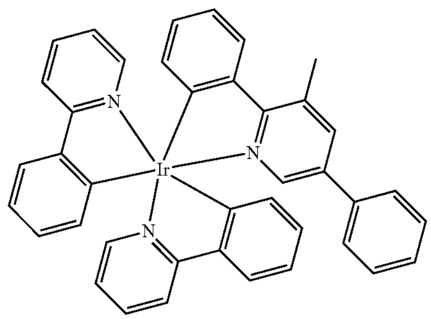
M-a5
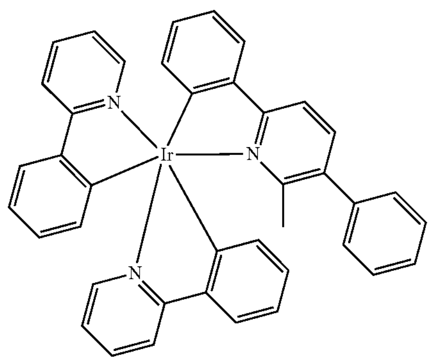
M-a6
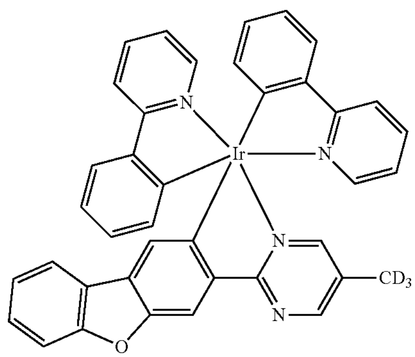
M-a7
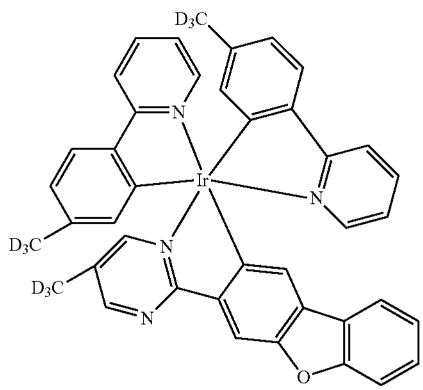
-continued
M-a8
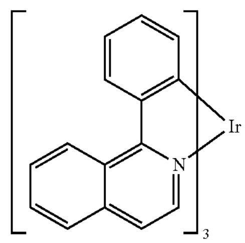
M-a9
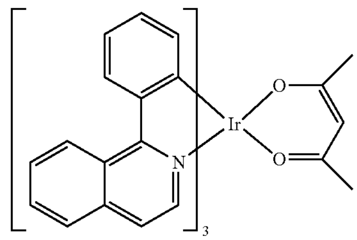
M-a10
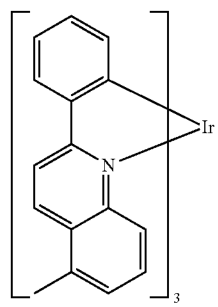
M-a11
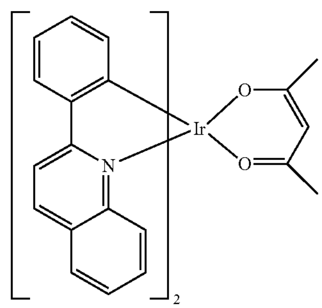
M-a12
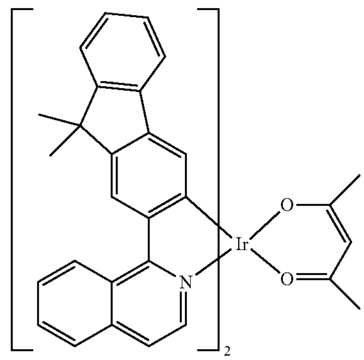

-continued
M-a13
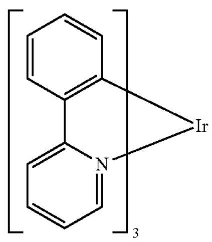
M-a14
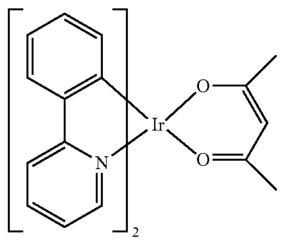
M-a15
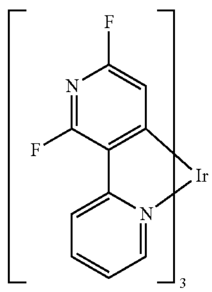
M-a16
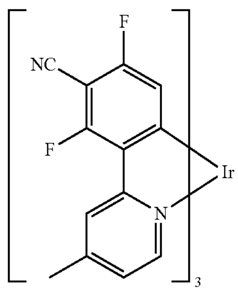
M-a17
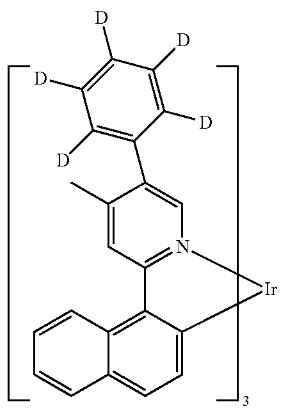
-continued
M-a18
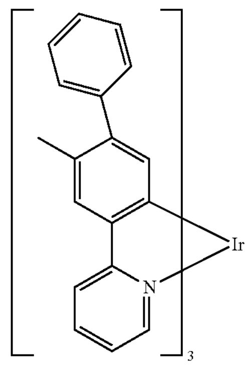
M-a19
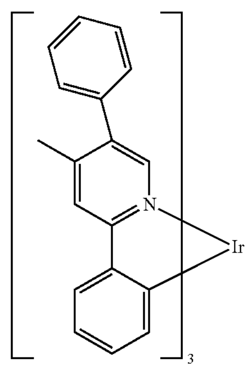
M-a20
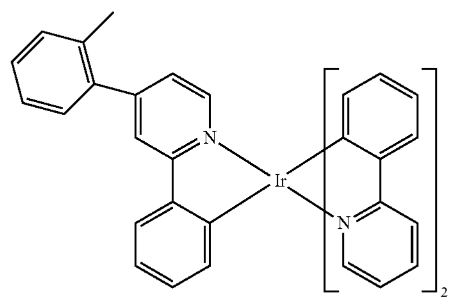
M-a21
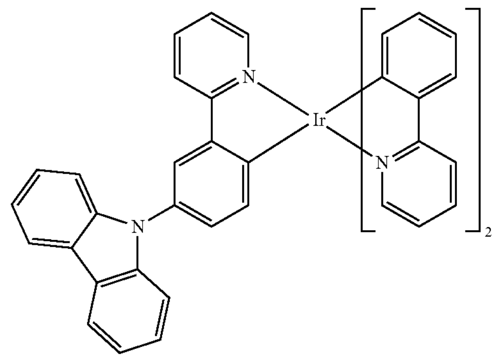

-continued

M-a22

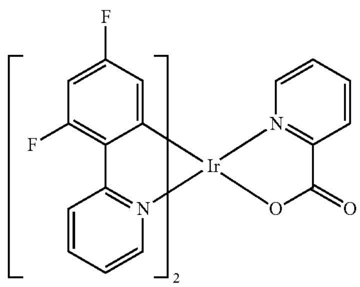

M-a23

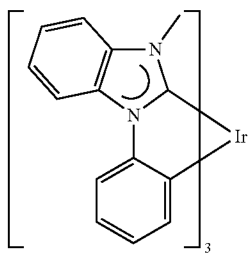

M-a24

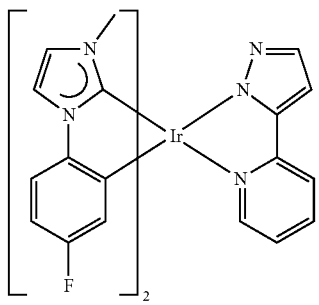

M-a25

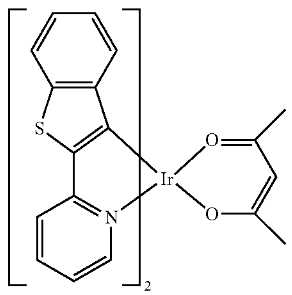

Compound M-a1 and Compound M-a2 may be used as a red dopant material, and Compound M-a3 to Compound M-a7 may be used as a green dopant material.

Formula M-b

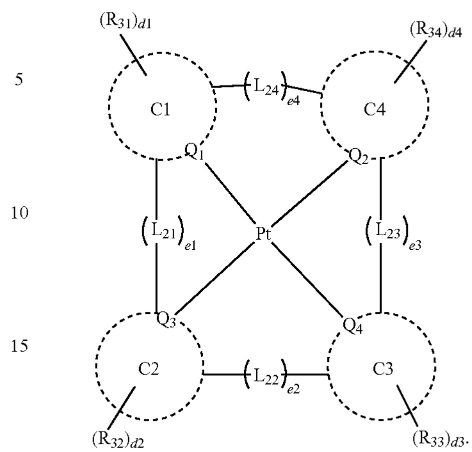

In Formula M-b, Qi to Q4 are each independently C or N, and C1 to C4 may be each independently a substituted or unsubstituted hydrocarbon ring having 5 to 30 ring-forming carbon atoms, or a substituted or unsubstituted heterocycle having 2 to 30 ring-forming carbon atoms. L21 to L24 may be each independently a direct linkage,

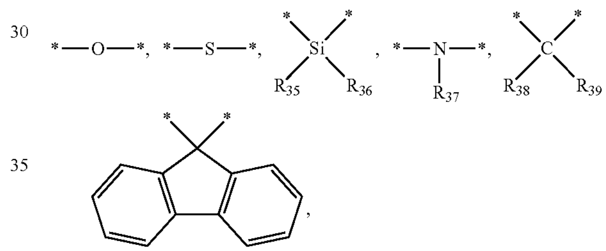

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and el to e4 may be each independently 0 or 1. $R_{31}$ to $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, and d1 to d4 may be each independently an integer of 0 to 4.

The compound represented by Formula M-b may be used as a blue phosphorescence dopant or a green phosphorescence dopant. In some embodiments, the compound represented by Formula M-b may be further included as an auxiliary dopant in the emission layer EML in one or more embodiments.

The compound represented by Formula M-b may be represented by any one selected from among the compounds below. However, the compounds below are examples, and the compound represented by Formula M-b is not limited to those represented by the compounds below.

-continued
M-b-1
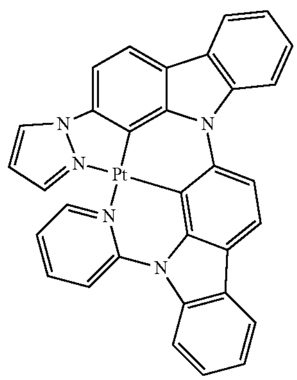
M-b-2
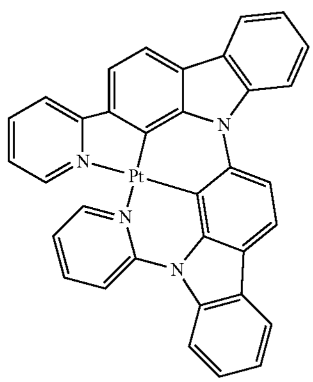
M-b-3
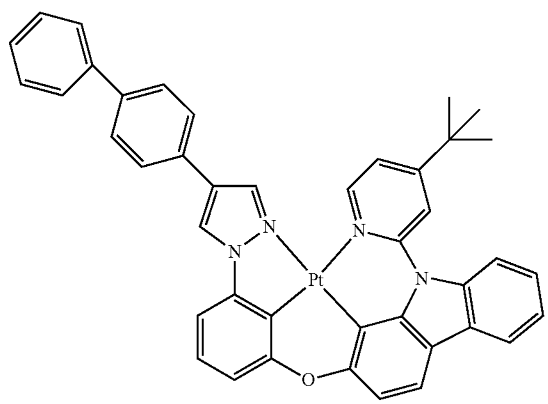
M-b-4
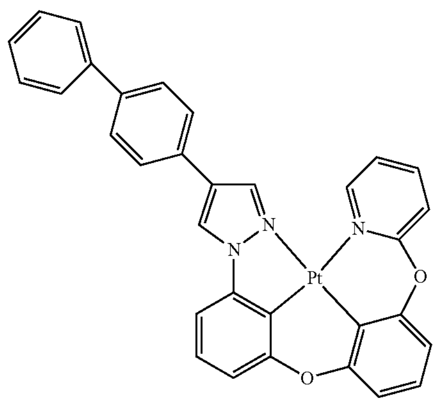
M-b-5
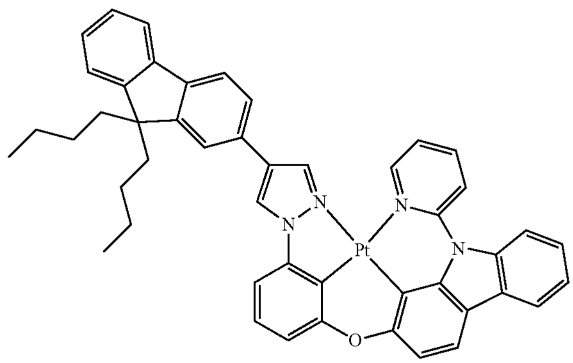
M-b-6
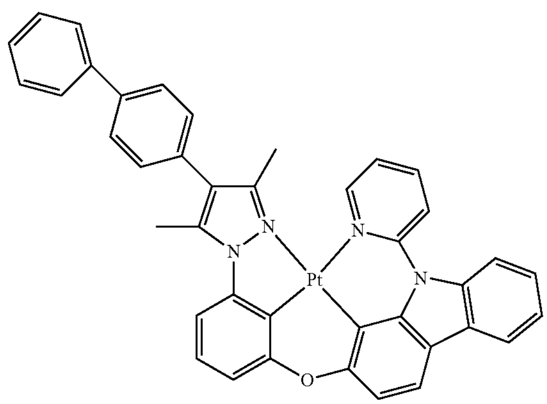
M-b-7
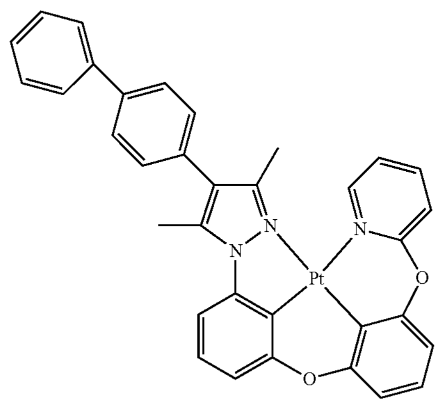
M-b-8
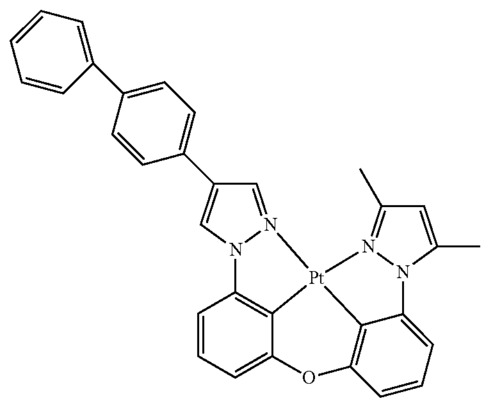

-continued

M-b-9

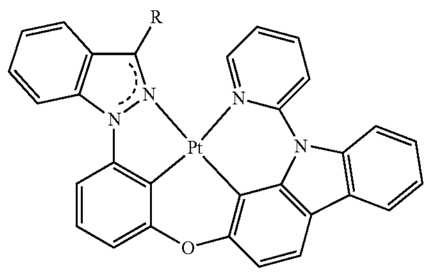

M-b-10

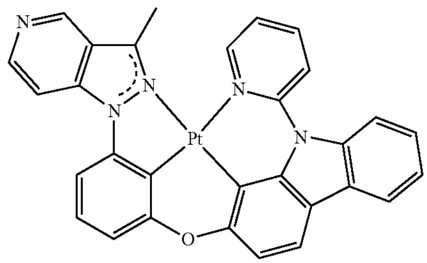

M-b-11

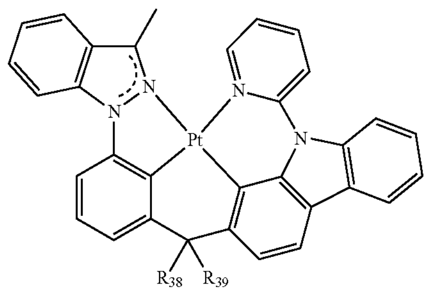

In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may further include a compound represented by any one selected from among Formula F-a to Formula F-c below. The compound represented by Formula F-a to Formula F-c below may be used as a fluorescence dopant material.

Formula F-a

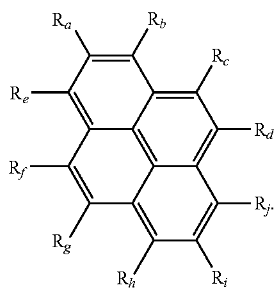

In Formula F-a, two selected from among $R_a$ to $R_j$ may each independently be substituted with $*\!-\!NAr_1Ar_2$. The others, which are not substituted with $*\!-\!NAr_1Ar_2$ from among $R_a$ to $R_j$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In $*\!-\!NAr_1Ar_2$, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. For example, at least one of $Ar_1$ and/or $Ar_2$ may be a heteroaryl group containing O or S as a ring-forming atom.

Formula F-b

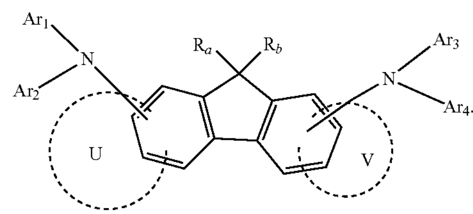

In Formula F-b above, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. $Ar_1$ to $Ar_4$ may be each independently a substituted or unsubstituted aryl group having 6 to 30 ring-forming carbon atoms, or a substituted or unsubstituted heteroaryl group having 2 to 30 ring-forming carbon atoms.

In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, in Formula F-b, it means that when the number of U or V is 1, one ring constitutes a condensed ring at a portion indicated by U or V, and when the number of U or V is 0, a ring indicated by U or V does not exist. For example, when the number of U is 0 and the number of V is 1, or when the number of U is 1 and the number of V is 0, the condensed ring having a fluorene core in Formula F-b may be a cyclic compound having four rings. When each number of U and V is 0, the condensed ring in Formula F-b may be a cyclic compound having three rings. When each number of U and V is 1, the condensed ring having a fluorene core in Formula F-b may be a cyclic compound having five rings.

Formula F-c

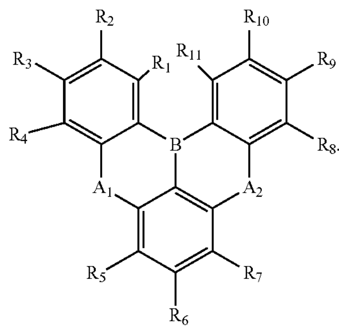

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may be each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula F-c, $A_1$ and $A_2$ may each independently be bonded to substituents of an adjacent ring to form a condensed ring. For example, when $A_1$ and $A_2$ are each independently $NR_m$, $A_1$ may be bonded to $R_4$ or $R_5$ to form a ring. In one or more embodiments, $A_2$ may be bonded to $R_7$ or $R_8$ to form a ring.

In one or more embodiments, the emission layer EML may include, as a suitable dopant material, a styryl derivative (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), 4,4'-bis[2-(4-(N,N-diphenylamino)phenyl)vinyl]biphenyl (DPAVBi), perylene and/or a derivative thereof (e.g., 2,5,8,11-tetra-t-butylperylene (TBP)), pyrene and/or a derivative thereof (e.g., 1,1-dipyrene, 1,4-dipyrenylbenzene, and/or 1,4-bis(N,N-diphenylamino)pyrene), etc.

In one or more embodiments, when a plurality of emission layers EML are included, at least one emission layer EML may include a suitable phosphorescence dopant material. For example, a metal complex including iridium (Ir), platinum (Pt), osmium (Os), aurum (Au), titanium (Ti), zirconium (Zr), hafnium (Hf), europium (Eu), terbium (Tb), and/or thulium (Tm) may be used as a phosphorescence dopant. For example, iridium(III) bis(4,6-difluorophenylpyridinato-N,C2')picolinate (Flrpic), bis(2,4-difluorophenylpyridinato)-tetrakis(1-pyrazolyl)borate iridium(III) ($Flr_6$), and/or platinum octaethyl porphyrin (PtOEP) may be used as a phosphorescence dopant. However, the embodiment of the present disclosure is not limited thereto.

At least one emission layer EML may include a quantum dot material. The core of the quantum dot may be selected from among a Group II-VI compound, a Group III-VI compound, a Group compound, a Group III-V compound, a Group III-II-V compound, a Group IV-VI compound, a Group IV element, a Group IV compound, and combinations thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and mixtures thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The Group III-VI compound may include a binary compound such as $In_2S_3$ and/or $In_2Se_3$; a ternary compound such as $InGaS_3$ and/or $InGaSe_3$, or any combination thereof.

The Group compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and mixtures thereof, and a quaternary compound such as $AgInGaS_2$ and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The Group IV element may be selected from the group consisting of Si, Ge, and a mixture thereof. The Group IV compound may be a binary compound selected from the group consisting of SiC, SiGe, and a mixture thereof.

In this case, a binary compound, a ternary compound, and/or a quaternary compound may be present in particles in a uniform concentration distribution, or may be present in the same particle in a partially different concentration distribution. In addition, a core/shell structure in which one quantum dot surrounds another quantum dot may also be possible. The core/shell structure may have a concentration gradient in which the concentration of elements present in the shell decreases toward the core.

In some embodiments, a quantum dot may have the above-described core-shell structure including a core containing nanocrystals and a shell surrounding the core. The shell of the quantum dot may serve as a protection layer to prevent or reduce chemical deformation of the core so as to maintain semiconductor properties, and/or a charging layer to impart electrophoresis properties to the quantum dot. The shell may be a single layer or a multilayer. An example of the shell of the quantum dot may include a metal oxide, a non-metal oxide, a semiconductor compound, or a combination thereof.

For example, the metal oxide or the non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; and/or a ternary compound such as $MgAl_2O_4$, $CoFe_2O_4$, $NiFe_2O_4$, and/or $CoMn_2O_4$, but the present disclosure is not limited thereto.

In one or more embodiments, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the present disclosure is not limited thereto.

The quantum dot may have a full width of half maximum (FWHM) of a light emission wavelength spectrum of about 45 nm or less, for example, about 40 nm or less, or about 30 nm or less, and color purity and/or color reproducibility may be improved in the above range. In addition, light emitted through such a quantum dot is emitted in all directions, and thus a wide viewing angle may be improved.

The form of a quantum dot is not particularly limited as long as it is a form suitable for use in the art, for example, a quantum dot in the form of spherical, pyramidal, multi-arm, and/or cubic nanoparticles, nanotubes, nanowires, nanofibers, nanoparticles, etc. may be used.

The quantum dot may control the color of emitted light according to the particle size thereof. Accordingly, the quantum dot may have various light emission colors such as blue, red, and green.

In each light emitting element ED of embodiments illustrated in FIGS. 3 to 6, the electron transport region ETR is provided on the emission layer EML. The electron transport region ETR may include at least one of the hole blocking layer HBL, the electron transport layer ETL, and/or the electron injection layer EIL, but the embodiment of the present disclosure is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In one or more embodiments, the electron transport region ETR may have a single layer structure formed of a plurality of different materials, or may have a structure in which an electron transport layer ETL/electron injection layer EIL, a hole blocking layer HBL/electron transport layer ETL/electron injection layer EIL, an electron transport layer ETL/buffer layer/electron injection layer EIL are stacked in order from the emission layer EML, but the embodiment of the present disclosure is not limited thereto. The electron transport region ETR may have a thickness, for example, from about 1,000 Å to about 1,500 Å.

The electron transport region ETR may be formed by using various suitable methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

Formula ET-1

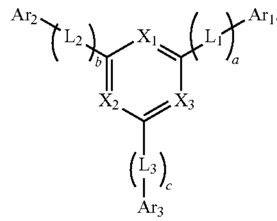

In Formula ET-1, at least one selected from among $X_1$ to $X_3$ is N, and the rest are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. When a to c are each independently an integer of 2 or more, $L_1$ to L3 may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the embodiment of the present disclosure is not limited thereto, and the electron transport region ETR may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl) phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), diphenyl(4-(triphenylsilyl)phenyl)phosphine oxide (TSPO1), or a mixture thereof.

The electron transport region ETR may include at least one selected from among Compound ET1 to Compound ET36 below:

ET1
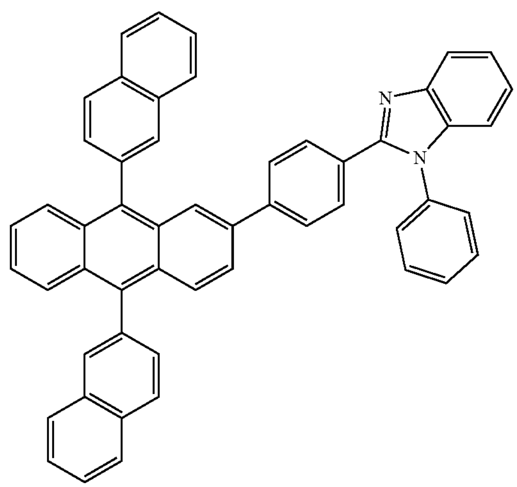
ET2
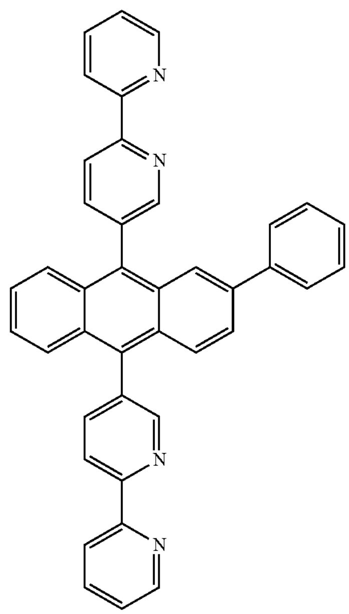
ET3
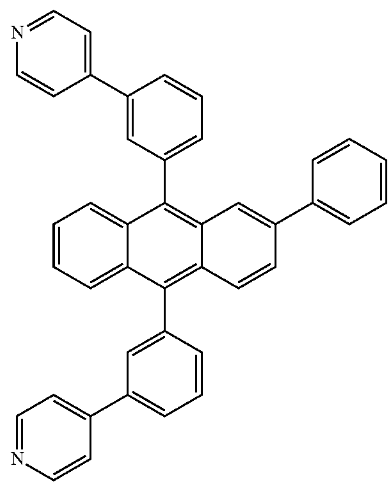
-continued
ET4
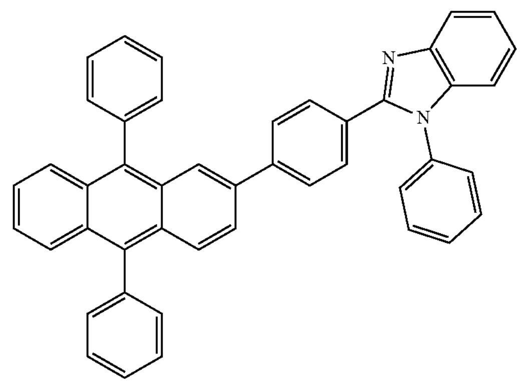
ET5
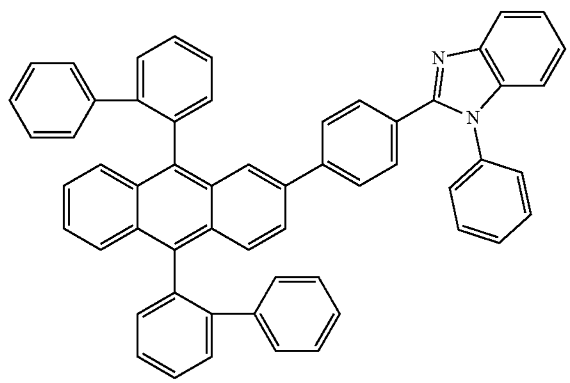
ET6
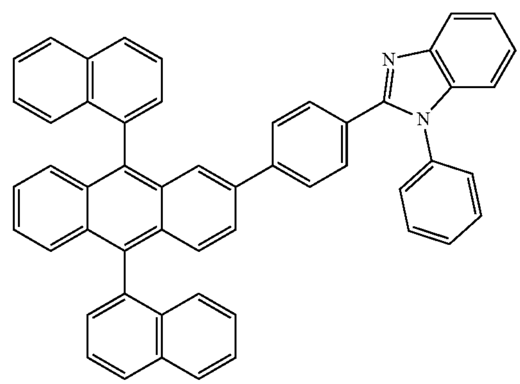

-continued
ET7
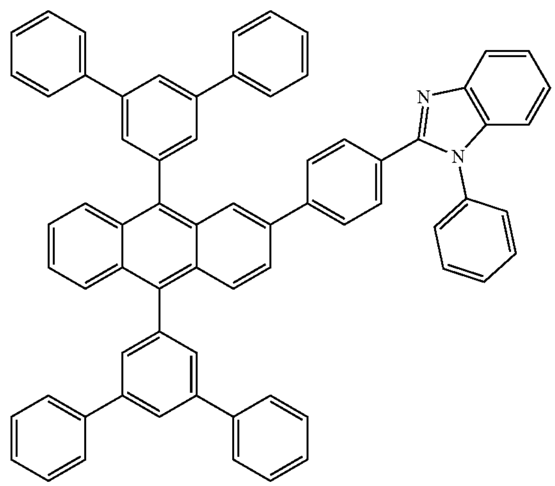
ET8
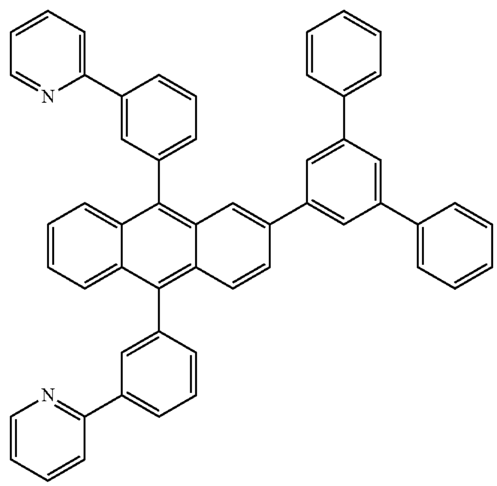
ET9
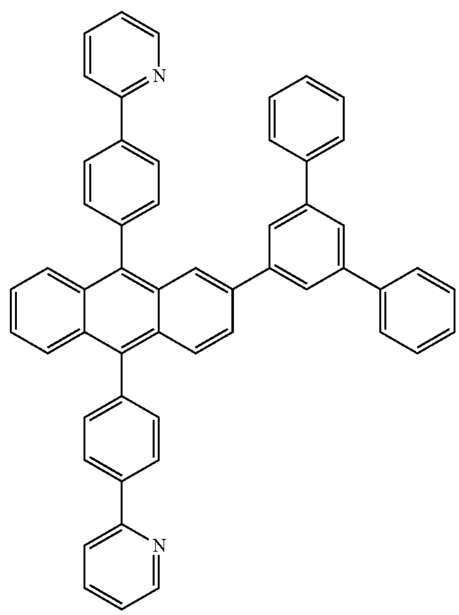
-continued
ET10
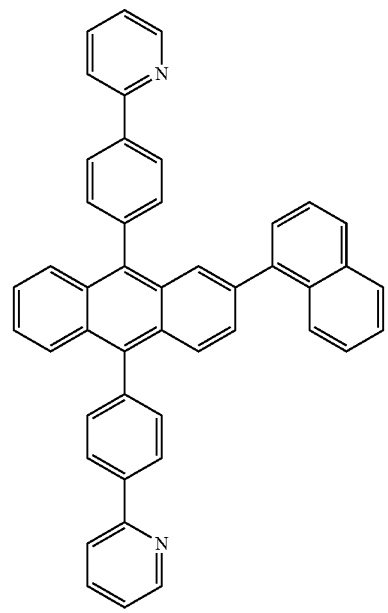
ET11
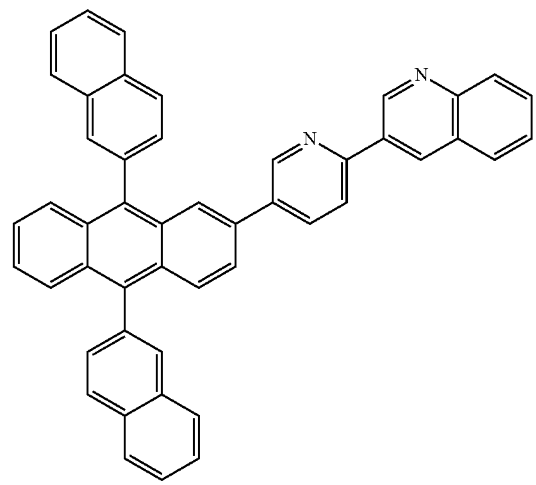
ET12
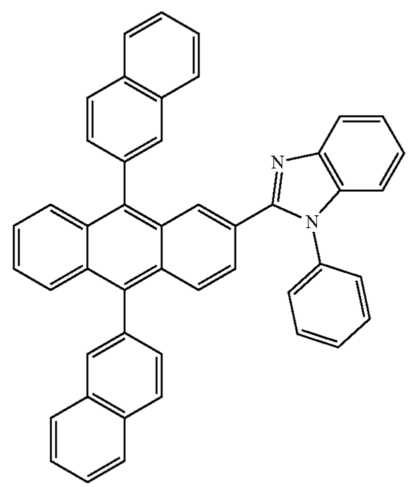

-continued
ET13
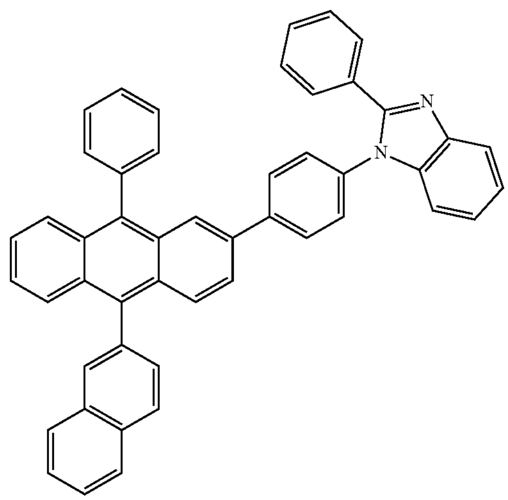
ET14
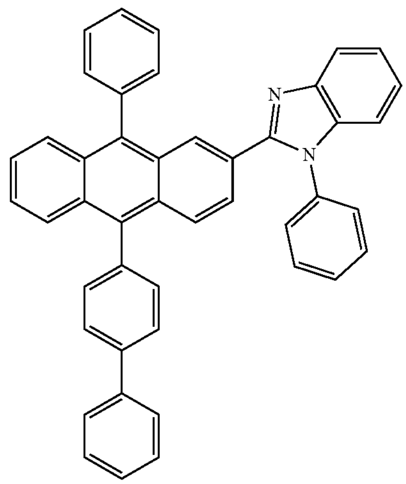
ET15
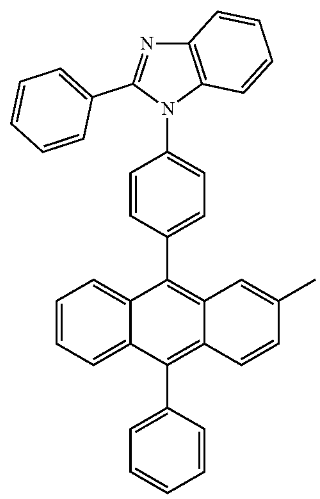
-continued
ET16
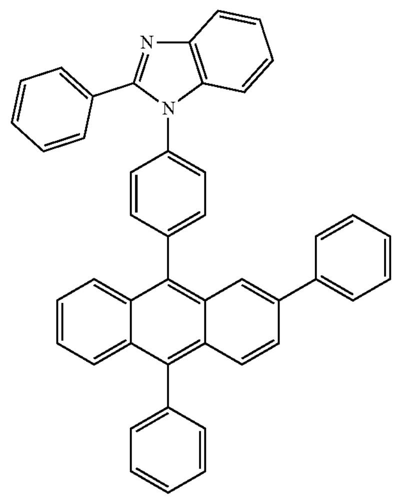
ET17
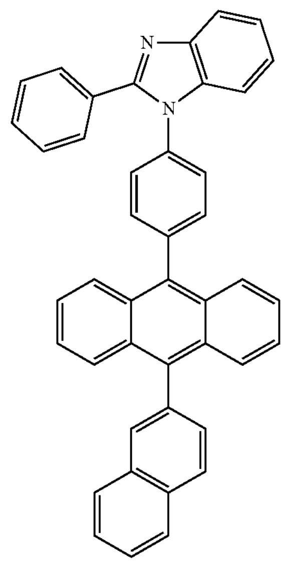
ET18
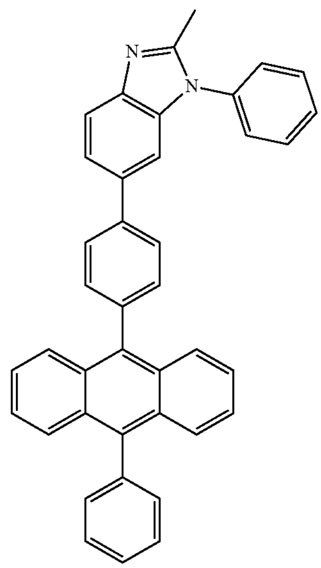

-continued
ET19
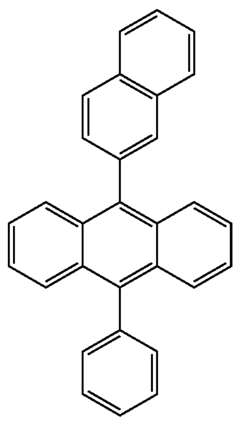
ET20
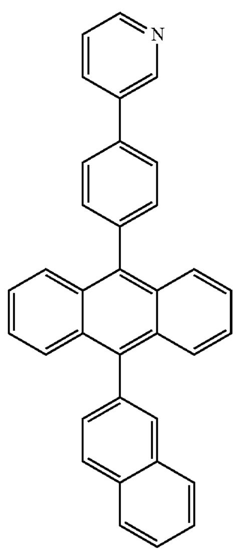
ET21
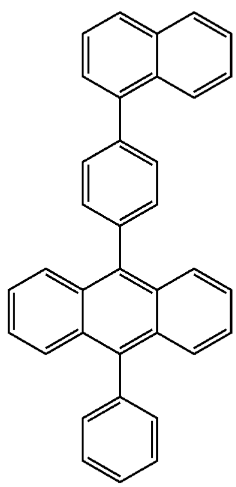
-continued
ET22
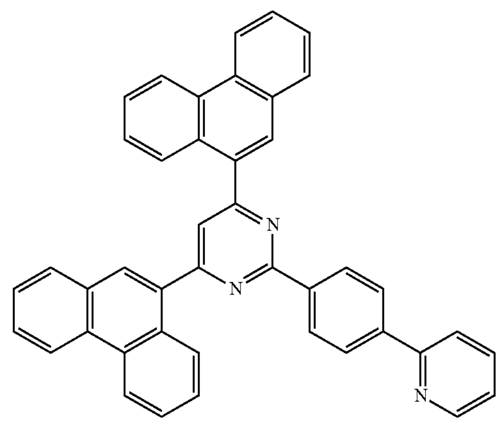
ET23
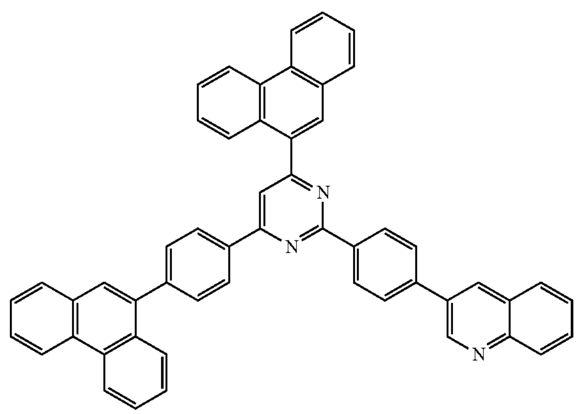
ET24
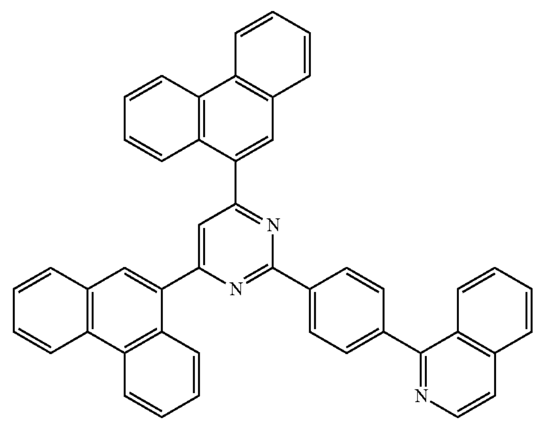

-continued
ET25
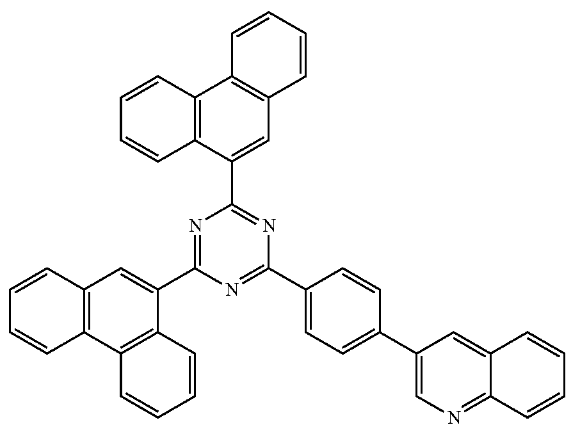
ET26
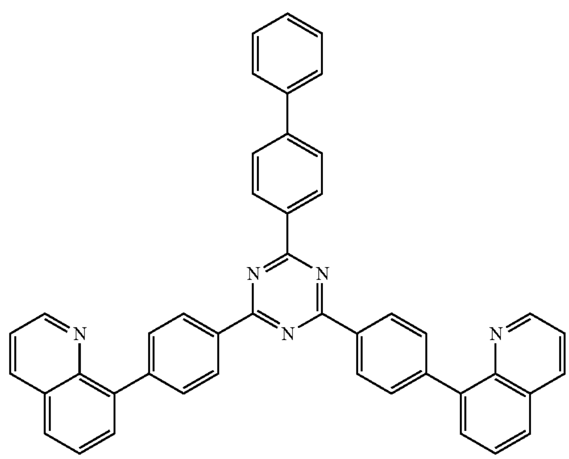
ET27
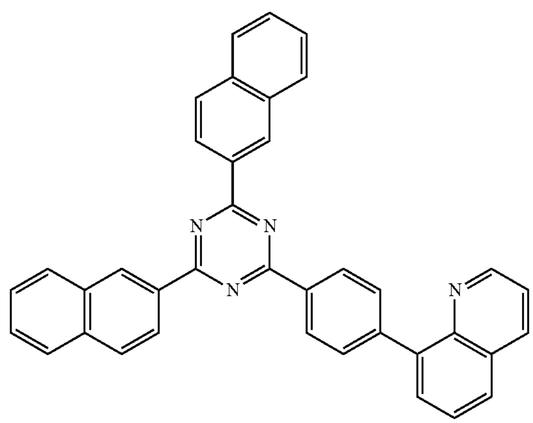
-continued
ET28
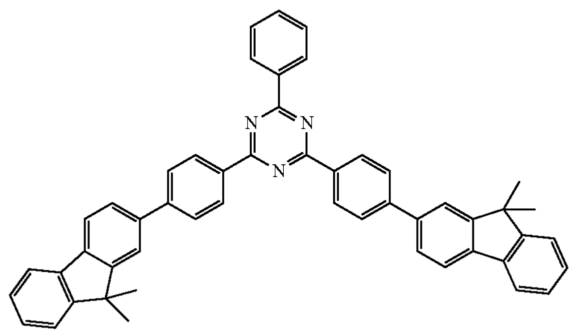
ET29
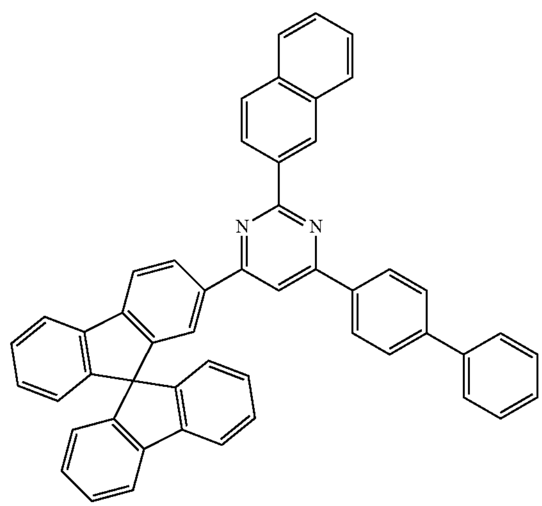
ET30
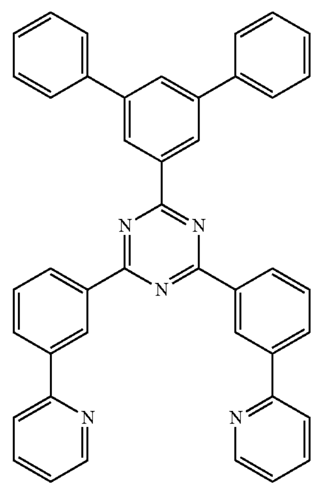

-continued

ET31

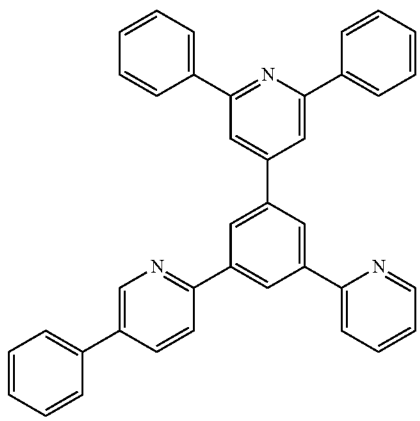

ET32

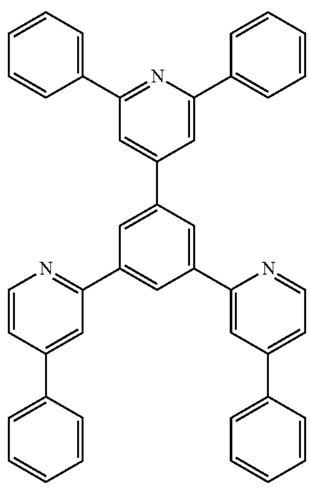

ET33

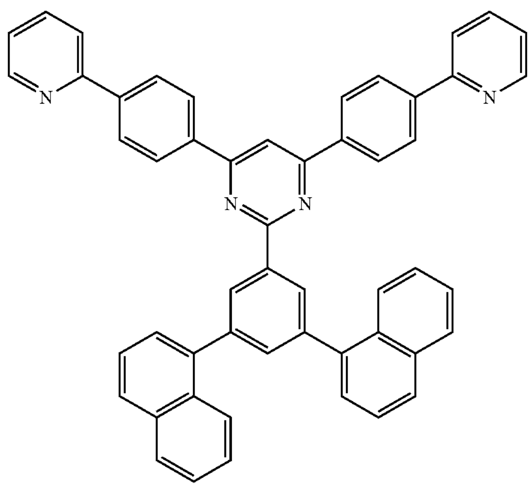

-continued

ET34

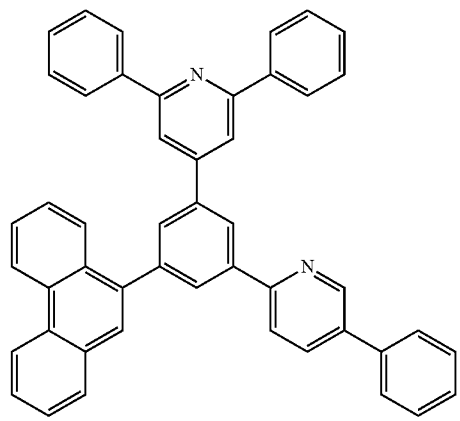

ET35

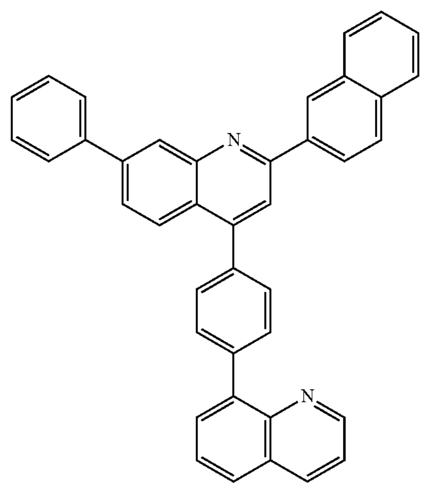

ET36

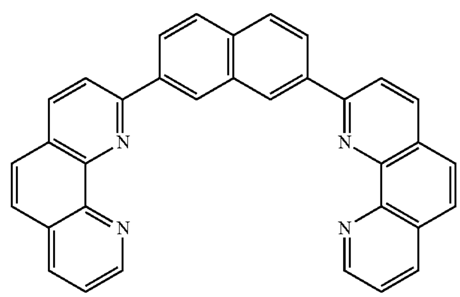

In some embodiments, the electron transport regions ETR may include a metal halide such as LiF, NaCl, CsF, RbCl, RbI, CuI, and/or KI; a lanthanide metal such as Yb; and/or a co-deposited material of the metal halide and the lanthanide metal. For example, the electron transport region ETR may include KI:Yb, RbI:Yb, etc. as a co-deposited material. The electron transport region ETR may be formed using a metal oxide such as $Li_2O$ and/or BaO, 8-hydroxyl-lithium quinolate (Liq), etc., but the embodiment of the present disclosure is not limited thereto. The electron transport region ETR may also be formed of a mixture material of an electron transport material and an insulating organometallic salt. The organometallic salt may be a material having an energy band gap of about 4 eV or more. The organometallic salt may include, for example, a metal acetate, a metal benzoate, a metal acetoacetate, a metal acetylacetonate, and/or a metal stearate.

The electron transport region ETR may further include at least one of 2,9-dimethyl-4,7-diphenyl-1,10-phenanthroline (BCP), and/or 4,7-diphenyl-1,10-phenanthroline (Bphen), in addition to the above-described materials, but the embodiment of the present disclosure is not limited thereto.

The electron transport region ETR may include the above-described compounds of the hole transport region in at least one of the electron injection layer EIL, the electron transport layer ETL, and/or the hole blocking layer HBL.

When the electron transport region ETR includes the electron transport layer ETL, the electron transport layer ETL may have a thickness of about 100 Å to about 1,000 Å, for example, about 150 Å to about 500 Å. If the thickness of the electron transport layer ETL satisfies any of the aforementioned ranges, satisfactory (or suitable) electron transport characteristics may be obtained without a substantial increase in a driving voltage. When the electron transport region ETR includes the electron injection layer EIL, the electron injection layer EIL may have a thickness of about 1 Å to about 100 Å, for example, about 3 Å to about 90 Å. If the thickness of the electron injection layer EIL satisfies any of the above-described ranges, satisfactory (or suitable) electron injection characteristics may be obtained without a substantial increase in a driving voltage.

The second electrode EL2 is provided on the electron transport region ETR.

The second electrode EL2 may be a common electrode. The second electrode EL2 may be a cathode or an anode, but the embodiment of the present disclosure is not limited thereto. For example, when the first electrode EU is an anode, the second electrode EL2 may be a cathode, and when the first electrode EL1 is a cathode, the second electrode EL2 may be an anode. The second electrode may include at least one selected from among Ag, Mg, Cu, Al, Pt, Pd, Au, Ni, Nd, Ir, Cr, Li, Ca, LiF, Mo, Ti, W, In, Sn, Zn, a compound of two or more selected from among these (e.g., a compound thereof), a mixture of two or more selected from among these (e.g., a mixture thereof), and an oxide thereof.

The second electrode EL2 may be a transmissive electrode, a transflective electrode, or a reflective electrode. When the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca (a stacked structure of LiF and Ca), LiF/Al (a stacked structure of LiF and Al), Mo, Ti, Yb, W, or a compound or mixture including these (e.g., AgMg, AgYb, and/or MgYb). In one or more embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

In one or more embodiments, the second electrode EL2 may be connected (e.g., physically and/or electrically coupled) with an auxiliary electrode. If the second electrode EL2 is connected with the auxiliary electrode, the resistance of the second electrode EL2 may be decreased.

A capping layer CPL may further be disposed on the second electrode EL2 of the light emitting element ED of one or more embodiments. The capping layer CPL may include a multilayer or a single layer.

In one or more embodiments, the capping layer CPL may be an organic layer or an inorganic layer. For example, when the capping layer CPL contains an inorganic material, the inorganic material may include an alkaline metal compound (for example, LiF), an alkaline earth metal compound (for example, $MgF_2$), SiON, $SiN_x$, SiOy, etc.

For example, when the capping layer CPL contains an organic material, the organic material may include 2,2'-dimethyl-N,N'-di-[(1-naphthyl)-N,N'-diphenyl]-1,1'-biphenyl-4,4'-diamine (α-NPD), NPB, TPD, m-MTDATA, Alq3, CuPc, N4,N4,N4',N4'-tetra(biphenyl-4-yl)biphenyl-4,4'-diamine (TPD15), 4,4',4"-tris(carbazol-9-yl)triphenylamine (TCTA), etc., and/or may include an epoxy resin, and/or an acrylate such as a methacrylate. However, the embodiment of the present disclosure is not limited thereto, and the capping layer CPL may include at least one selected from among Compounds P1 to P5 below:

P1

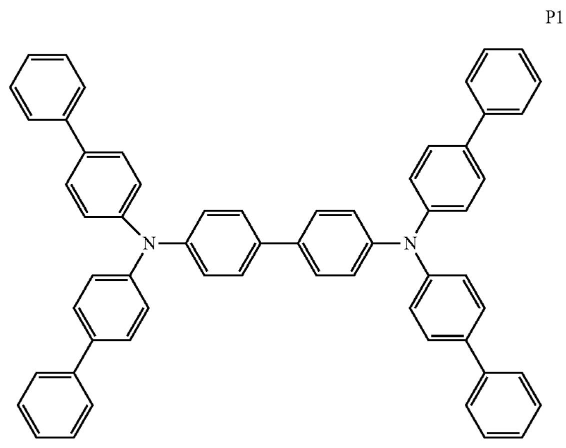

P2

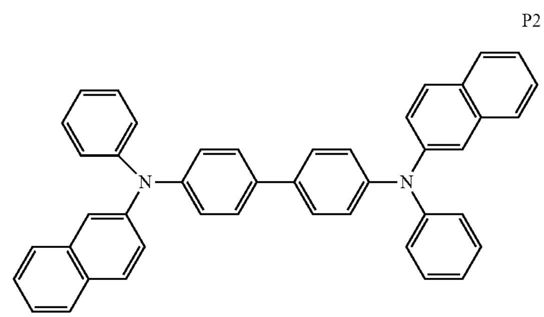

-continued

P3

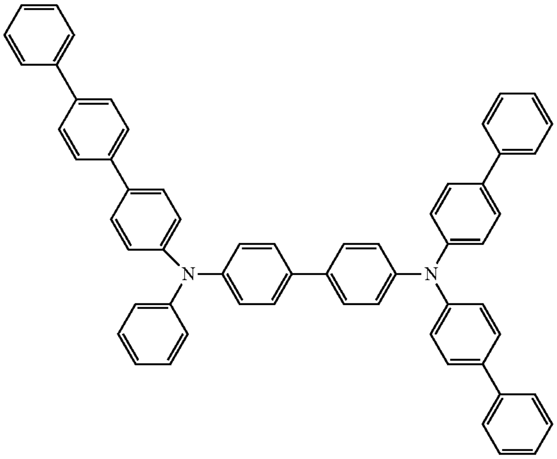

P4

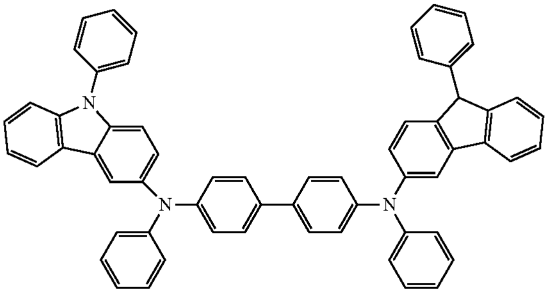

P5

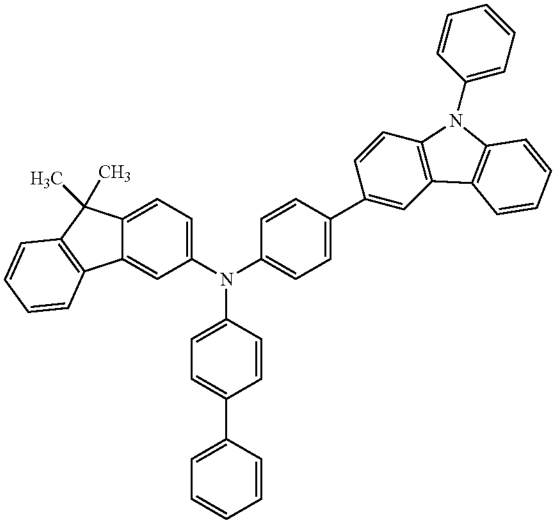

The refractive index of the capping layer CPL may be about 1.6 or more. For example, the refractive index of the capping layer CPL may be about 1.6 or more with respect to light in a wavelength range of about 550 nm to about 660 nm.

Figure 7:
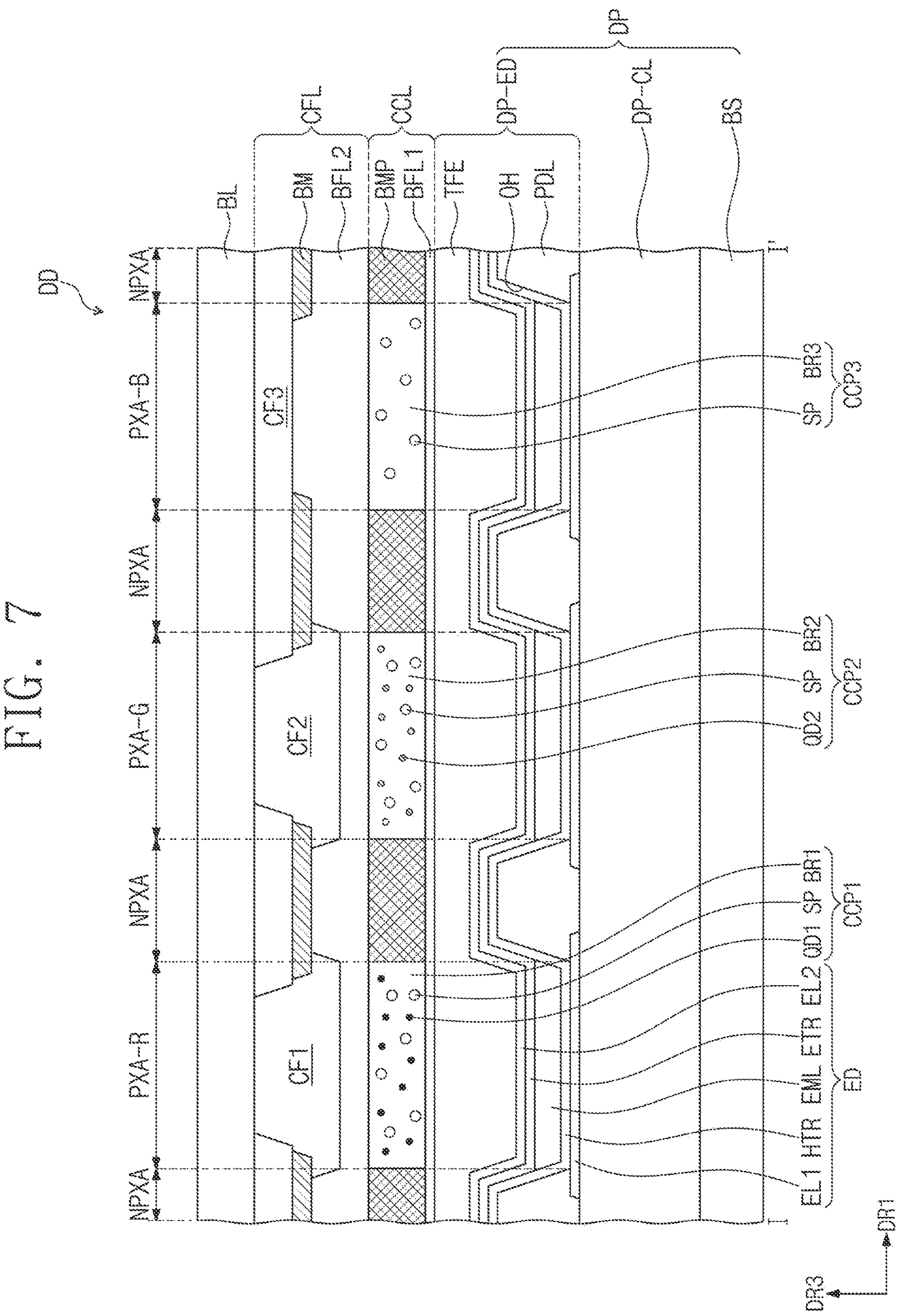
FIG. 7 is a cross-sectional view of a display device according to one or more embodiments of the present disclosure.
Figure 8:
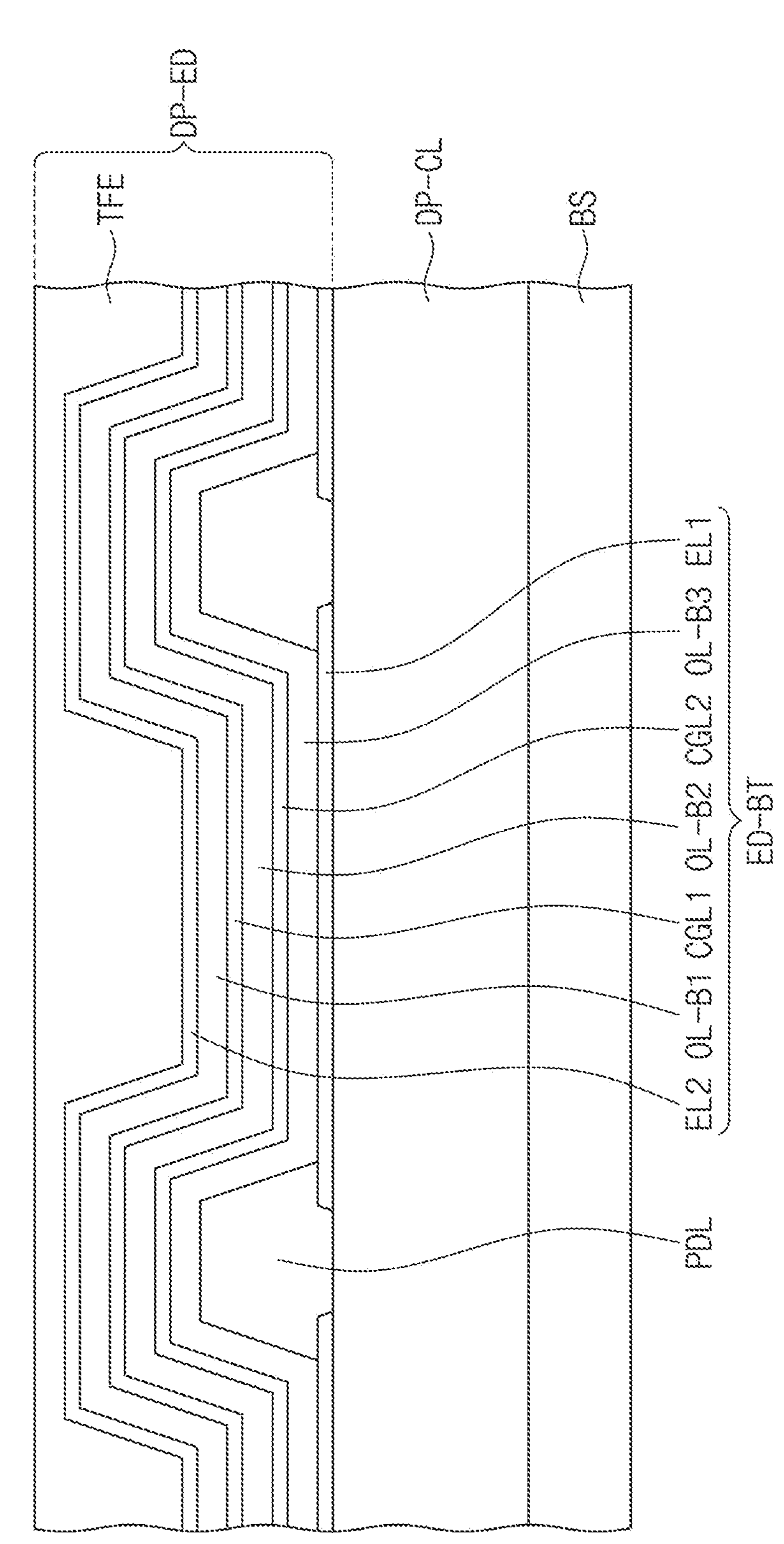
FIG. 8 is a cross-sectional view of a display device according to one or more embodiments of the present disclosure.

FIGS. 7 and 8 each are a cross-sectional view of a display device according to one or more embodiments. Hereinafter, in describing the display devices of embodiments with reference to FIGS. 7 and 8, the duplicated features which have been described in FIGS. 1 to 6 are not described again, but their differences will be mainly described.

Referring to FIG. 7, the display device DD according to one or more embodiments may include a display panel DP including a display element layer DP-ED, a light control layer CCL disposed on the display panel DP, and a color filter layer CFL.

In one or more embodiments illustrated in FIG. 7, the display panel DP may include a base layer BS, a circuit layer DP-CL provided on the base layer BS, and the display element layer DP-ED, and the display element layer DP-ED may include a light emitting element ED.

The light emitting element ED may include a first electrode EIJI, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The structures of the light emitting elements of FIGS. 3 to 6 as described above may be equally applied to the structure of the light emitting element ED shown in FIG. 7.

Referring to FIG. 7, the emission layer EML may be disposed in an opening OH defined in a pixel defining film PDL. For example, the emission layer EML which is divided by the pixel defining film PDL and provided corresponding to each light emitting regions PXA-R, PXA-G, and PXA-B, may emit light in the same wavelength range. In the display device DD of one or more embodiments, the emission layer EML may emit blue light. In one or more embodiments, the emission layer EML may be provided as a common layer in the entire light emitting regions PXA-R, PXA-G, and PXA-B.

At least one selected from among the emission layers EML provided corresponding to light emitting regions PXA-R, PXA-G, and PXA-B may include the polycyclic compound represented by Formula 1 of one or more embodiments as described above. At least one selected from among the emission layers EML provided corresponding to light emitting regions PXA-R, PXA-G, and PXA-B may include the polycyclic compound represented by Formula 1 of one or more embodiments as described above, and the remaining emission layers EML may include additional suitable fluorescence emitting materials, phosphorescence emitting materials, and/or quantum dots as described above. However, the embodiment of the present disclosure is not limited thereto.

The light control layer CCL may be disposed on the display panel DP. The light control layer CCL may include a light conversion body. The light conversion body may be a quantum dot, a phosphor, and/or the like. The light conversion body may emit provided light by converting the wavelength thereof. For example, the light control layer CCL may be a layer containing the quantum dot or a layer containing the phosphor.

The light control layer CCL may include a plurality of light control parts CCP1, CCP2 and CCP3. The light control parts CCP1, CCP2, and CCP3 may be spaced apart from one another.

Referring to FIG. 7, divided patterns BMP may be disposed between the light control parts CCP1, CCP2 and CCP3 which are spaced apart from each other, but the embodiment of the present disclosure is not limited thereto. FIG. 7 illustrates that the divided patterns BMP do not overlap the light control parts CCP1, CCP2 and CCP3, but in some embodiments, at least a portion of the edges of the light control parts CCP1, CCP2 and CCP3 may overlap the divided patterns BMP.

The light control layer CCL may include a first light control part CCP1 containing a first quantum dot QD1 which converts (or is configured to convert) first color light provided from the light emitting element ED into second color light, a second light control part CCP2 containing a second quantum dot QD2 which converts (or is configured to convert) the first color light into third color light, and a third light control part CCP3 which transmits (or is configured to transmit) the first color light.

In one or more embodiments, the first light control part CCP1 may provide red light that is the second color light, and the second light control part CCP2 may provide green light that is the third color light. The third light control part CCP3 may provide blue light by transmitting the blue light that is the first color light provided from the light emitting element ED. For example, the first quantum dot QD1 may be a red quantum dot, and the second quantum dot QD2 may be a green quantum dot. The same description as provided above in connection with the quantum dot may be applied with respect to the quantum dots QD1 and QD2.

In one or more embodiments, the light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include any quantum dot but may include the scatterer SP.

The scatterer SP may be inorganic particles. For example, the scatterer SP may include at least one of $TiO_2$, ZnO, $Al_2O_3$, $SiO_2$, and/or hollow silica. The scatterer SP may include any one of $TiO_2$, ZnO, $Al_2O_3$, $SiO_2$, and/or hollow silica, or may be a mixture of at least two materials selected from among $TiO_2$, ZnO, $Al_2O_3$, $SiO_2$, and hollow silica.

The first light control part CCP1, the second light control part CCP2, and the third light control part CCP3 each may include base resins BR1, BR2, and BR3 in which the quantum dots QD1 and QD2 and the scatterer SP are dispersed. In one or more embodiments, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 are media in which the quantum dots QD1 and QD2 and the scatterer SP are dispersed, and may be formed of various resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In one or more embodiments, the first base resin BR1, the second base resin BR2, and the third base resin BR3 each may be the same as or different from each other.

The light control layer CCL may include a barrier layer BFL1. The barrier layer BFL1 may serve to prevent or reduce the penetration of moisture and/or oxygen (hereinafter, referred to as 'moisture/oxygen'). The barrier layer BFL1 may be disposed on the light control parts CCP1, CCP2, and CCP3 to block or reduce the light control parts CCP1, CCP2 and CCP3 from being exposed to moisture/oxygen. In some embodiments, the barrier layer BFL1 may cover the light control parts CCP1, CCP2, and CCP3. For example, the barrier layer BFL2 may be provided between the light control parts CCP1, CCP2, and CCP3 and the color filter layer CFL.

The barrier layers BFL1 and BFL2 may include at least one inorganic layer. For example, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. In one or more embodiments, the barrier layers BFL1 and BFL2 may further include an organic film. The barrier layers BFL1 and BFL2 may be formed of a single layer or a plurality of layers.

In the display device DD of one or more embodiments, the color filter layer CFL may be disposed on the light control layer CCL. For example, the color filter layer CFL may be directly disposed on the light control layer CCL. In this case, the barrier layer BFL2 may be omitted.

The color filter layer CFL may include a light shielding part BM and color filters CF1, CF2, and CF3. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment or dye. The first filter CF1 may include a red pigment or dye, the second filter CF2 may include a green pigment or dye, and the third filter CF3 may include a blue pigment or dye. However, the embodiment of the present disclosure is not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

Furthermore, in one or more embodiments, the first filter CF1 and the second filter CF2 may be a yellow filter. The first filter CF1 and the second filter CF2 may not be separated, but may be provided as one filter.

The light shielding part BM may be a black matrix. The light shielding part BM may include an organic light shielding material or an inorganic light shielding material containing a black pigment or dye. The light shielding part BM may prevent or reduce light leakage, and may separate boundaries between the adjacent filters CF1, CF2, and CF3. In one or more embodiments, the light shielding part BM may be formed of a blue filter.

The first to third filters CF1, CF2, and CF3 may be disposed corresponding to the red light emitting region PXA-R, the green light emitting region PXA-G, and the blue light emitting region PXA-B, respectively.

A base substrate BL may be disposed on the color filter layer CFL. The base substrate BL may be a member which provides a base surface in which the color filter layer CFL, the light control layer CCL, and/or the like are disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer (e.g., including an organic material and an inorganic material). In one or more embodiments, the base substrate BL may be omitted.

FIG. 8 is a cross-sectional view illustrating a part of a display device according to one or more embodiments. FIG. 8 illustrates a cross-sectional view of a part corresponding to the display panel DP of FIG. 7. In the display device DD-TD of one or more embodiments, the light emitting element ED-BT may include a plurality of light emitting structures OL-B1, OL-B2, and OL-B3. The light emitting element ED-BT may include a first electrode EL1 and a second electrode EL2 which face each other, and the plurality of light emitting structures OL-B1, OL-B2, and OL-B3 sequentially stacked in the thickness direction between the first electrode EL1 and the second electrode EL2. The light emitting structures OL-B1, OL-B2, and OL-B3 each may include an emission layer EML (FIG. 7), and a hole transport region HTR and an electron transport region ETR disposed with the emission layer EML (FIG. 7) therebetween.

For example, the light emitting element ED-BT included in the display device DD-TD of one or more embodiments may be a light emitting element having a tandem structure and including a plurality of emission layers.

In one or more embodiments illustrated in FIG. 8, all light beams respectively emitted from the light emitting structures OL-B1, OL-B2, and OL-B3 may be blue light. However, the embodiment of the present disclosure is not limited thereto, and the light beams respectively emitted from the light emitting structures OL-B1, OL-B2, and OL-B3 may have wavelength ranges different from each other. For example, the light emitting element ED-BT including the plurality of light emitting structures OL-B1, OL-B2, and OL-B3, which emit light beams having wavelength ranges different from each other, may emit white light.

Charge generation layers CGL1 and CGL2 may be disposed between two of the neighboring light emitting structures OL-B1, OL-B2, and OL-B3. The charge generation layers CGL1 and CGL2 may include a p-type charge generation layer and/or an n-type charge generation layer.

At least one selected from among the light emitting structures OL-B1, OL-B2, and OL-B3 included in the display device DD-TD of one or more embodiments may contain the above-described polycyclic compound of one or more embodiments.

The light emitting element ED according to one or more embodiments of the present disclosure may include the above-described polycyclic compound of one or more embodiments in at least one functional layer disposed between the first electrode EL1 and the second electrode EL2, thereby exhibiting improved luminous efficiency characteristics. For example, the light emitting element ED according to one or more embodiments may include the above-described polycyclic compound of one or more embodiments in the emission layer EML, thereby exhibiting excellent luminous efficiency characteristics.

The above-described polycyclic compound of one or more embodiments includes, as a ring-forming heteroatom, B, N, and Se in a core part forming a condensed ring structure, thereby exhibiting an increased RISC rate in a molecule, and thus the polycyclic compound of one or more embodiments may exhibit delayed fluorescence characteristics. The polycyclic compound of one or more embodiments may be used in an emission layer material, thereby increasing efficiency of the light emitting element.

Hereinafter, with reference to Examples and Comparative Examples, a polycyclic compound according to one or more embodiments of the present disclosure and a light emitting element of one or more embodiments of the present disclosure will be described in more detail. However, Examples shown below are illustrated only for the understanding of the present disclosure, and the scope of the present disclosure is not limited thereto.

EXAMPLES

1. Synthesis of Polycyclic Compound

First, a synthetic method of a polycyclic compound according to the present embodiment will be described in more detail by illustrating a synthetic method of Compound 1 and Compound 66. However, the synthetic methods of the polycyclic compounds are provided as examples, but the synthetic method according to one or more embodiments of the present disclosure is not limited to Examples below.

Synthesis of Compound 1

Polycyclic Compound 1 according to an example may be synthesized by, for example, the steps shown in Reaction Scheme 1 below:

Reaction Scheme 1

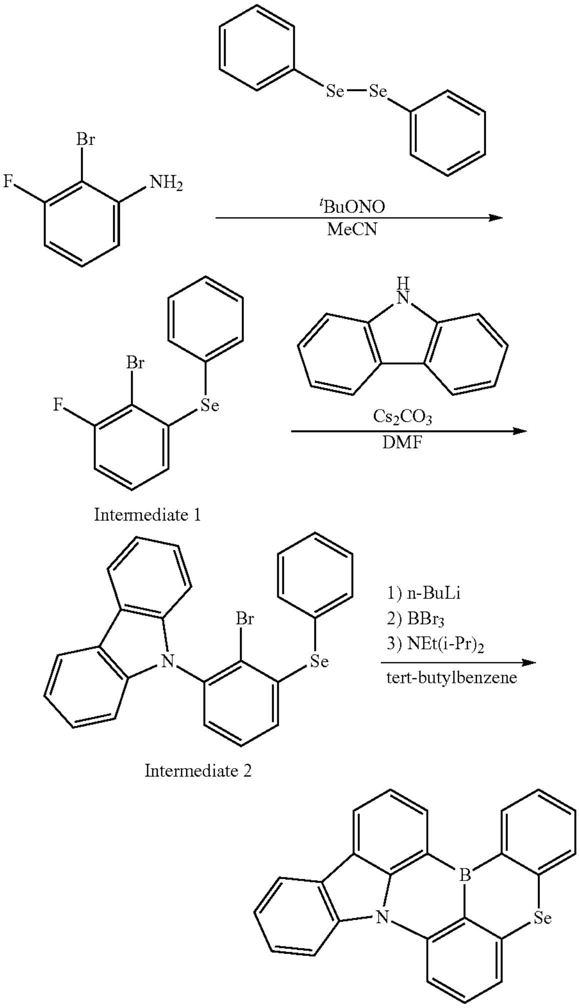

Intermediate 1

Intermediate 2

1

Synthesis of Intermediate 1

To a mixture of 2-bromo-3-fluoroaniline (9.00 g, 31.8 mmol), 1,2-diphenyldiselane (5.02 g, 63.6 mmol), and MeCN, $^{t}$BuONO (3.8 mL, 6.1 mmol) was slowly added at about 0° C. The resulting mixture was stirred at about 0° C. for about 1 hour, and then further stirred at room temperature for about 5 hours. Then, the reaction mixture was extracted with EtOAc and washed with water, and then dried over anhydrous $Na_2SO_4$. After filtration and evaporation, the crude product was purified by silica gel column chromatography (eluent: hexane). After the solvent was removed by evaporation, the resulting solid was dried under vacuum at room temperature for about 6 hours to obtain Intermediate 1 as a white solid (yield=8.61 g, 82%). The NMR spectrum value of Intermediate 1 is as follows:

$^1$H NMR (400 MHz, $CDCl_3$): δ 7.68-7.65 (m, 2H), 7.48-7.39 (m, 3H), 7.03 (td, J=8.1, 5.4 Hz, 1H), 6.91 (td, J=8.2, 1.4 Hz, 1H), 6.60 (dd, J=8.0, 1.0 Hz, 1H)

Synthesis of Intermediate 2

In an $N_2$ atmosphere, a mixture of Intermediate 1 (5.45 g, 16.5 mmol), 9H-carbazole (4.15 g, 24.8 mmol), and $Cs_2CO_3$ (10.8 g, 33.0 mmol) mixed in dry DMF (55 mL) was stirred at about 140° C. for about 12 hours. Then, the reaction mixture was cooled to room temperature, then extracted with toluene and water, and dried over anhydrous $Na_2SO_4$. Next, the reactant was filtered and evaporated, and then the crude product was recrystallized with $CHCl_3$/MeOH. After filtration, the resulting solid was dried under vacuum at about 60° C. for about 3 hours to obtain Intermediate 2 as a white solid (yield=6.46 g, 82%). The NMR spectrum value of Intermediate 2 is as follows:

$^1$H NMR (400 MHz, DMSO-d6): δ 8.26 (d, J=7.8 Hz, 2H), 7.80 (dd, J=7.5, 1.8 Hz, 2H), 7.61-7.55 (m, 3H), 7.53-7.41 (m, 4H), 7.32-7.28 (m, 2H), 7.04 (d, J=8.3 Hz, 2H), 6.97 (dd, J=7.5, 1.8 Hz, 1H)

Synthesis of Compound 1

Tert-butylbenzene (400 mL) and Intermediate 2 (6.20 g, 13.0 mmol) were added and stirred. To the stirred solution, n-BuLi (1.6 M in a hexane solvent, 8.94 mL, 14.3 mmol) was added dropwise at about −30° C. After the mixture was stirred at about −30° C. for about 1 hour, $BBr_3$ (1.50 mL, 15.6 mmol) was slowly added to the mixture at about 0° C., and then the resulting mixture was stirred at room temperature for about 2 hours. Next, $NEt(i-Pr)_2$ (4.48 mL, 26.0 mmol) was added thereto at about 0° C., and then the reaction mixture was further stirred at about 140° C. for about 12 hours. Then, the reaction mixture was cooled to room temperature, and then the reaction mixture was slowly quenched by adding water. The crude product was extracted with $CH_2Cl_2$, and the resulting organic layer was dried over anhydrous $Na_2SO_4$. After filtration and evaporation, the crude product was purified by silica gel column chromatography (eluent-hexane:$CH_2Cl_2$=4:1, v/v), and recrystallized with $CH_2Cl_2$/MeOH to obtain Compound 1 as a light yellow solid (yield=1.69 g, 32%). The NMR spectrum value of Compound 1 is as follows:

$^1$H NMR (400 MHz, DMSO-d6): δ 8.38 (d, J=8.5 Hz, 1H), 8.30 (dd, J=7.8, 1.0 Hz, 1H), 8.20 (td, J=7.8, 0.9 Hz, 2H), 7.92 (dd, J=7.0, 1.3 Hz, 1H), 7.63-7.58 (m, 2H), 7.56-7.51 (m, 2H), 7.45 (dd, J=7.5, 0.8 Hz, 1H), 7.41-7.33 (m, 2H), 7.18 (td, J=7.3, 1.3 Hz, 1H), 7.12 (td, J=7.4, 1.8 Hz, 1H)

Synthesis of Compound 66

Polycyclic Compound 66 according to an example may be synthesized by, for example, the steps shown in Reaction Scheme 2 below:

Reaction Scheme 2

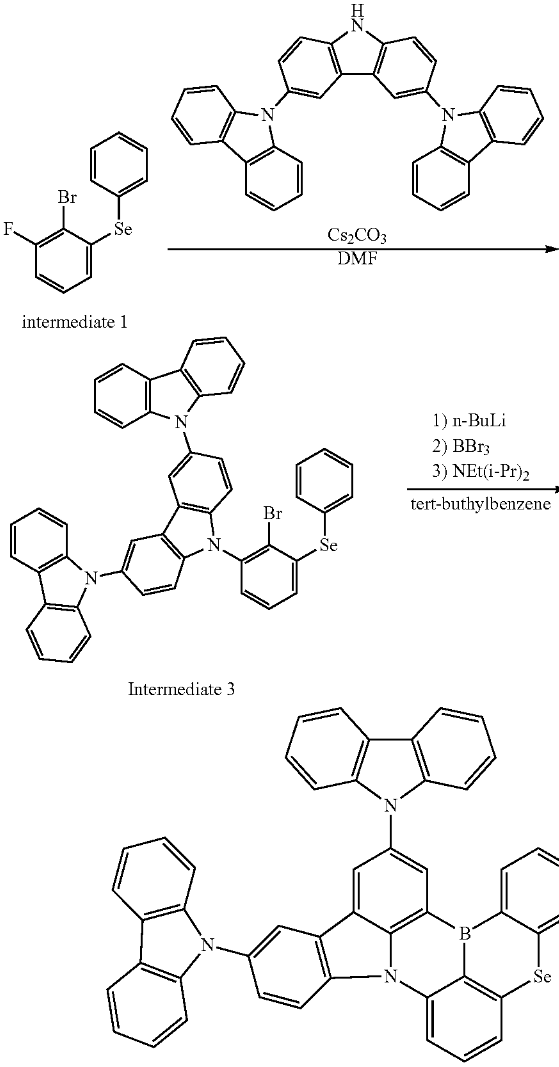

intermediate 1

Intermediate 3

66

Synthesis of Intermediate 3

In an N2 atmosphere, a mixture of Intermediate 1 (2.31 g, 70.0 mmol), 9'H-9,3':6'9"-tercarbazole (3.13 g, 63 mmol), and $Cs_2CO_3$ (4.56 g, 140.0 mmol) mixed in dry DMF (50 mL) was stirred at about 140° C. for about 12 hours. Then, the reaction mixture was cooled to room temperature, then extracted with $CHCl_3$ and water, and dried over anhydrous $Na_2SO_4$. Next, the reactant was filtered and evaporated, and then the crude product was recrystallized with $CHCl_3$/EtOAc. After filtration, the resulting solid was dried under vacuum at about 60° C. for about 3 hours to obtain Intermediate 3 as a white solid (yield=4.18 g, 74%). The NMR spectrum value of Intermediate 3 is as follows:

$^1$H NMR (400 MHz, $CDCl_3$): δ 8.29 (d, J=1.5 Hz, 2H), 8.17 (dd, J=7.8, 1.0 Hz, 4H), 7.83 (dd, J=7.5, 1.8 Hz, 2H), 7.62 (dd, J=8.8, 2.0 Hz, 2H), 7.56-7.52 (m, 2H), 7.46-7.38 (m, 11H), 7.36 (t, J=3.9 Hz, 2H), 7.31-7.27 (m, 4H), 7.02 (dd, J=8.0, 1.5 Hz, 1H).

Synthesis of Compound 66

Tert-butylbenzene (400 mL) and Intermediate 3 (2.26 g, 2.8 mmol) were added and stirred. To the stirred solution, n-BuLi (1.6 M in a hexane solvent, 1.94 mL, 3.1 mmol) was added dropwise at about −10° C. After the mixture was stirred at about −10° C. for about 1 hour, $BBr_3$ (0.33 mL, 3.4 mmol) was slowly added to the mixture at about 0° C., and then the resulting mixture was stirred at room temperature for about 2 hours. Next, $NEt(i\text{-}Pr)_2$ (0.97 mL, 5.6 mmol) was added thereto at room temperature, and then the reaction mixture was further stirred at about 140° C. for about 12 hours. Then, the reaction mixture was cooled to room temperature, and then the reaction mixture was slowly quenched by adding water. The crude product was extracted with $CH_2Cl_2$, and the resulting organic layer was dried over anhydrous $Na_2SO_4$. After filtration and evaporation, the crude product was purified by silica gel column chromatography (eluent-hexane:$CH_2Cl_2$=3:1, v/v), and recrystallized with $CH_2Cl_2$/MeOH to obtain Compound 66 as a orange solid (yield=1.80 g, 35%). The NMR spectrum value of Compound 66 is as follows:

$^1$H NMR (400 MHz, $CDCl_3$): δ 8.80 (d, J=2.0 Hz, 1H), 8.70 (d, J=8.8 Hz, 1H), 8.56-8.52 (m, 3H), 8.41 (d, J=2.0 Hz, 1H), 8.20 (t, J=8.2 Hz, 4H), 7.87 (dd, J=8.8, 2.0 Hz, 1H), 7.85-7.78 (m, 3H), 7.51-7.38 (m, 10H), 7.34-7.30 (m, 4H).

2. Characteristic Evaluation of Polycyclic Compound

The results of quantum chemistry calculations with respect to Example and Comparative Example Compounds are listed in Table 1 below. The calculation of the optimized energy state of each energy level, S1 and T1, of Example and Comparative Example Compounds was carried out by Gaussian 16 program package using PBE0/6-31G(d), and energy difference between S1 and T1 levels is indicated as $E_{S1-T1}$. For the evaluation of $<S_1|H_{SOC}|T_n>$, spin-orbit coupling (SOC) matrix element, the value of optimized structure of basis state was evaluated by ADF 2018 program package with PBE0/DZP according to Zeroth-Order Regular Approximation (ZORA) method. The relative rate constant, $k_{rel}$, between S1 and T1 was calculated from Equation 1 assuming room temperature (298K).

$$k_{rel}=(<S_1|H_{SOC}|T_1>)^2 \exp(-E_{S1/T1}/k_BT) \quad \text{Equation 1}$$

In Equation 1, kB represents the Boltzmann constant and T represents the absolute temperature.

TABLE 1

| Compound | S1 (eV) | T1 (eV) | $E_{S1-T1}$ (eV) | $<S_1|H_{SOC}|T_1>$ ($cm^{-1}$) | $<S_1|H_{SOC}|T_2>$ ($cm^{-1}$) | $k_{rel}$ |
|---|---|---|---|---|---|---|
| Example Compound 1 | 2.91 | 2.45 | 0.46 | 0.88 | 8.12 | $1.29 \times 10^{-8}$ |
| Example Compound 66 | 2.68 | 2.32 | 0.36 | 0.55 | 4.15 | $2.47 \times 10^{-7}$ |
| Comparative Example Compound X1 | 3.13 | 2.49 | 0.64 | 0.01 | 0.23 | $1.50 \times 10^{-15}$ |
| Comparative Example Compound X2 | 2.99 | 2.47 | 0.52 | 0.19 | 1.06 | $5.80 \times 10^{-11}$ |
| Comparative Example Compound X3 | 2.83 | 1.95 | 0.88 | 0.97 | 5.36 | $1.23 \times 10^{-15}$ |

The compounds used in Examples and Comparative Examples are as follows:

Example Compounds

1

66

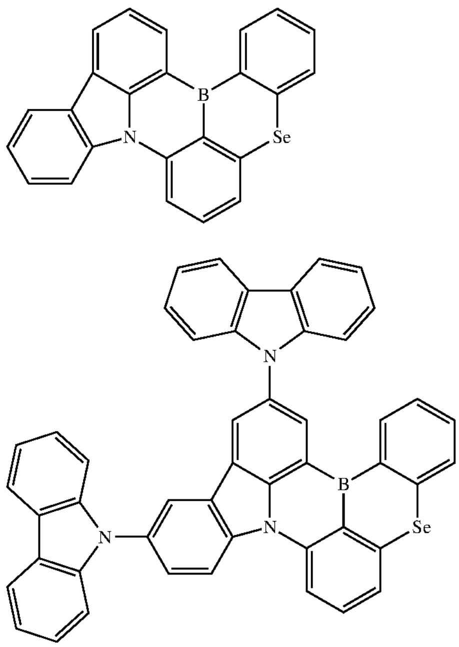

Comparative Example Compounds

X1

X2

X3

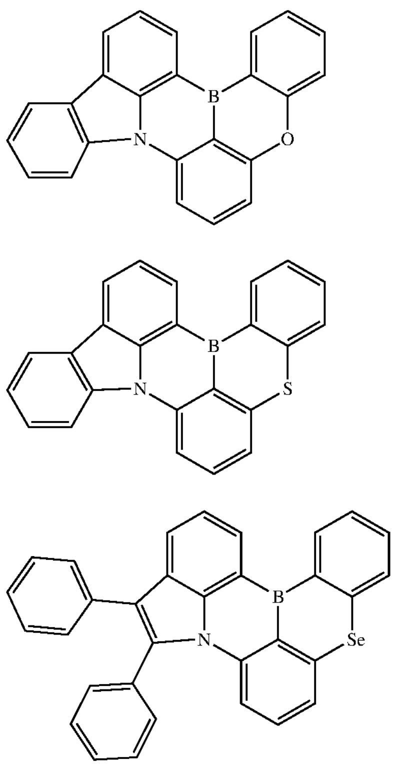

Equation 2 below shows a relational expression with respect to a rate constant ($k_{RISC}$) of RISC between energy levels in the TADF material.

$$k_{RISC} = \frac{2\pi}{\hbar} H_{SO}^{2} (4\pi\lambda_{RISC} k_B T)^{-1/2} \exp\left(\frac{-E_{a,RISC}}{k_B T}\right) \quad \text{Equation 2}$$

In Equation 2, $\hbar$ represents the Planck constant, $H_{SO}$ represents the size of SOC, which means the same as $\langle S_1|H_{SOC}|T_n\rangle$ shown in Table 1 of the quantum chemistry calculations as described above, and $\lambda$ is the reorientation energy, $k_B$ is Boltzmann constant, and T is the absolute temperature, where "n" is an integer greater than or equal to 0. In addition, $E_{a,RISC}$ in Equation 2 is the energy difference between each level, which means the same as $\Delta E_{S1\text{-}Tn}$ shown in the quantum chemistry calculations as described above.

When the results of the quantum chemistry calculations in Table 1 as described above is compared by corresponding to Equation 1 above, for $E_{S1\text{-}Tn}$ that is $E_{a,RISC}$, Example Compounds generally show values lower than Comparative Example Compounds, which illustrates that Example Compounds may make the RISC rate faster than Comparative Example Compounds. Meanwhile, for $\langle S_1|H_{SOC}|T_n\rangle$ that is $H_{SO}$, Example Compound 1, Example Compound 66, and Comparative Example Compound X3 show values higher than Comparative Example Compound X1 and Comparative Example Compound X2. As a heavy atom such as Se, corresponding to chalcogen in materials, is contained in these compounds, $H_{SO}$ shows a large value, and thus the compound containing Se may be predicted to further increase $k_{RISC}$. When Example Compounds are compared with Comparative Example Compounds based on $k_{rel}$ which is calculated from the above context, it may be seen that Example Compounds generally show $k_{rel}$ higher than Comparative Example Compounds. For example, Example Compounds include Se to show higher $k_{rel}$ compared to Comparative Example Compounds X1 and X2. Without being bound by any particular theory, it is believed that Comparative Example Compound X3 having a condensed structure different from those of Example Compounds shows larger value of SOC than Example Compounds, but the value of $E_{S1\text{-}T1}$ of Comparative Example Compound X3 becomes still larger than those of Example Compounds, and thus $k_{rel}$ is largely reduced. Therefore, it may be said that when compounds of the present disclosure have a condensed structure and contain Se as a ring-forming atom, the RISC rate becomes fast.

3. Evaluation of Fluorescence Characteristic of Polycyclic Compound

With respect to Examples and Comparative Example Compounds, the photoluminescence quantum yield (PLQY) and fluorescence lifetime were evaluated. Samples for evaluation of fluorescence characteristics were prepared by depositing, on a quartz substrate, a composition including Example and Comparative Example Compounds, respectively, for evaluation to form an organic film. Evaluation of the prepared samples were performed in an inert gas atmosphere. When preparing samples, Compound E-2-25 was used as a host material. In the prepared sample composition, an Example or Comparative Example Compound was contained to be about 1 wt % based on the total weight of the composition.

The fluorescence luminous characteristics were evaluated by measuring fluorescence emission spectra using a V-670 spectrophotometer from JASCO. The PLQY was determined by using a JASCO ILF-835 integrating sphere system using the same samples. The fluorescence lifetime was evaluated by Hamamatsu Photonics Quantaurus Tau spectrometer using the same samples, and evaluated with Tau delay (νsec) of delayed fluorescence.

The evaluation results of photoluminescence spectrum ($PL\lambda_{max}$), PLQY, and Tau delay of Example and Comparative Example Compounds are listed in Table 2.

TABLE 2

| Compound | $PL\lambda_{max}$ (nm) | PLQY (%) | Tau delay/μsec |
|---|---|---|---|
| Example Compound 1 | 479 | 98 | 14 |
| Example Compound 66 | 505 | 97 | 11 |
| Comparative Example Compound X1 | 448 | 99 | 120 |
| Comparative Example Compound X2 | 472 | 96 | 33 |

Referring to the results of Table 2, it may be confirmed that Example Compounds emit light corresponding to a wavelength range having the maximum emission wavelength of about 650 nm or less. In addition, it may be confirmed that Example Compounds exhibit fluorescence efficiency of 90% or greater to exhibit good luminous efficiency characteristics. In addition, Example Compounds exhibit shorter delay time compared to Comparative Example Compounds, and thus it may be predicted that delayed fluorescence efficiency of Example Compounds is more increased compared to Comparative Example Compounds.

In addition, $k_{RISC}$ in Equation 2 as described above and tau delay which is delayed fluorescence lifetime have a relation of $k_{RISC} \propto 1/\text{tau delay}$, and thus it may be predicted that Example Compounds having large $k_{RISC}$ values have shortened tau delay compared to Comparative Example Compounds. From the results shown in Table 2, it is believed that for the actually measured tau delay obtained by light-emitting characteristic evaluation, Example Compounds show tau delay shorter than Comparative Example Compounds as predicted from the calculation results of Equation 2 and Table 1. It may be confirmed that this actual measurement result corresponds to the theoretical effect deduced from the relations of Equation 2, etc.

4. Manufacture and Evaluation of Light Emitting Element

An evaluation of the light emitting element of one or more embodiments including the compound of one or more embodiments in the emission layer was carried out as follows. The method for manufacturing the luminescence device for the evaluation of the device is described below.

Example Compounds 1 and 66 as described above were used as a dopant material of the emission layer to manufacture the light emitting elements of Examples 1 and 2, respectively. Comparative Examples 1 and 2 are the light emitting elements manufactured by using Comparative Example Compounds X1 and X2 as a dopant material of the emission layer, respectively.

Manufacture of Light Emitting Element

The light emitting elements of Examples and Comparative Examples were manufactured as follows. An ITO was patterned on a glass substrate to a thickness of about 500 Å to form a first electrode. Then, HAT-CN was deposited to a thickness of about 100 Å to form a hole injection layer, TAPC was deposited to a thickness of about 400 Å to form a hole transport layer, and a 50 Å-thick electron blocking layer was formed with CCP. Next, when forming an emission layer, a respective Example Compound and Compound E-2-25 in Examples were co-deposited in a ratio of 1:99 to form a 150 Å-thick layer, and a respective Comparative Example Compound and Compound E-2-25 in Comparative Examples were co-deposited in a ratio of 1:99 to form a 150 Å-thick layer.

Then, a 50 Å-thick layer was formed on the emission layer by using PPF, a 400 Å-thick layer was formed with B3PyPB, and a 10 Å-thick layer was formed with Liq to form an electron transport region. Next, a second electrode having a thickness of about 1,000 Å was formed with aluminum (Al).

Compounds of each functional layer used in the manufacture of the light emitting elements are as follows.

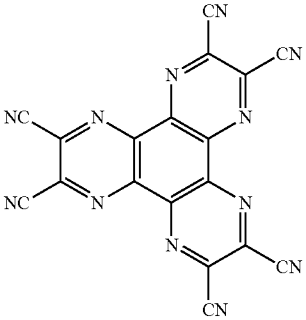

HAT-CN

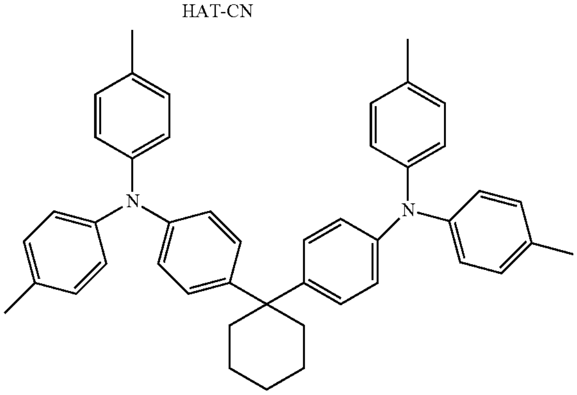

TAPC

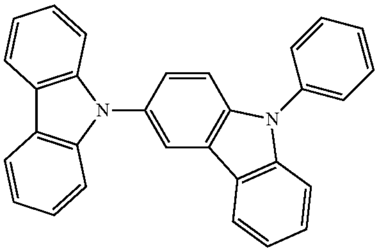

CCP

-continued

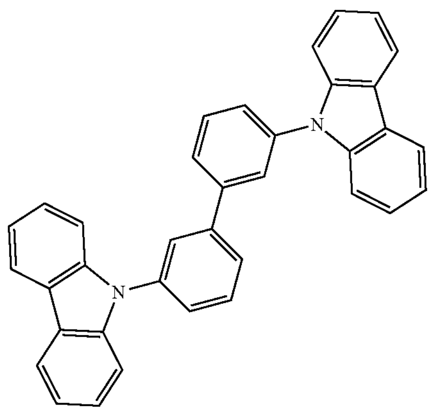

E-2-25

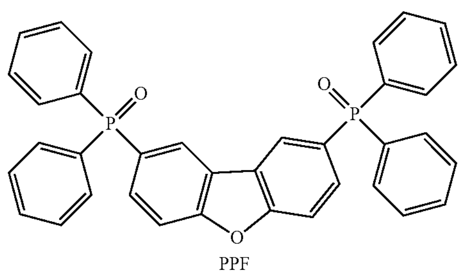

PPF

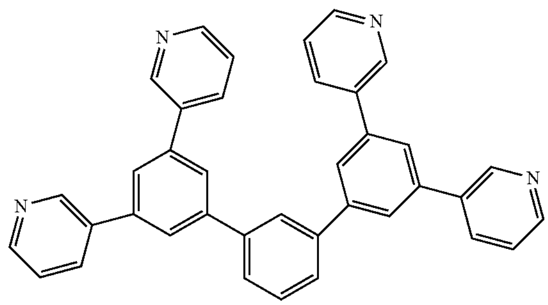

B3PyPB

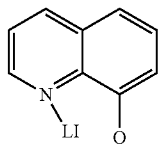

Liq

Evaluation of Organic Electroluminescence Element Characteristics

The evaluation results of the light emitting elements of Examples and Comparative Examples are listed in Table 3. The maximum emission wavelength ($\lambda_{max}$), the maximum external quantum efficiency (ηext), and the maximum external quantum efficiency at 1,000 cd/$m^2$ (ηext, 1,000 cd/$m^2$) in the manufactured light emitting elements are listed in comparison in Table 3. In addition, the reduction rate from the maximum external quantum efficiency (ηext) to the maximum external quantum efficiency at 1,000 cd/$m^2$ (ηext, 1,000 cd/$m^2$) was represented as roll-off rate. In the evaluation results of characteristics of Examples and Comparative Examples, the maximum emission wavelength ($\lambda_{max}$) represents the wavelength showing the maximum value in the emission spectrum.

TABLE 3

| Element manufacturing examples | Dopant Material | $\lambda_{max}$ (nm) | ηext (%) | ηext, 1000 cd/$m^2$ (%) | Roll-off rate (%) |
|---|---|---|---|---|---|
| Example 1 | Example Compound 1 | 480 | 21.8 | 15.4 | 29 |
| Example 2 | Example Compound 66 | 501 | 23.9 | 17.8 | 26 |
| Comparative Example 1 | Comparative Example Compound X1 | 451 | 12.0 | 2.7 | 78 |
| Comparative Example 2 | Comparative Example Compound X2 | 474 | 20.3 | 10.7 | 47 |

Referring to the results of Table 3, it may be seen that the light emitting elements of Examples emit light in a wavelength region of about 650 nm or less and exhibit high luminous efficiency characteristics. It may be seen that Examples show external quantum efficiencies higher than Comparative Examples. In addition, it may be seen that Examples show maximum external quantum efficiencies at 1,000 cd/$m^2$ higher than Comparative Examples, thereby exhibiting lower roll-off rates.

The polycyclic compound of an example may include a Se atom and a condensed ring, as a core part, in which seven rings are condensed, to thus make RISC easily (or suitably) occur, thereby exhibiting excellent (or improved) luminous efficiency. The light emitting element of an example may include the polycyclic compound of an example in the emission layer to exhibit high luminous efficiency in a deep blue emission wavelength region.

As shown by the results in Table 2, when Example Compound having a short tau delay is included in the light emitting element, the external quantum yield of the light emitting element under high brightness is improved. It may be confirmed that Example Compounds show higher external quantum yield at 1,000 cd/$m^2$ than Comparative Example Compounds, and also show high values in the maximum external quantum yield.

For example, because the polycyclic compound of the present embodiments contains, as a heteroatom, Se having a relatively large atomic weight, when the polycyclic compound is used as a material of the light emitting element, the light emitting element have high efficiency luminous characteristics.

The light emitting element of one or more embodiments may include the polycyclic compound of one or more embodiments, thereby exhibiting high efficiency characteristics.

The polycyclic compound of one or more embodiments may be used as a luminescent material for implementing a highly efficient (or suitable) light emitting element.

Although the present disclosure has been described with reference to embodiments of the present disclosure, it will be understood that the present disclosure should not be limited to these disclosed embodiments but various changes and modifications can be made by those skilled in the art without departing from the spirit and scope of the present disclosure. Accordingly, the technical scope of the present disclosure is not intended to be limited to the contents set forth in the detailed description of the specification, but is intended to be defined by the appended claims and their equivalents.

What is claimed is:

1. A polycyclic compound selected from the group consisting of polycyclic compounds of Compound Group 1:

Compound Group 1
1
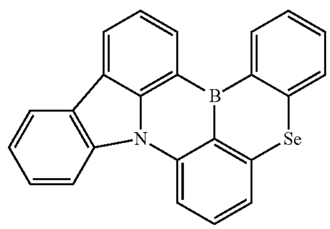
2
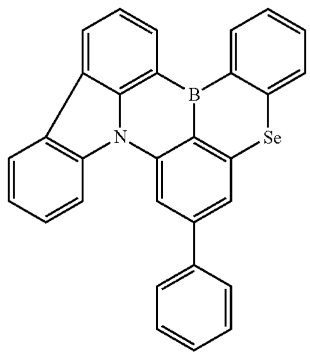
3
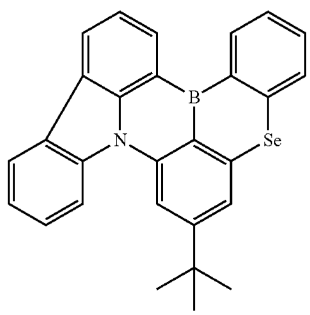
4
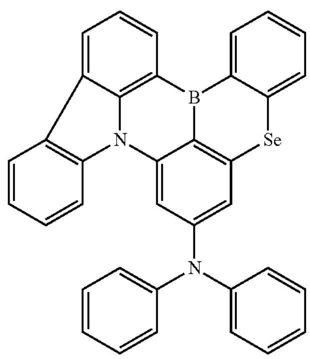
1-D
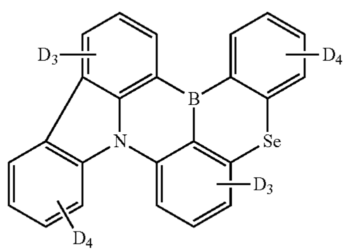
-continued
2-D
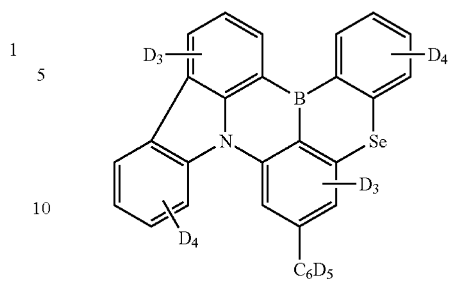
3-D
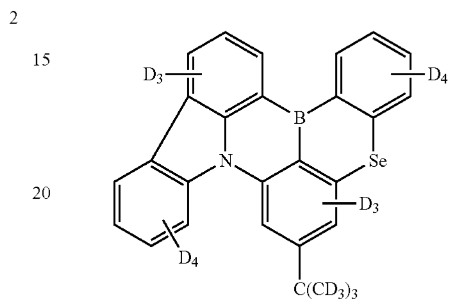
4-D
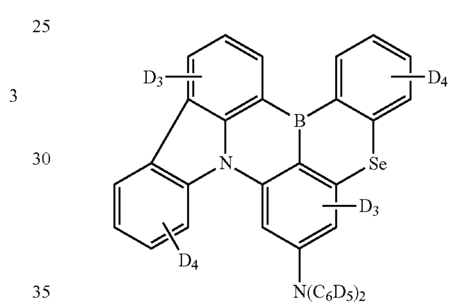
5
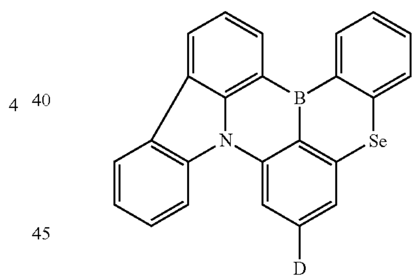
6
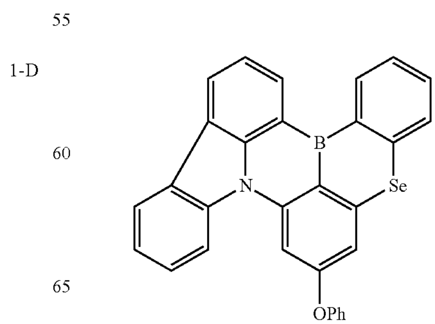

7
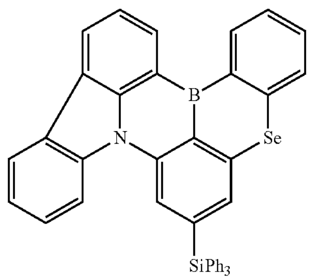
8
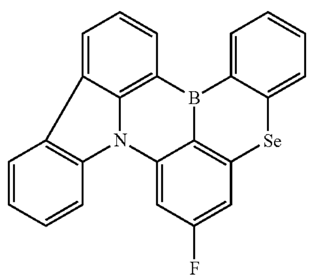
9
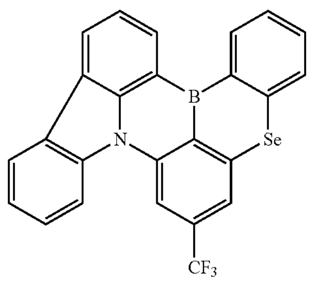
10
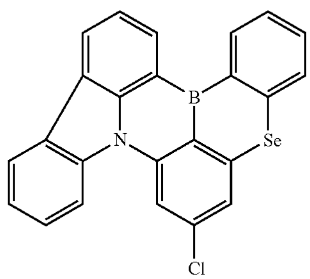
11
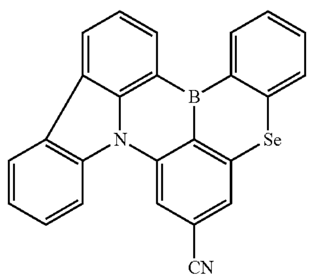
12
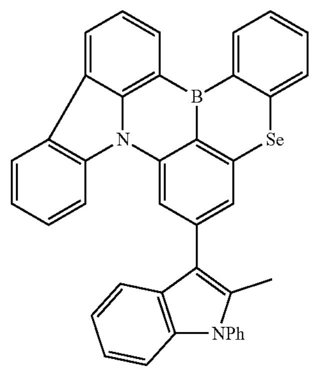
13
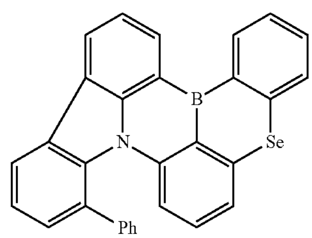
14
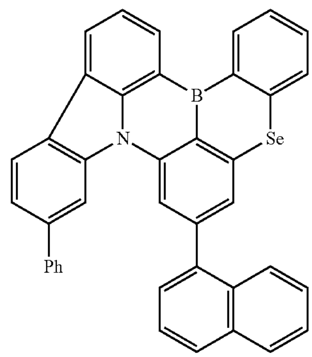
15
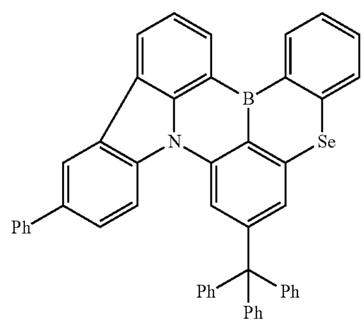

-continued
16
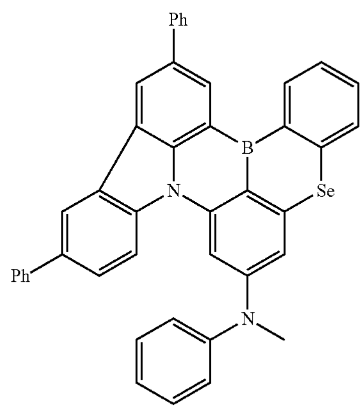
17
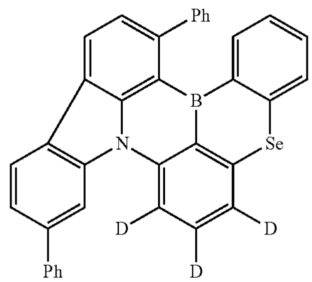
18
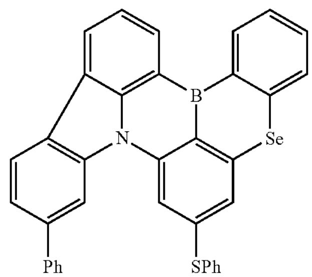
19
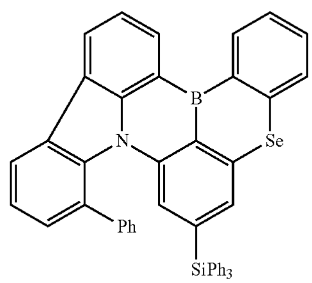
20
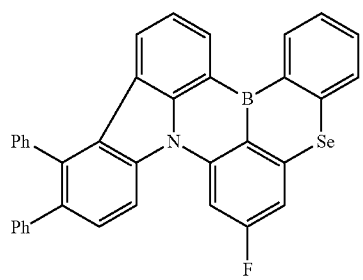
-continued
21
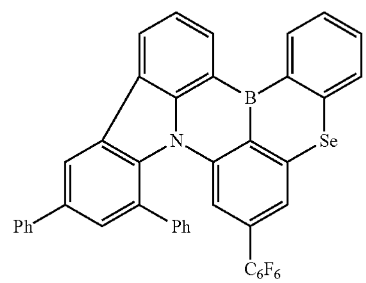
22
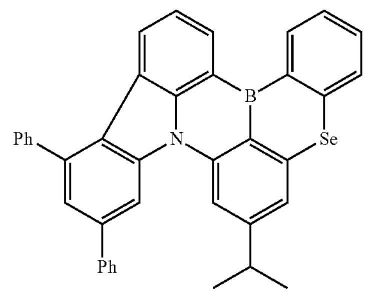
23
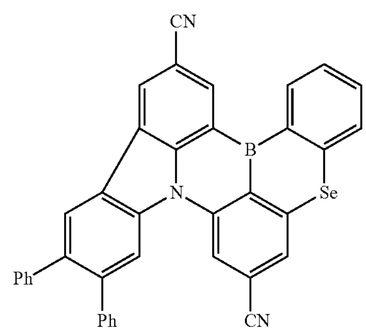
24
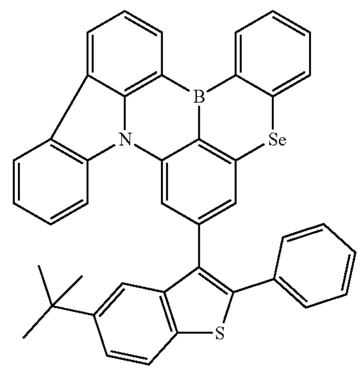
25
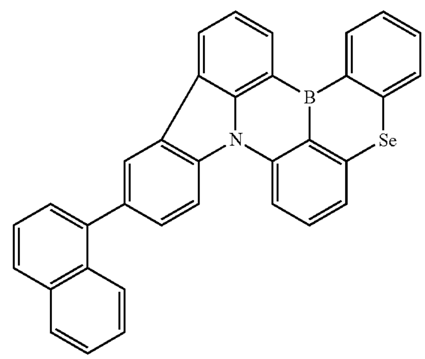

-continued
26
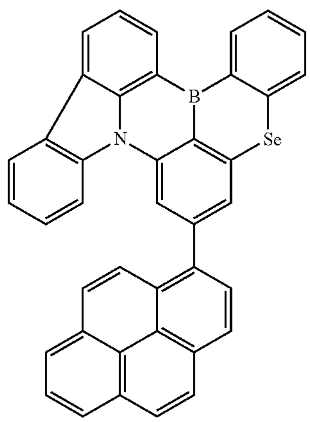
27
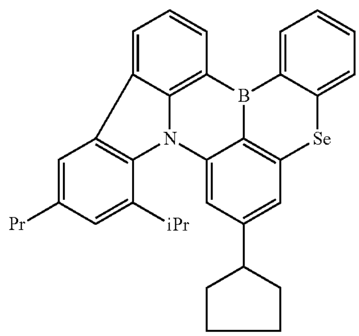
28
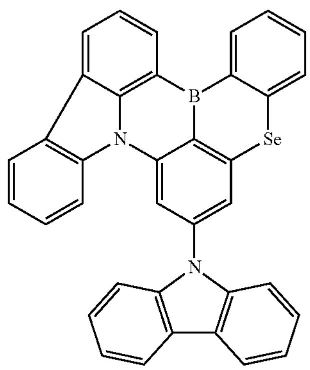
29
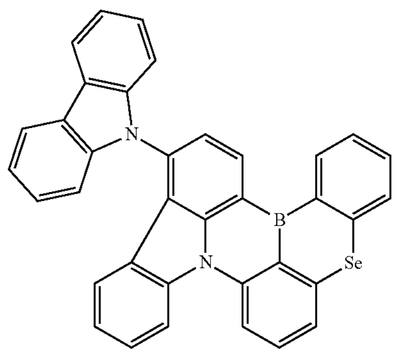
-continued
30
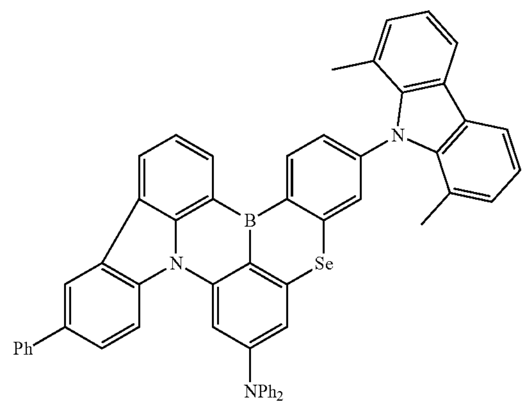
31
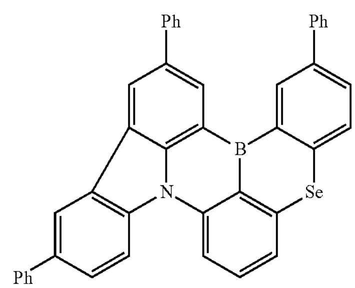
32
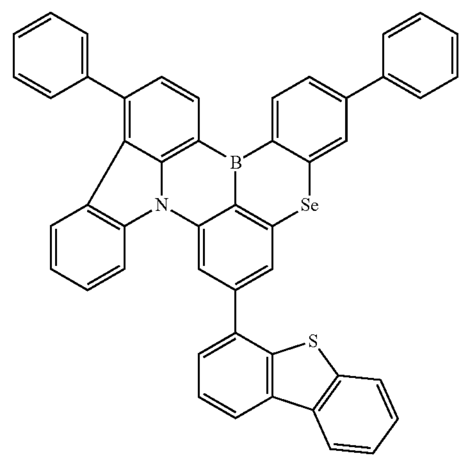
33
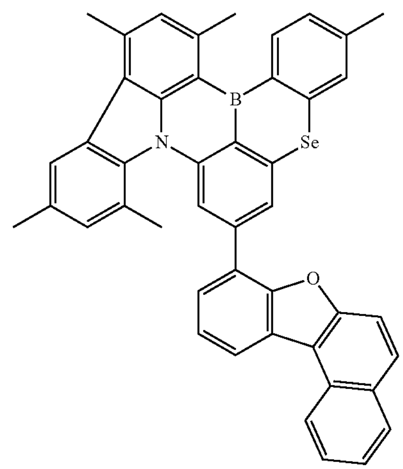

-continued
34
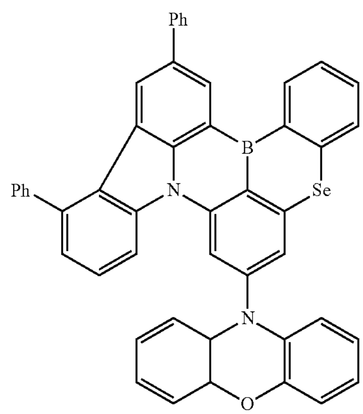
35
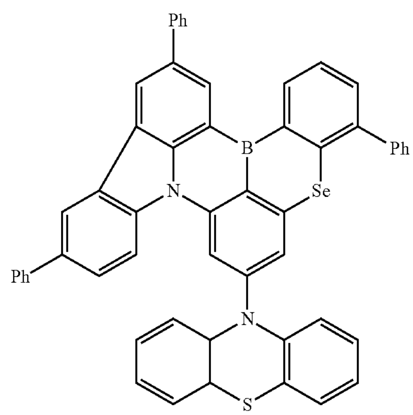
36
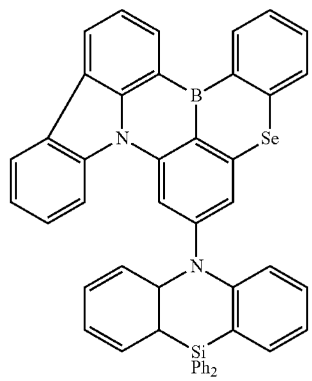
37
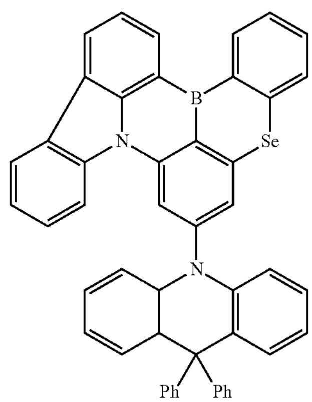
-continued
38
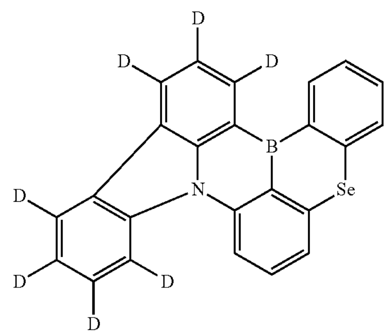
39
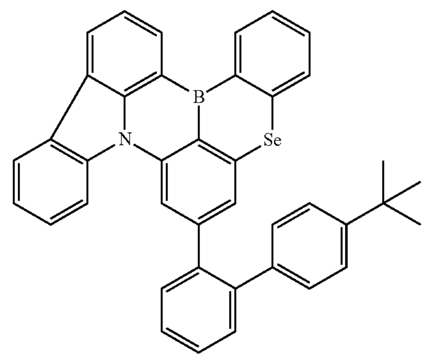
40
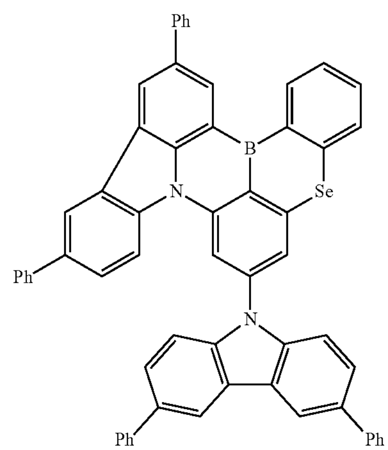
41
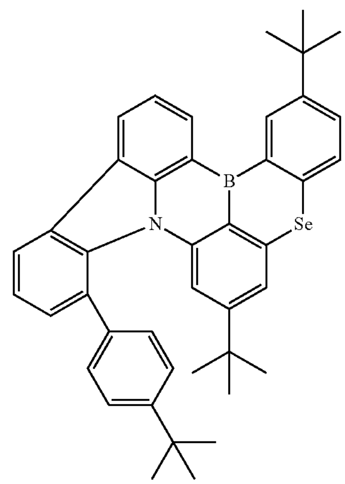

-continued
42
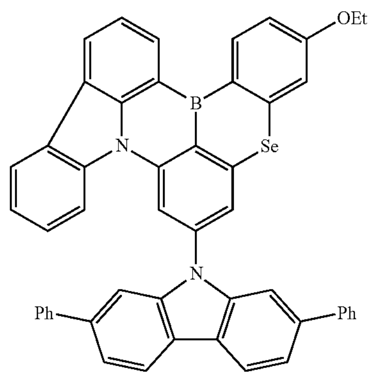
43
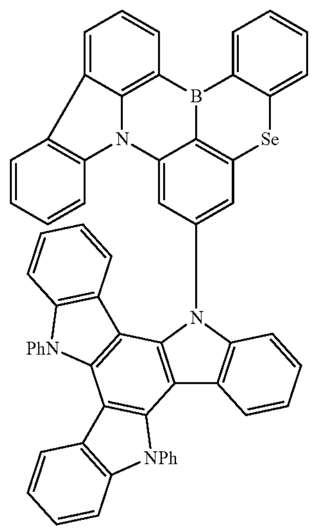
44
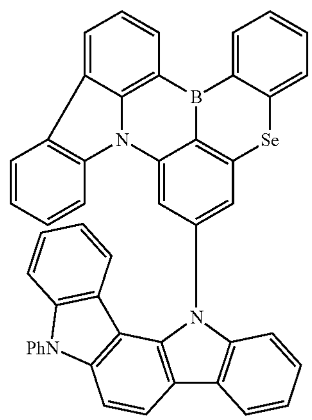
-continued
45
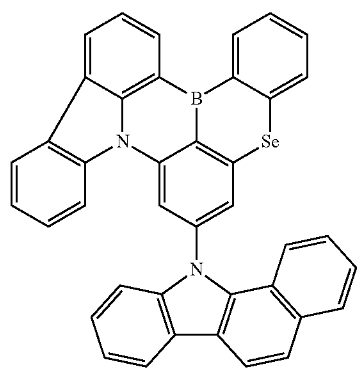
46
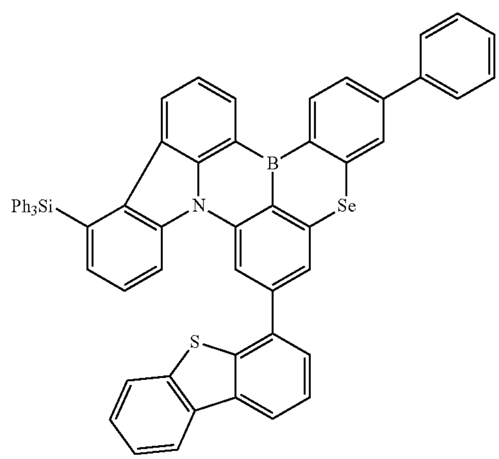
47
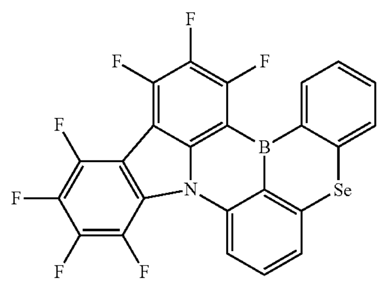
48
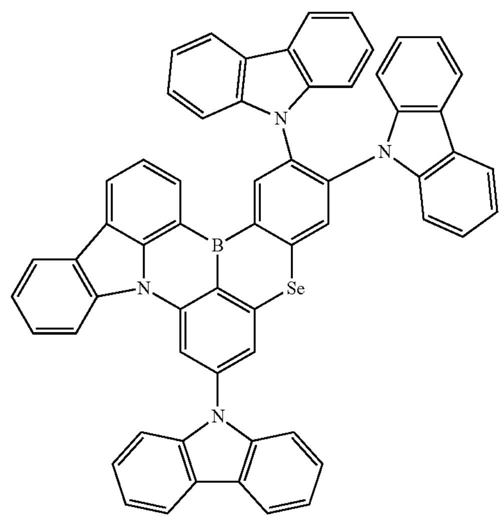

49
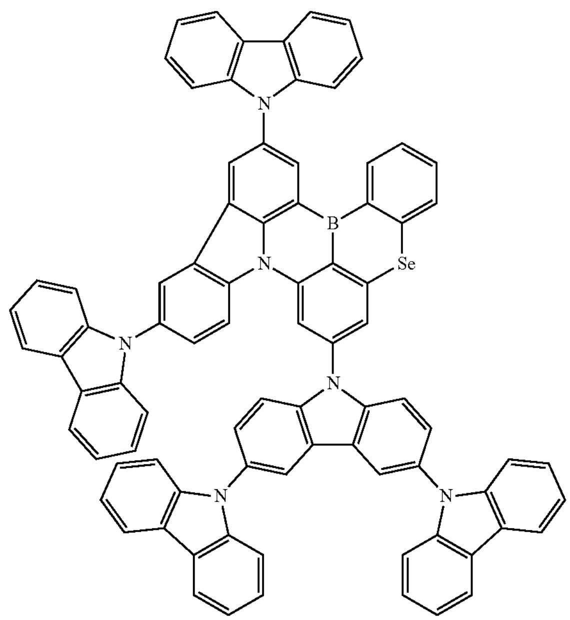
50
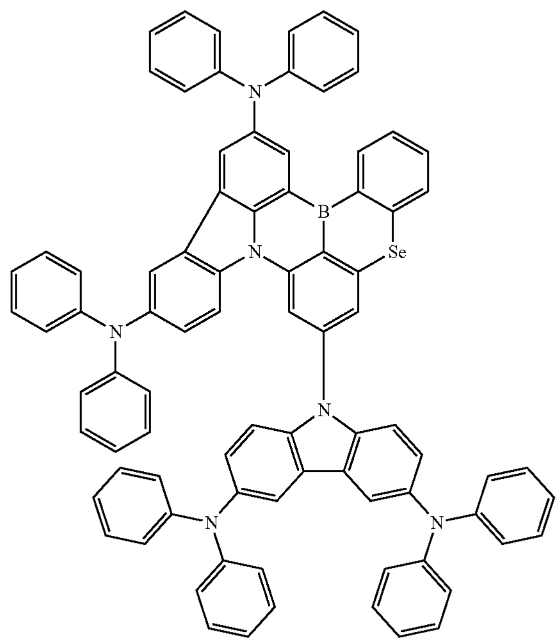
51
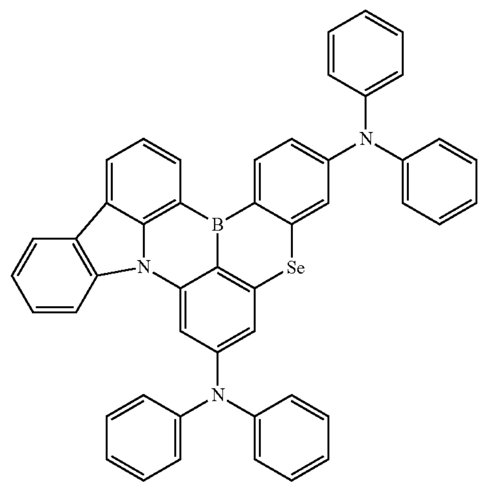
52
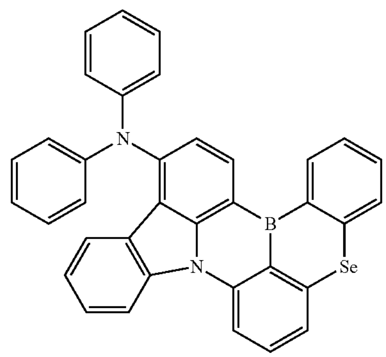
53
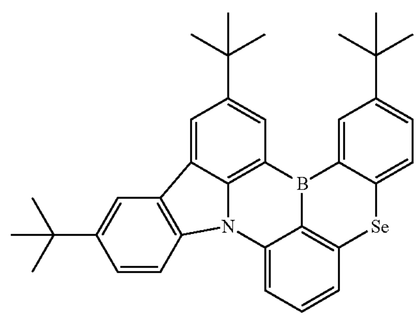
54
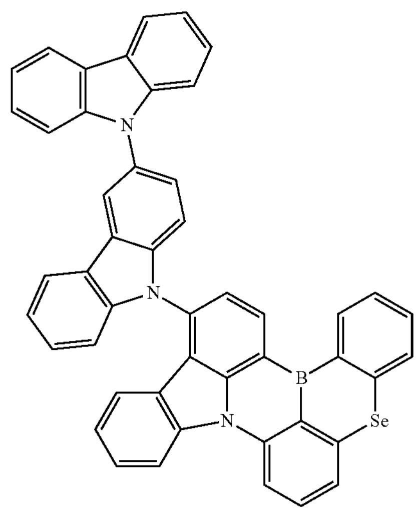

-continued
55
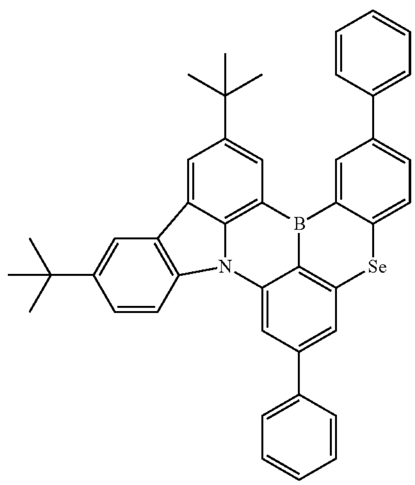
56
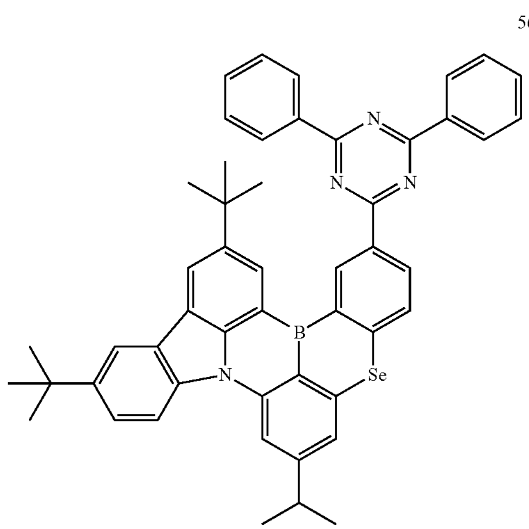
57
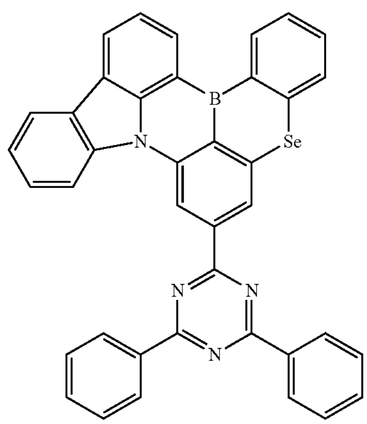
-continued
58
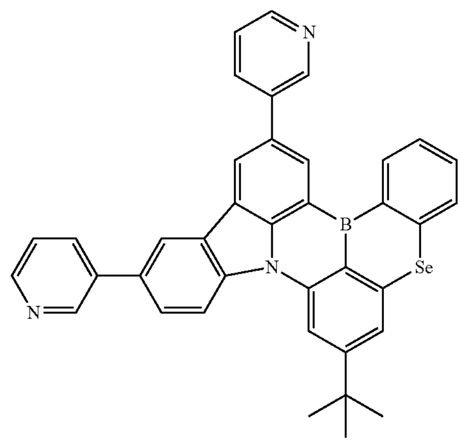
59
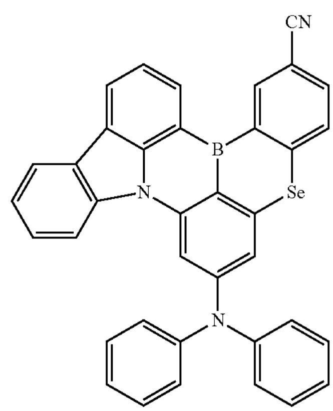
60
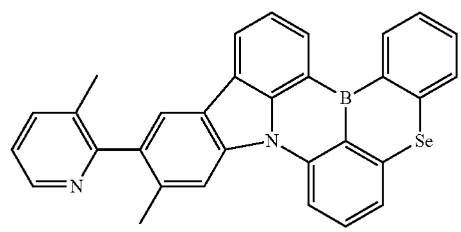
61
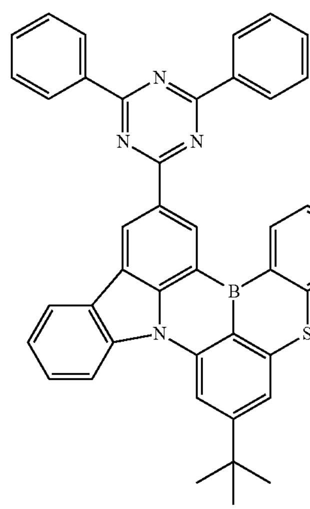

-continued
62
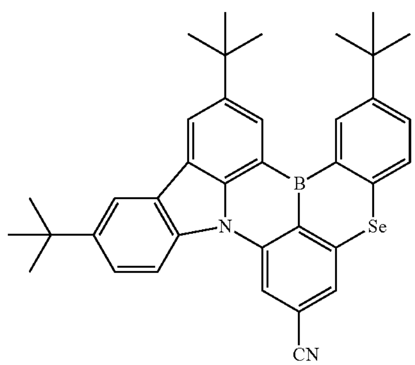
63
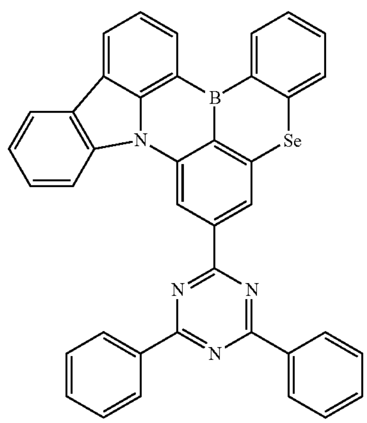
64
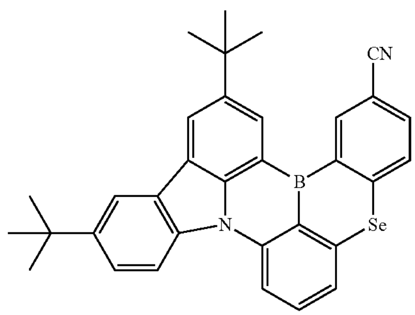
65
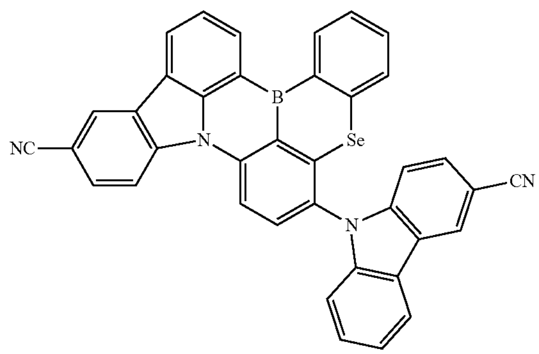
-continued
66
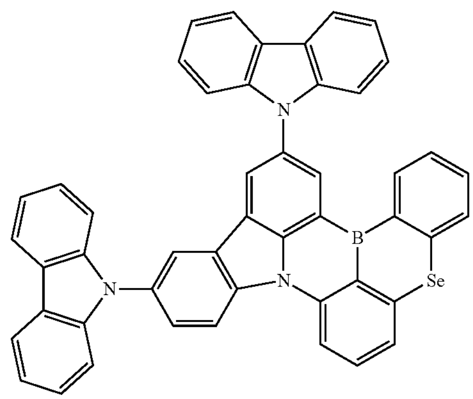
67
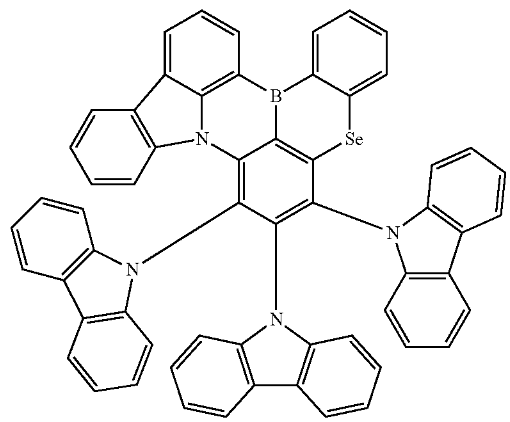
68
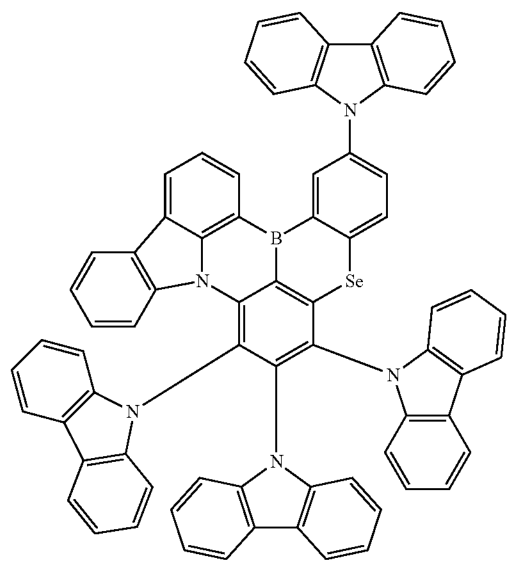

-continued
69
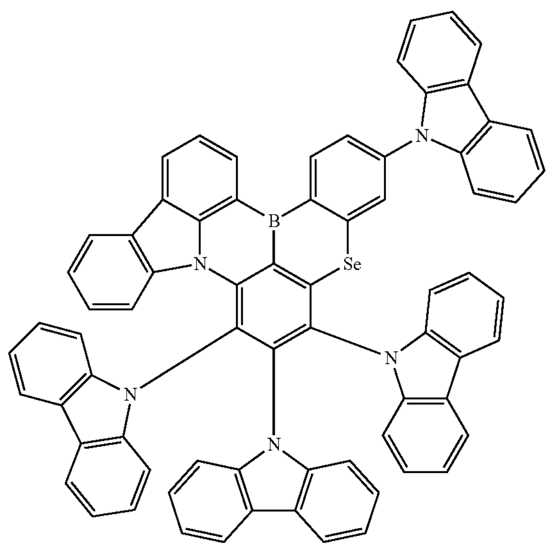
70
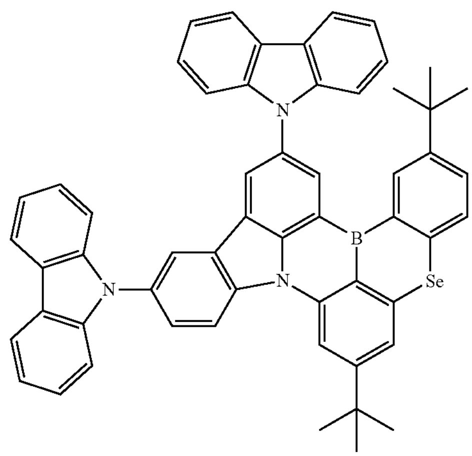
71
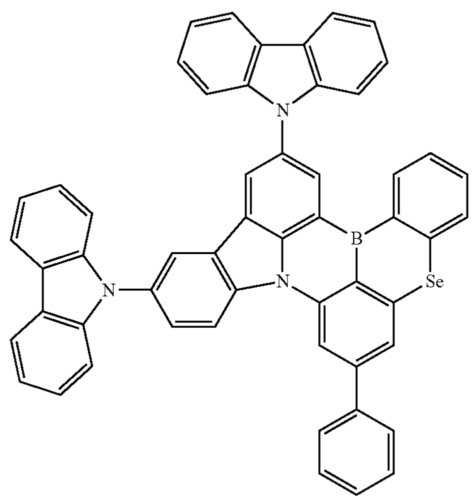
-continued
72
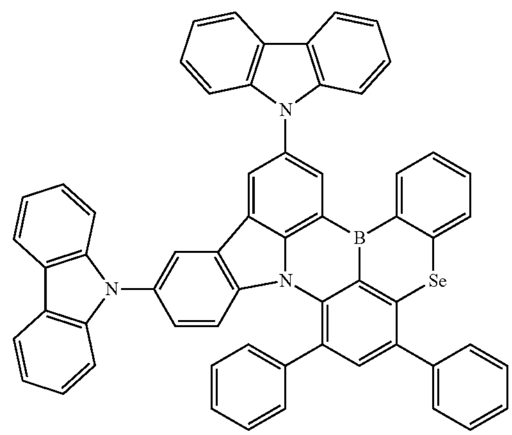
73
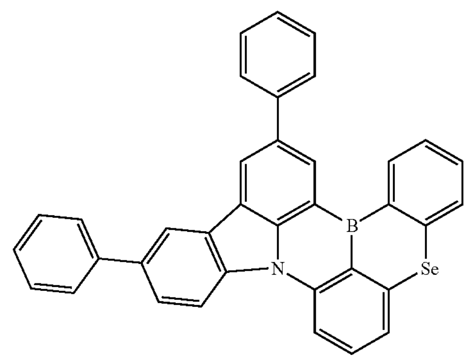
74
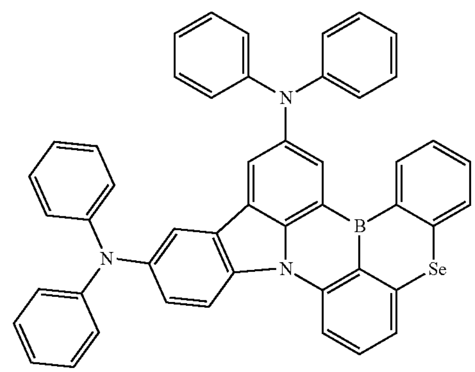
75
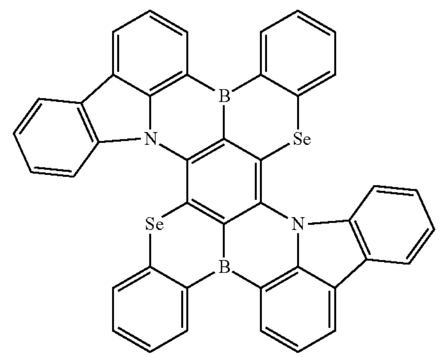

-continued
76
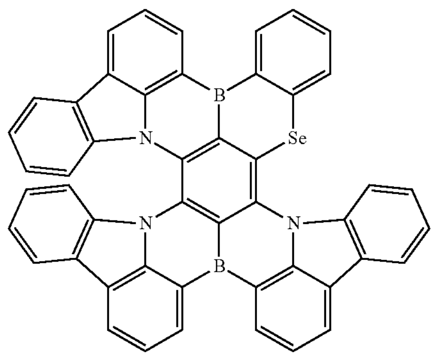
77
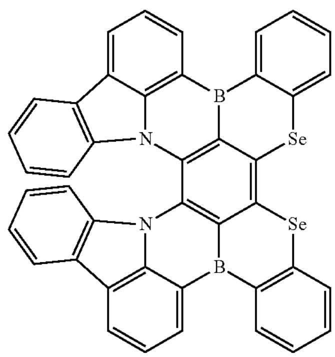
78
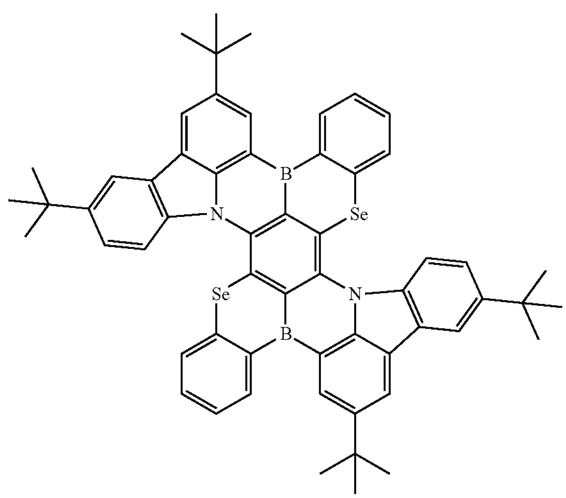
-continued
79
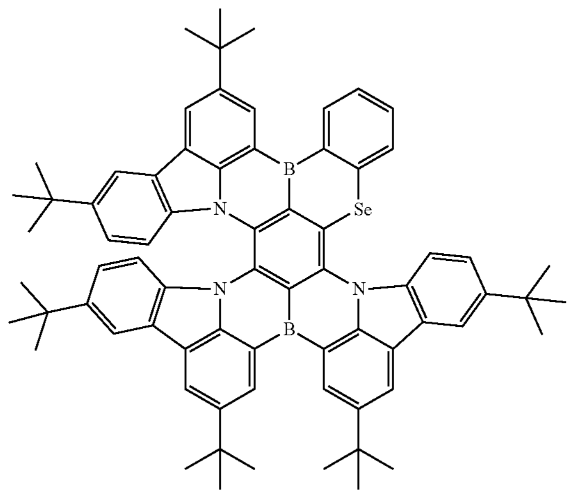
80
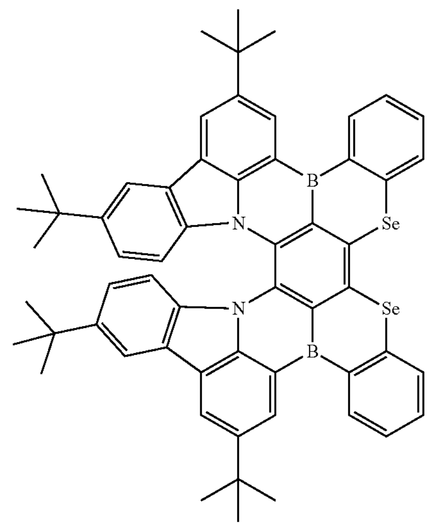
81
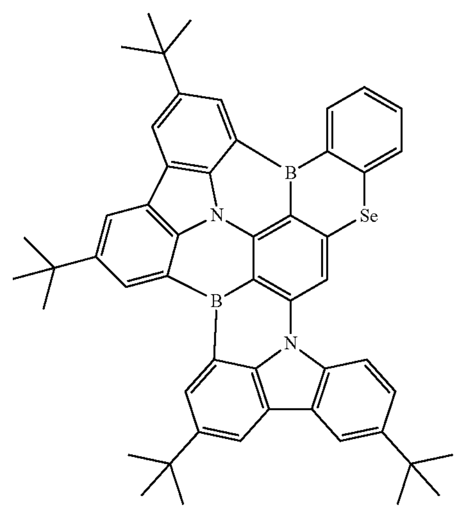

-continued

82

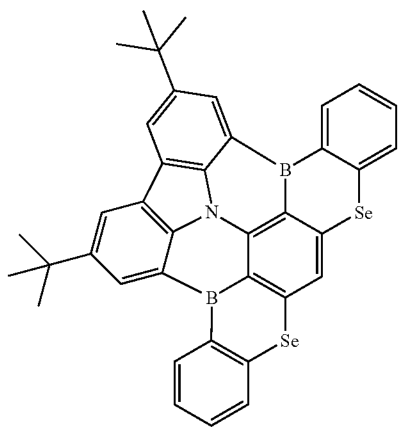

83

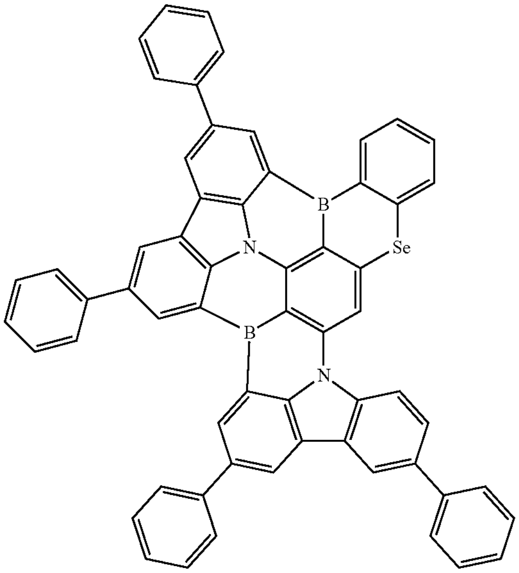

84

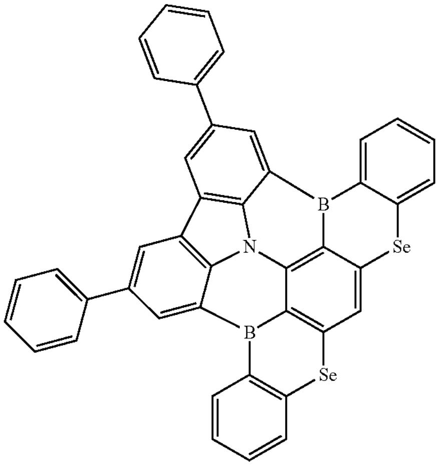

-continued

85

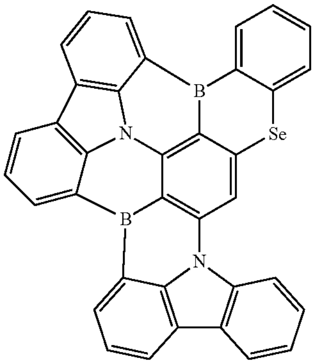

86

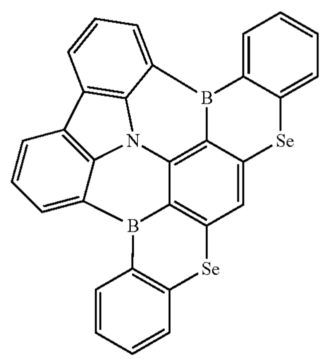

, and wherein, in Compound Group 1, D is a deuterium atom, Ph is a phenyl group, and OEt is an ethoxy group.

2. A light emitting element comprising:

a first electrode;

a second electrode on the first electrode; and at least one functional layer between the first electrode and the second electrode, the at least one functional layer comprising a polycyclic compound represented by at least one selected from the group consisting of polycyclic compounds of Compound Group 1:

Compound Group 1

1

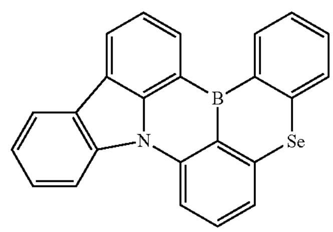

-continued
2
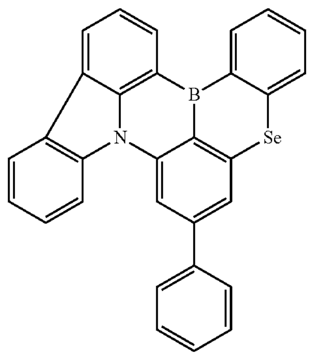
3
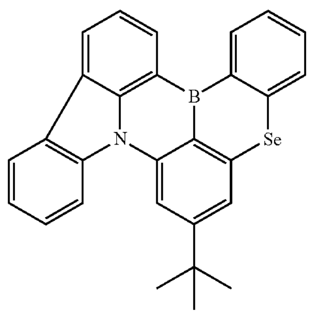
4
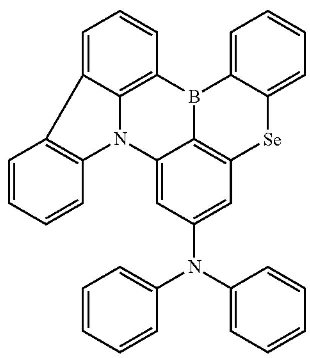
1-D
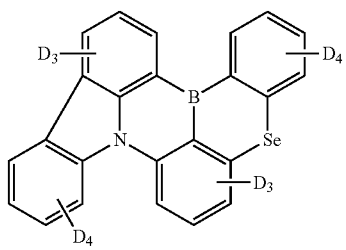
2-D
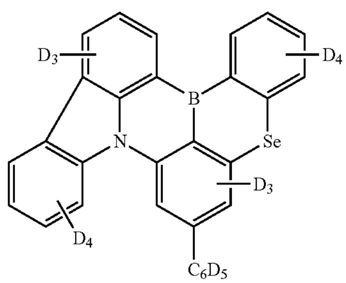
-continued
3-D
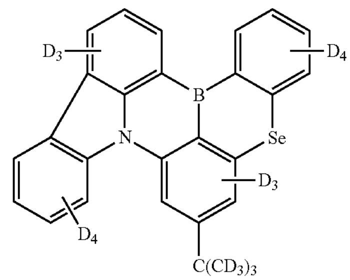
4-D
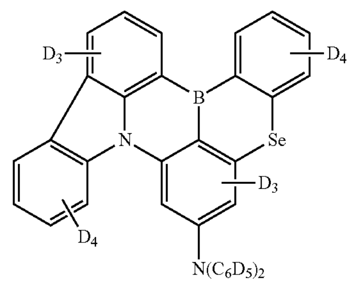
5
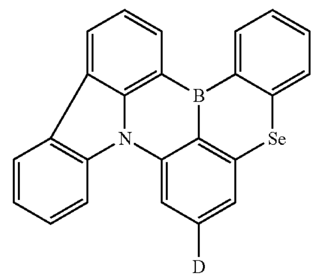
6
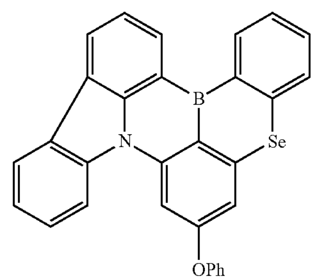
7
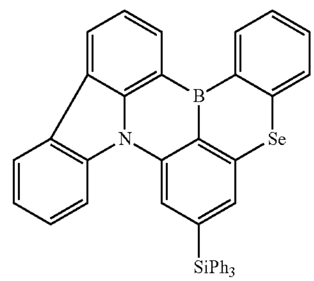

-continued
8
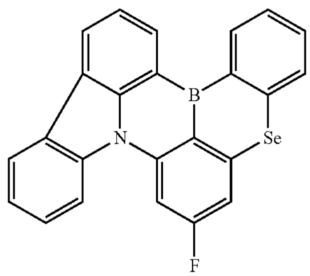
9
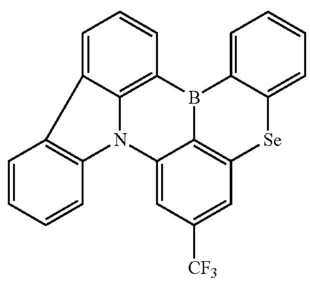
10
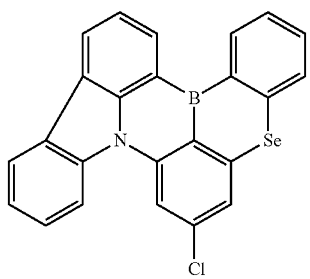
11
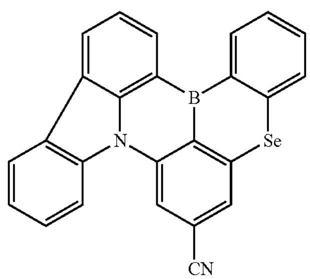
12
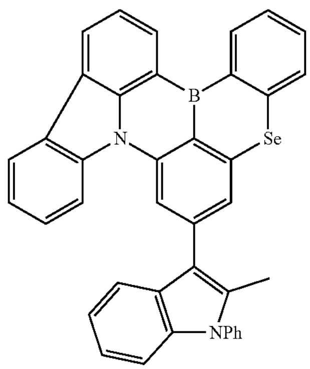
-continued
13
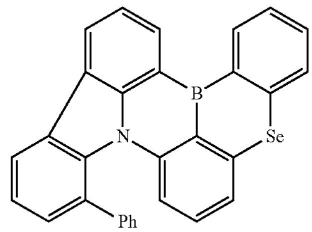
14
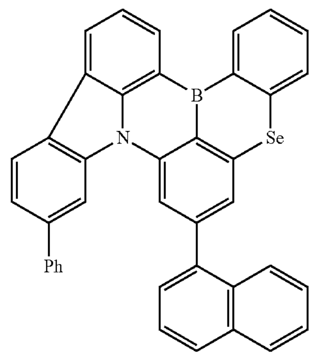
15
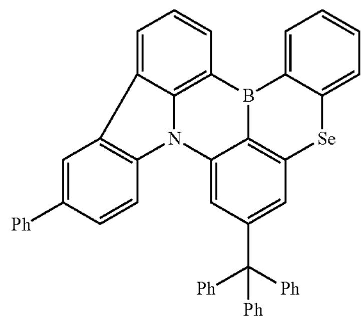
16
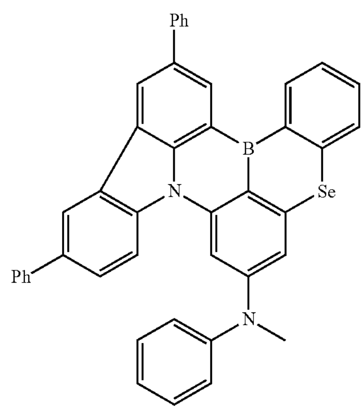
17
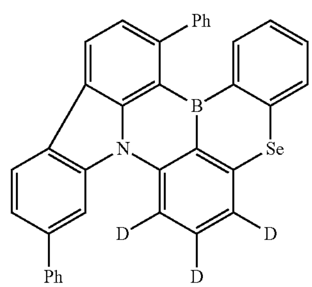

18
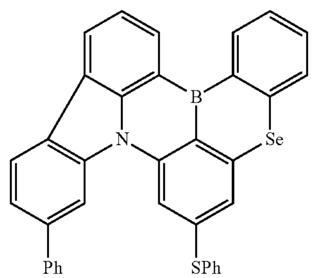
19
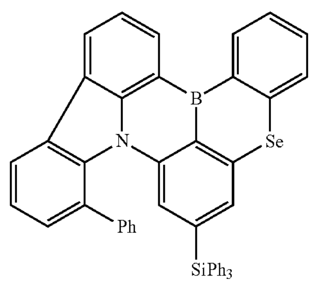
20
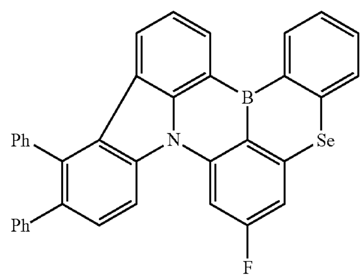
21
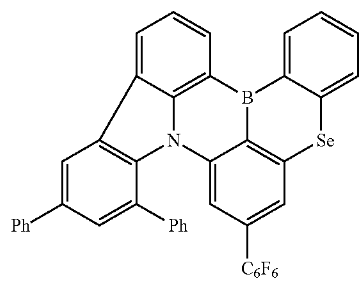
22
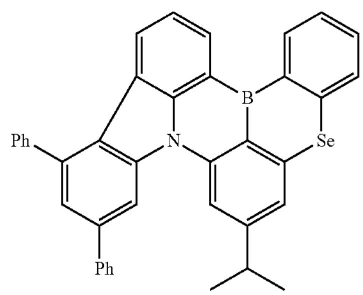
23
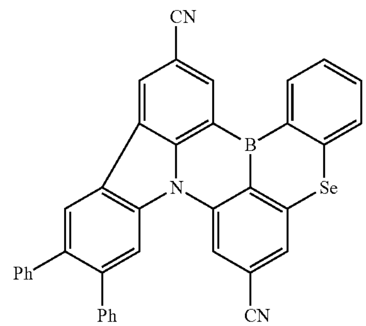
24
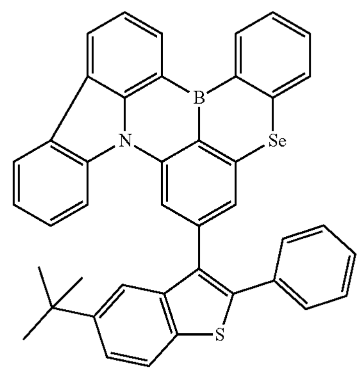
25
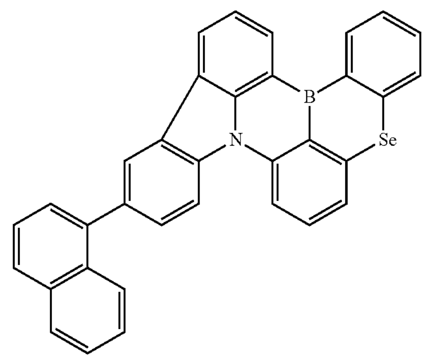
26
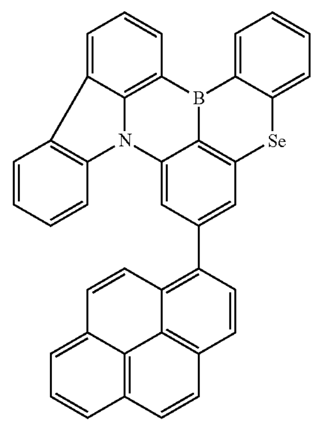

-continued
27
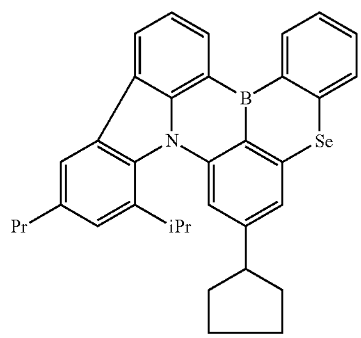
28
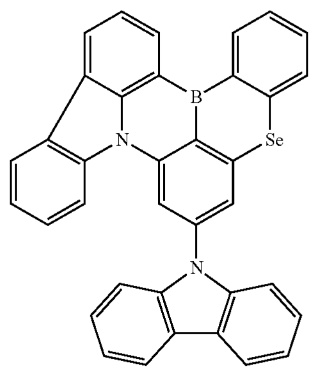
29
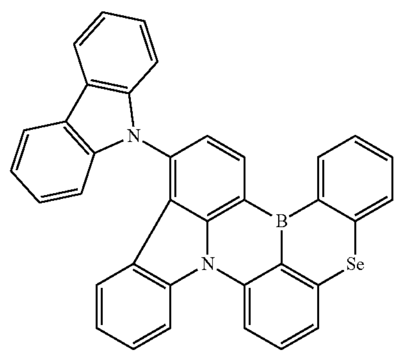
30
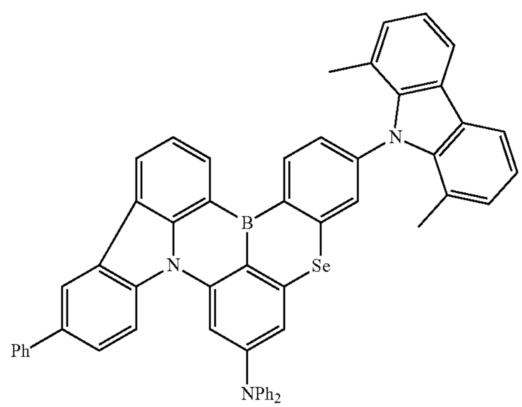
-continued
31
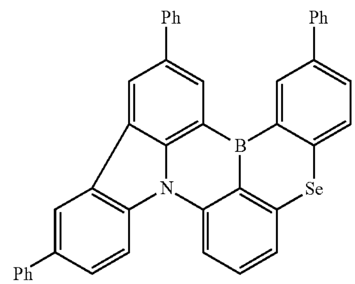
32
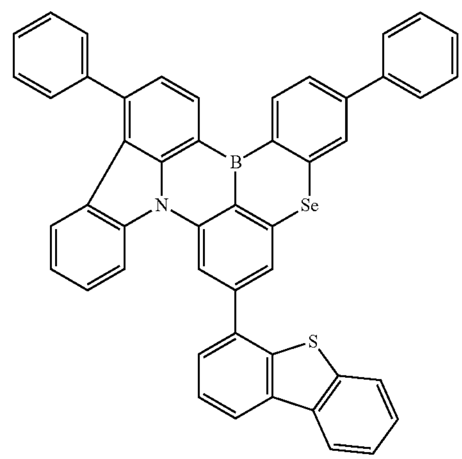
33
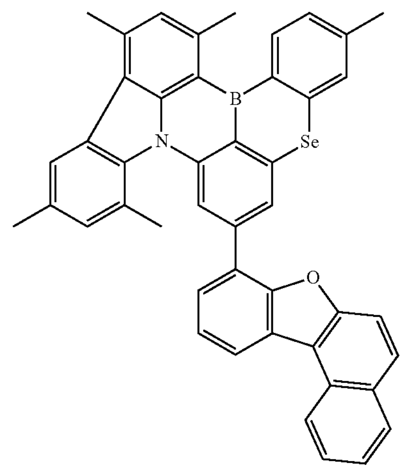
34
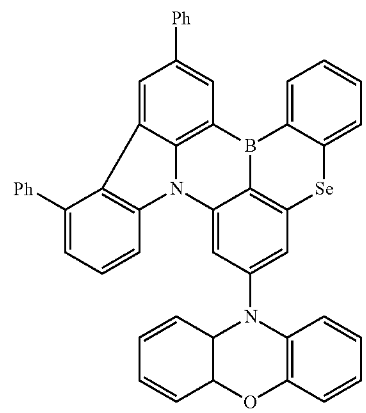

-continued
35
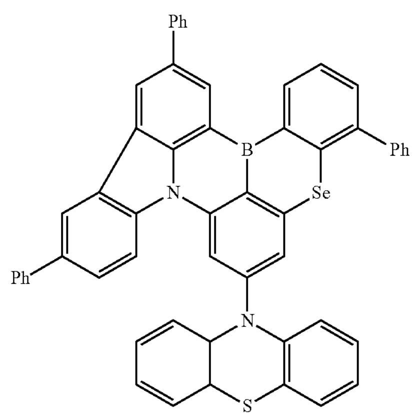
36
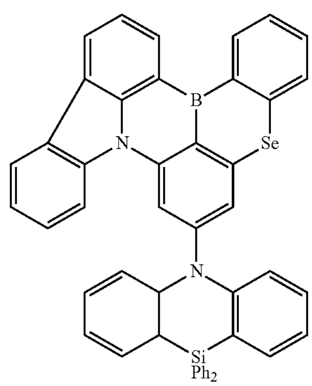
37
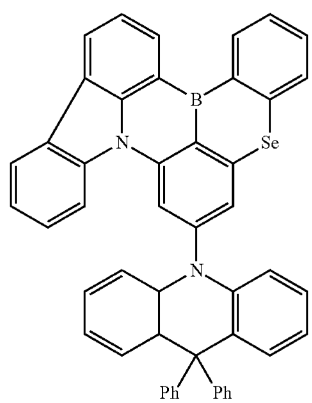
38
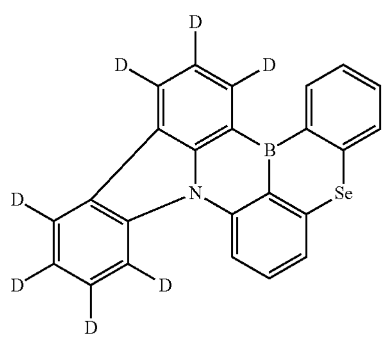
-continued
39
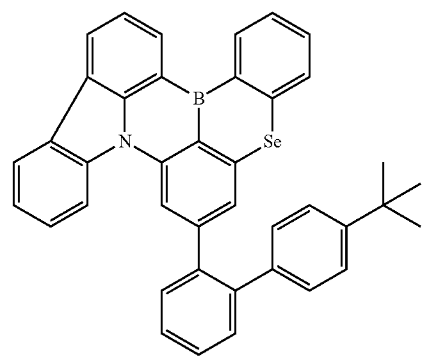
40
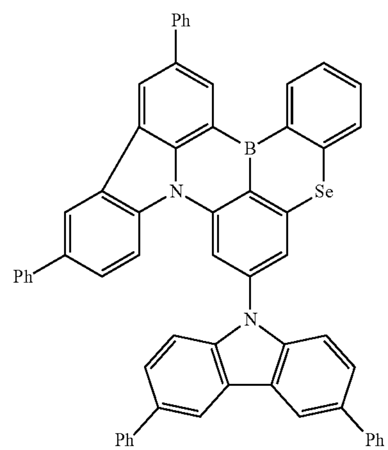
41
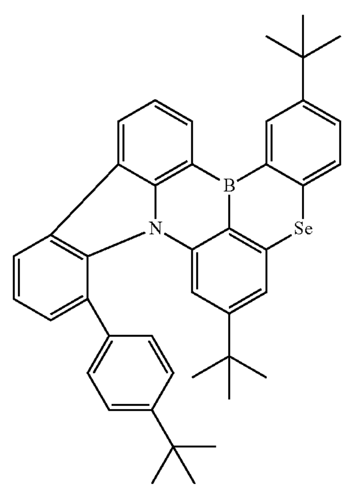
42
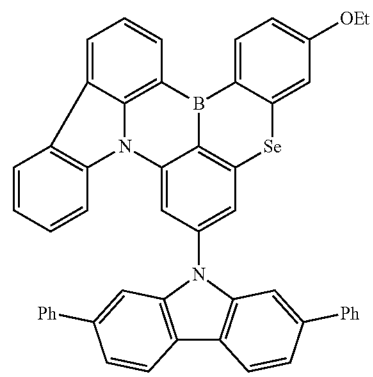

-continued
43
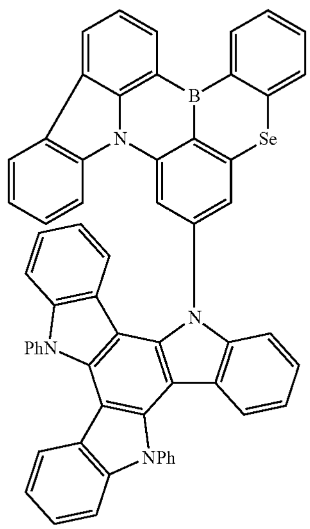
44
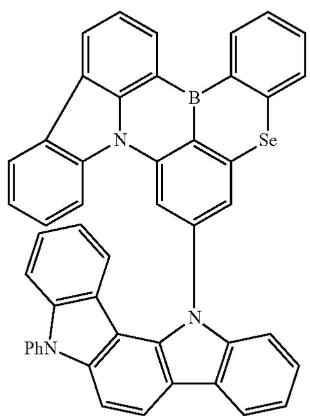
45
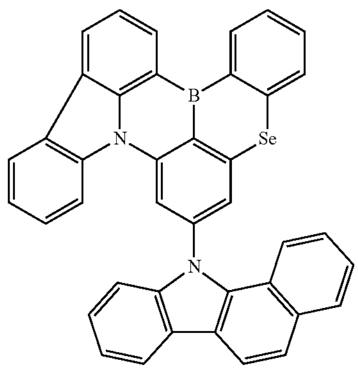
-continued
46
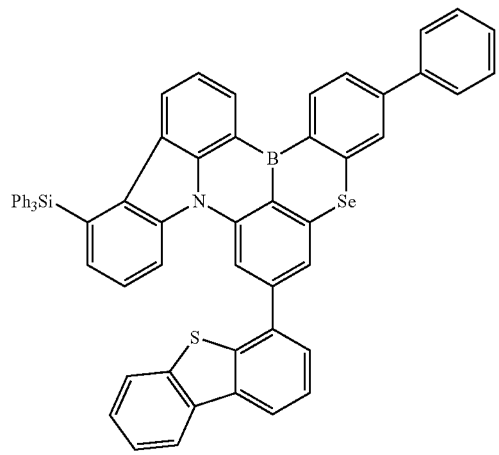
47
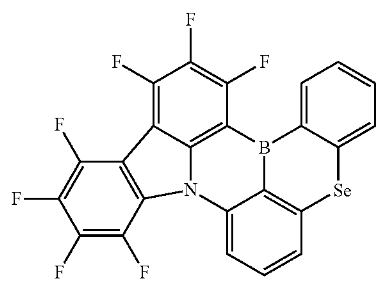
48
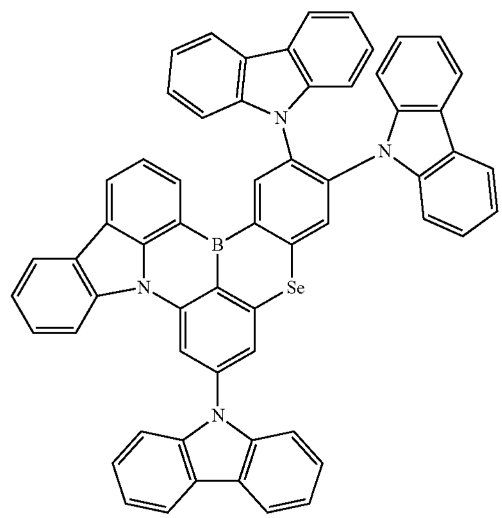

-continued
49
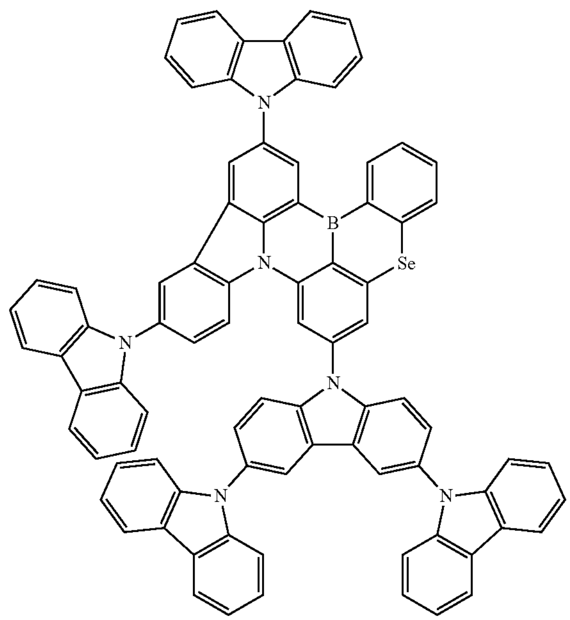
50
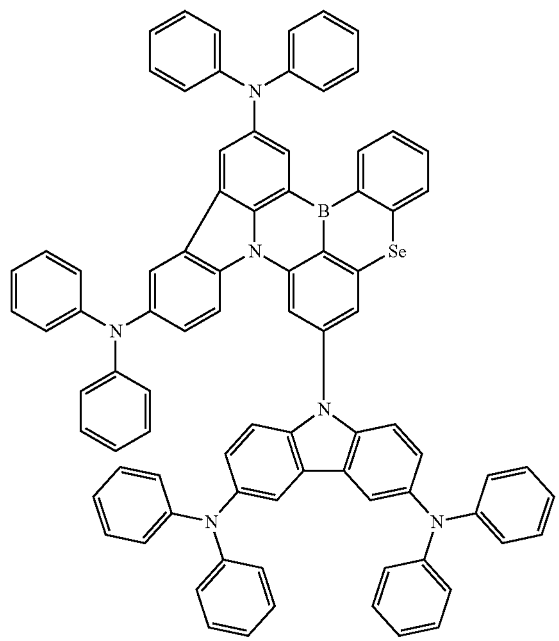
-continued
51
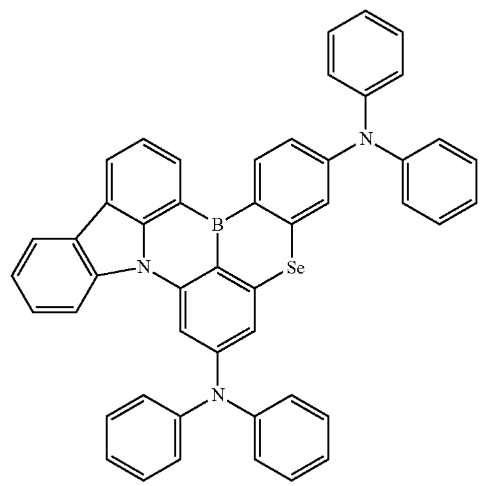
52
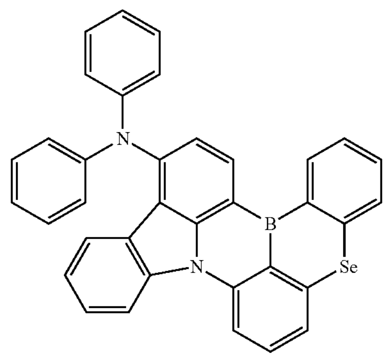
53
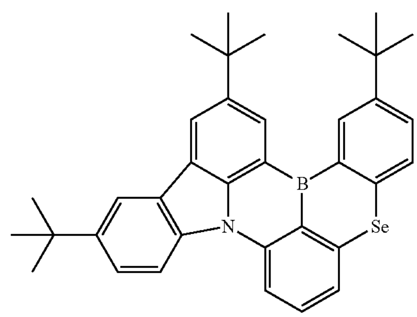
54
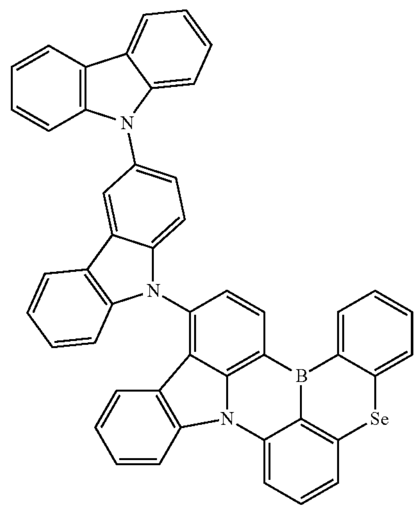

-continued
55
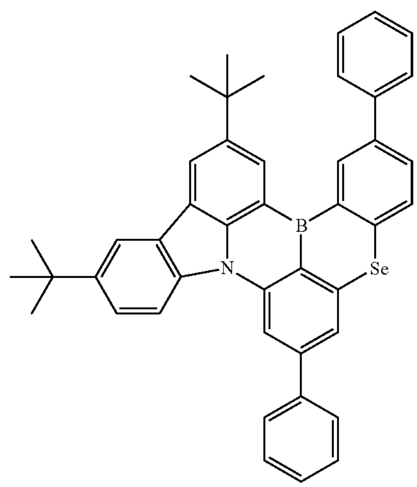
56
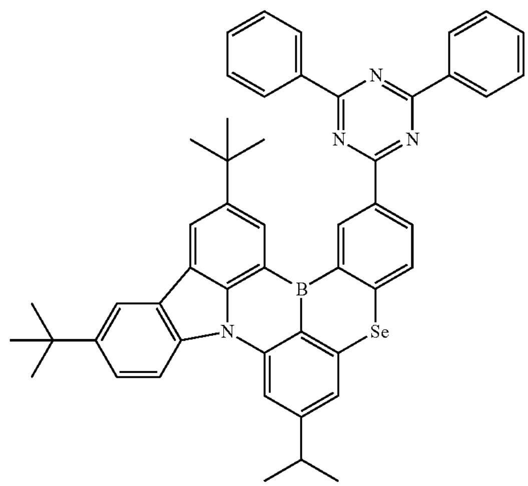
57
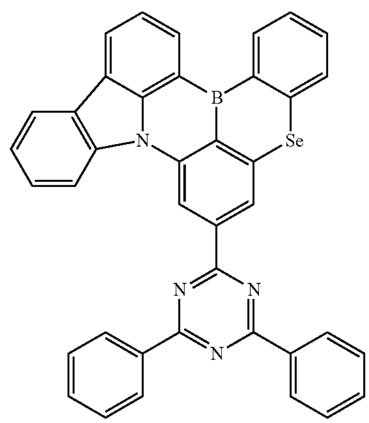
-continued
58
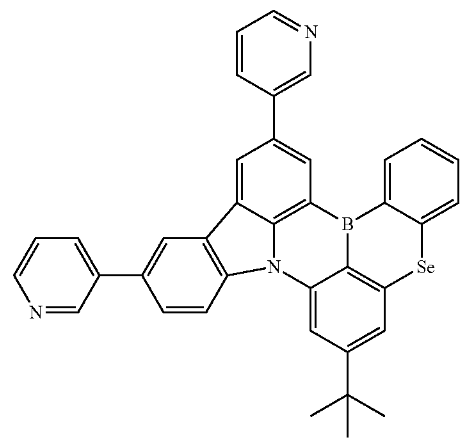
59
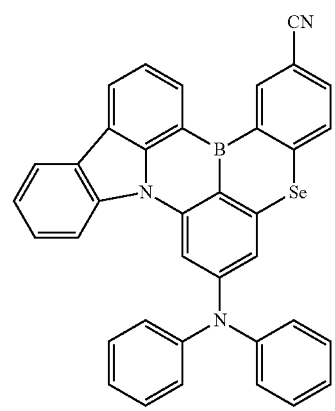
60
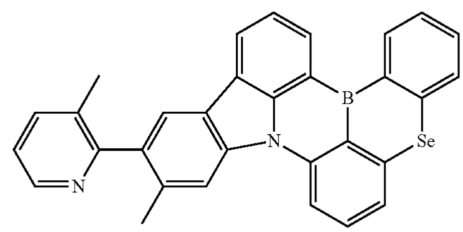
61
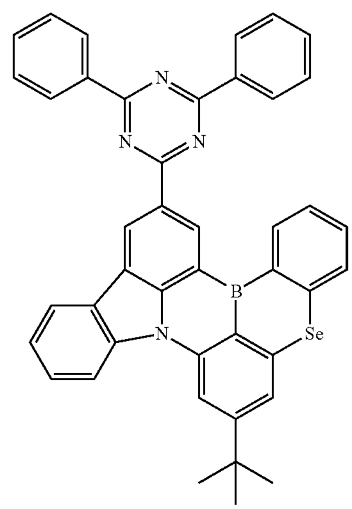

62
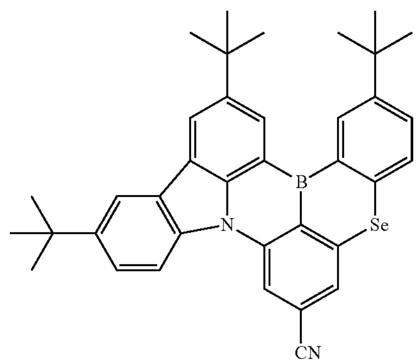
63
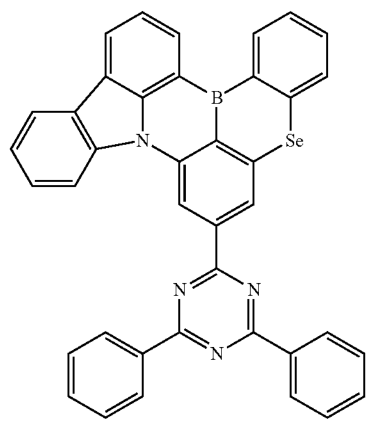
64
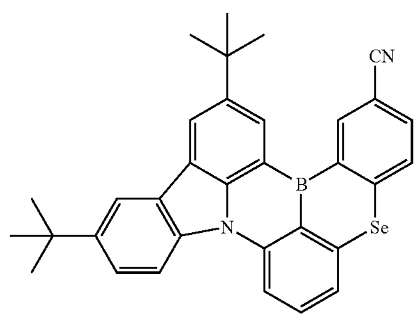
65
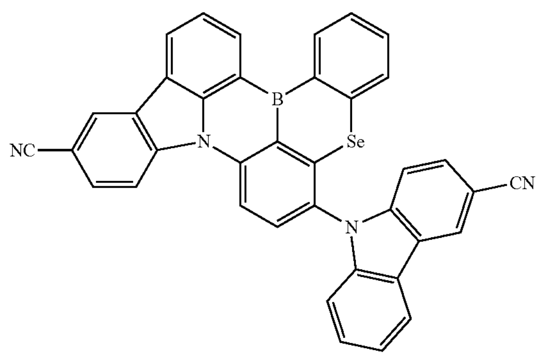
66
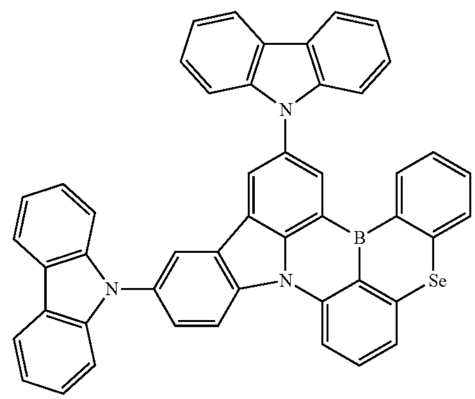
67
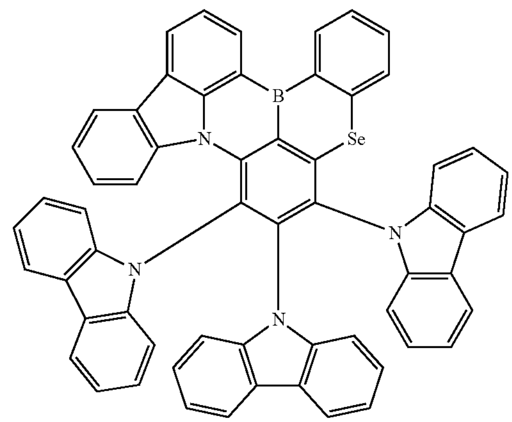
68
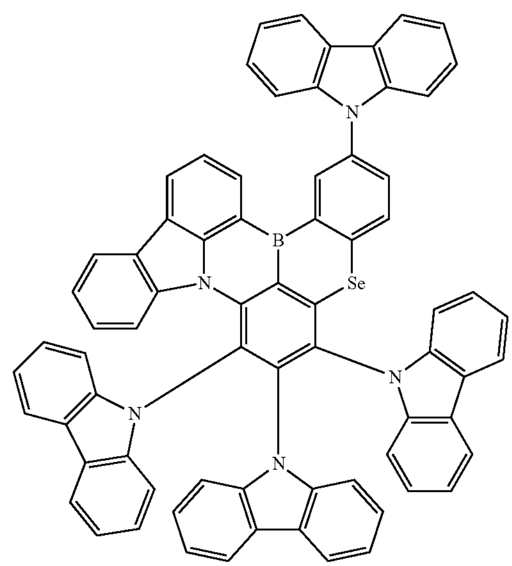

-continued
69
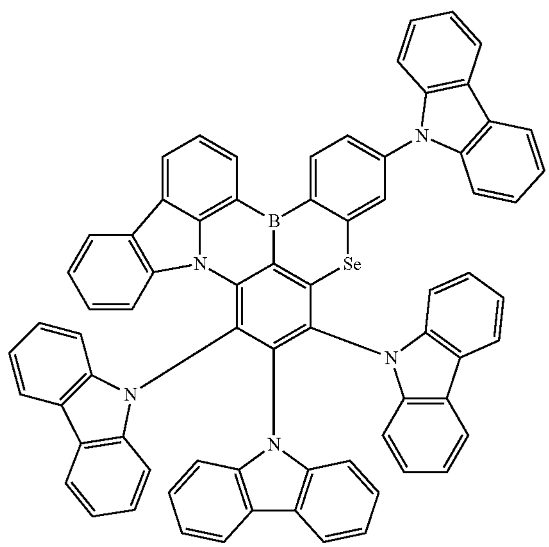
70
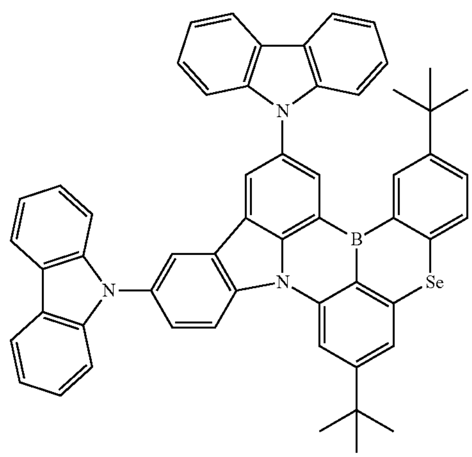
71
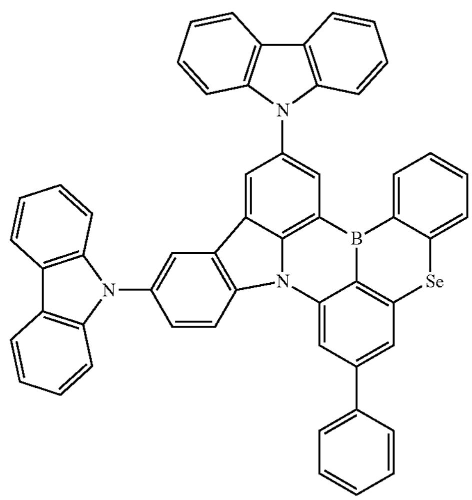
-continued
72
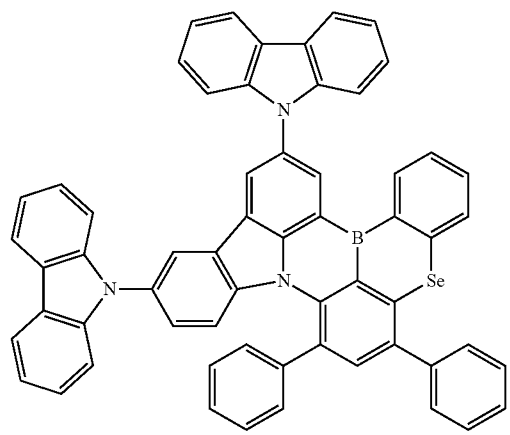
73
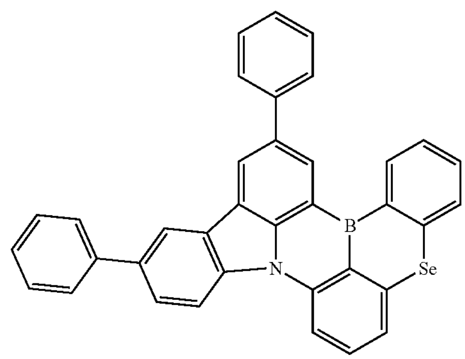
74
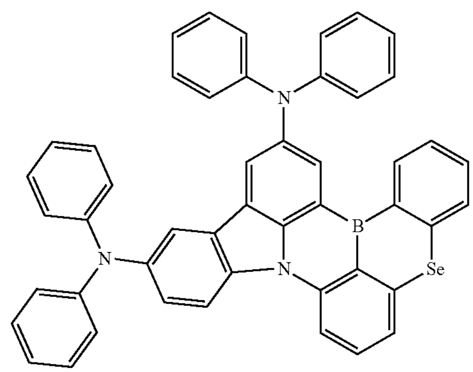
75
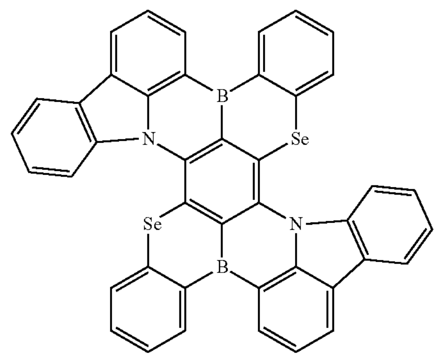

-continued
76
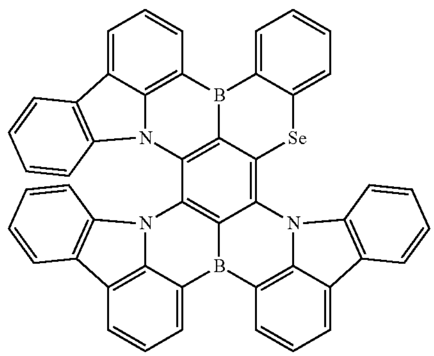
77
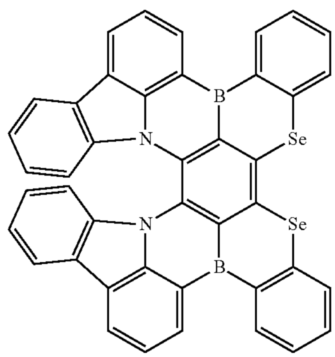
78
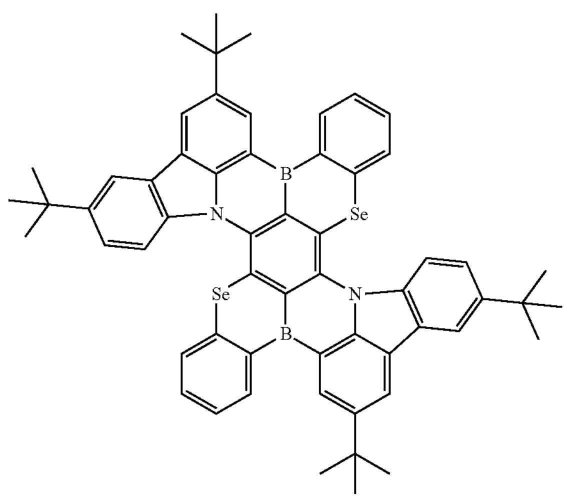
-continued
79
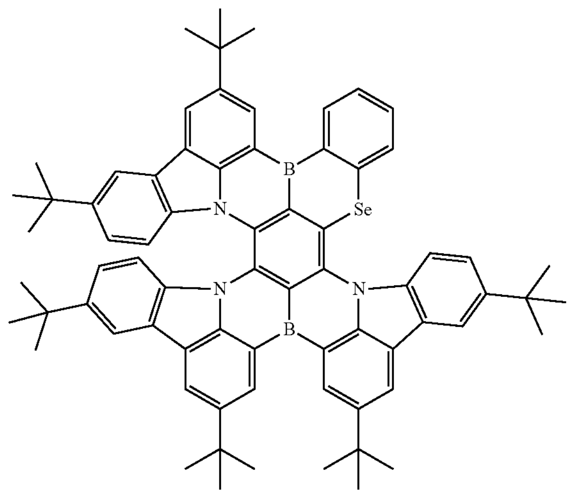
80
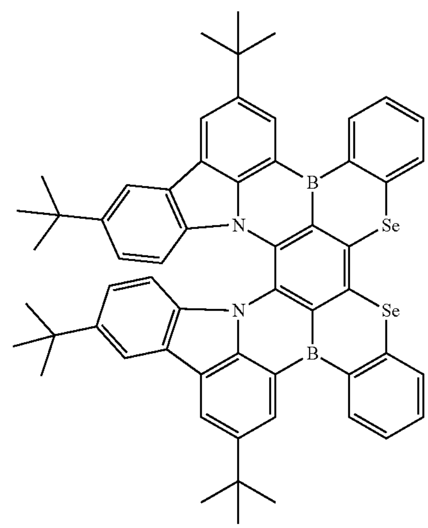
81
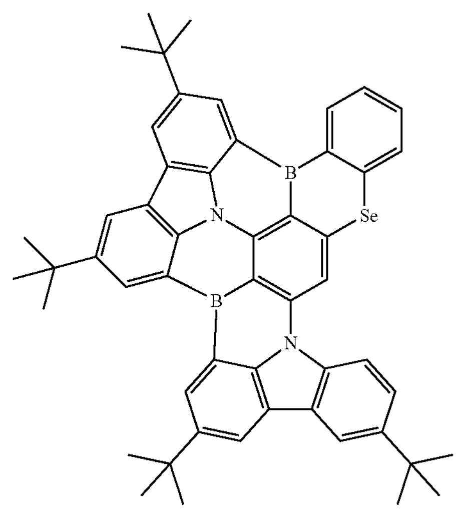

-continued

82

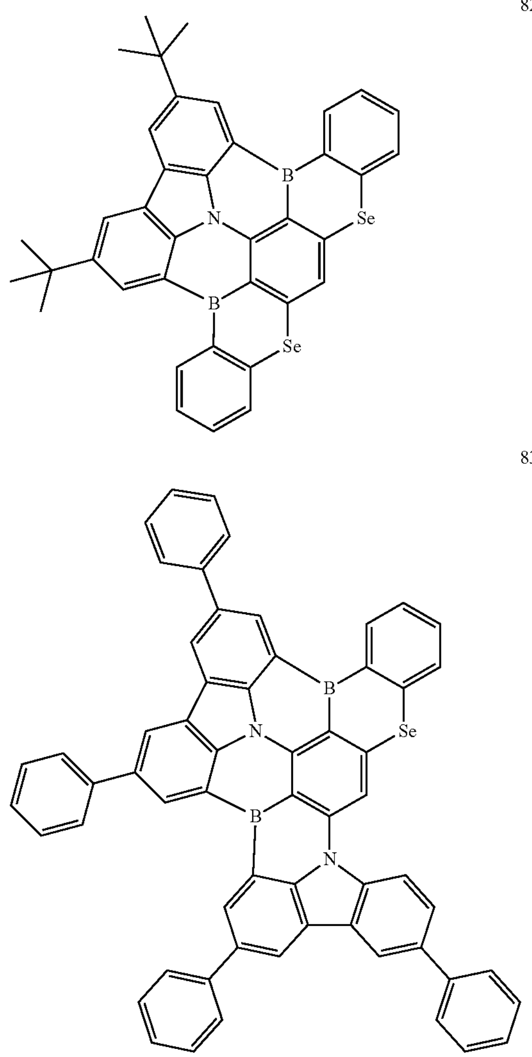

83

84

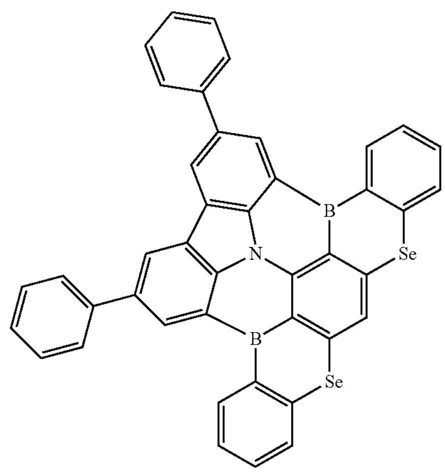

-continued

85

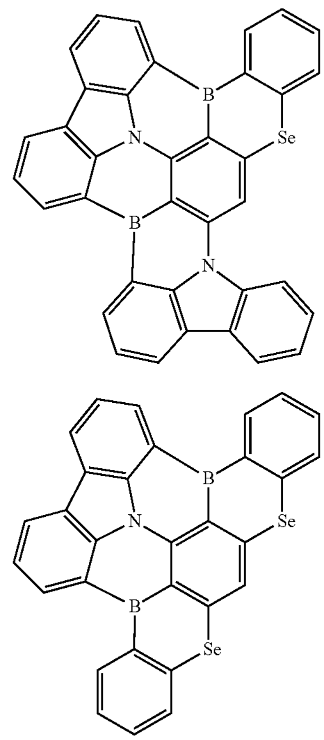

86

, and wherein, in Compound Group 1, D is a deuterium atom, Ph is a phenyl group, and OEt is an ethoxy group.

3. The light emitting element of claim 2, wherein the at least one functional layer comprises an emission layer, a hole transport region between the first electrode and the emission layer, and an electron transport region between the emission layer and the second electrode, and the emission layer comprises the polycyclic compound.

4. The light emitting element of claim 3, wherein the emission layer comprises a host and a dopant, and the dopant comprises the polycyclic compound.

5. The light emitting element of claim 4, wherein the host comprises a compound represented by Formula E-2a or Formula E-2b:

Formula E-2a

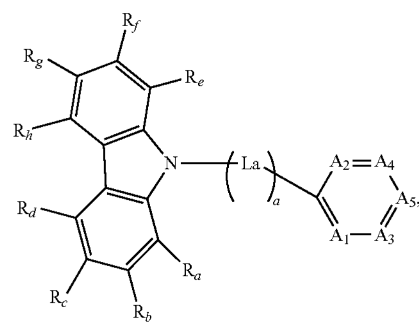

wherein in Formula E-2a, a is an integer of 0 to 10, $L_a$ is a direct linkage, a substituted or unsubstituted arylene group having 6 to 30 ring-forming carbon atoms, or a substituted or unsubstituted heteroarylene group having 2 to 30 ring-forming carbon atoms, $A_1$ to $A_5$ are each independently N or $CR_i$, and $R_a$ to $R_i$ are each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring;

Formula E-2b

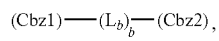

and wherein in Formula E-2b,

Cbz1 and Cbz2 are each independently an unsubstituted carbazole group or a carbazole group substituted with an aryl group having 6 to 30 ring-forming carbon atoms, b is an integer of 0 to 10, and $L_b$ is a direct linkage, a substituted or unsubstituted arylene group having 6 to 30 ring-forming carbon atoms, or a substituted or unsubstituted heteroarylene group having 2 to 30 ring-forming carbon atoms.

6. The light emitting element of claim 3, wherein the emission layer is configured to emit delayed fluorescence.

7. The light emitting element of claim 3, wherein the emission layer is configured to emit light having a center wavelength of about 460 nm to about 650 nm.

8. The light emitting element of claim 2, wherein the first electrode and the second electrode each independently comprises at least one selected from the group consisting of Ag, Mg, Cu, Al, Pt, Pd, Au, Ni, Nd, Ir, Cr, Li, Ca, LiF, Mo, Ti, W, In, Sn, Zn, compounds thereof, mixtures thereof, and oxides thereof.

9. The light emitting element of claim 2, wherein a composition comprising the compound and a host exhibits a delayed fluorescence lifetime (τ_delay) in the range of 11-14 μs and a photoluminescence quantum yield (PLQY) of 95% or greater when the compound is contained in an amount of 1 wt % based on the total weight of the composition.

* * * * *